(12) United States Patent
Xiao et al.

(10) Patent No.: US 8,520,425 B2
(45) Date of Patent: Aug. 27, 2013

(54) RESISTIVE RANDOM ACCESS MEMORY WITH LOW CURRENT OPERATION

(75) Inventors: Li Xiao, San Jose, CA (US); Chandu Gorla, Sunnyvale, CA (US); Abhijit Bandyopadhyay, San Jose, CA (US); Andrei Mihnea, San Jose, CA (US)

(73) Assignee: SanDisk 3D LLC, Milpitas, CA (US)

(*) Notice: Subject to any disclaimer, the term of this patent is extended or adjusted under 35 U.S.C. 154(b) by 0 days.

(21) Appl. No.: 13/424,131

(22) Filed: Mar. 19, 2012

(65) Prior Publication Data
US 2012/0176831 A1 Jul. 12, 2012

Related U.S. Application Data

(63) Continuation-in-part of application No. 13/157,204, filed on Jun. 9, 2011.

(60) Provisional application No. 61/467,936, filed on Mar. 25, 2011, provisional application No. 61/356,327, filed on Jun. 18, 2010.

(51) Int. Cl.
*G11C 11/00* (2006.01)
*G11C 13/0002* (2006.01)

(52) U.S. Cl.
USPC ............ 365/148; 365/158; 365/163

(58) Field of Classification Search
USPC .......................... 365/100
See application file for complete search history.

(56) References Cited

U.S. PATENT DOCUMENTS

| | | | |
|---|---|---|---|
| 5,915,167 A | 6/1999 | Leedy | |
| 6,034,882 A | 3/2000 | Johnson et al. | |
| 6,420,215 B1 | 7/2002 | Knall et al. | |
| 6,525,953 B1 | 2/2003 | Johnson | |
| 6,574,145 B2 | 6/2003 | Kleveland et al. | |

(Continued)

FOREIGN PATENT DOCUMENTS

| DE | 102008050762 A1 | 5/2010 |
|---|---|---|
| EP | 1202285 A2 | 5/2002 |

(Continued)

OTHER PUBLICATIONS

Gao, B., et al., "Oxide-Based RRAM: Uniformity Improvement Using A New Material-Oriented Methodology," 2009 Symposium on VLSI Technology Digest of Technical Papers, Jun. 2009, 2 pages.

(Continued)

*Primary Examiner* — Tan T. Nguyen
(74) *Attorney, Agent, or Firm* — Vierra Magen Marcus LLP

(57) ABSTRACT

A memory cell in a 3-D read and write memory device has two bipolar resistance-switching layers with different respective switching currents. A low current resistance-switching layer can be switched in set and reset processes while a high current resistance-switching layer remains in a reset state and acts as a protection resistor to prevent excessively high currents on the low current resistance-switching layer. The low and high current resistance-switching layers can be of the same material such as a metal oxide, where the layers differ in terms of thickness, doping, leakiness, metal richness or other variables. Or, the low and high current resistance-switching layers can be of different materials, having one or more layers each. The high current resistance-switching layer can have a switching current which is greater than a switching current of the low current resistance-switching layer by a factor of at least 1.5 or 2.0, for instance.

19 Claims, 29 Drawing Sheets

(56) References Cited

U.S. PATENT DOCUMENTS

| | | | |
|---|---|---|---|
| 6,885,602 B2* | 4/2005 | Cho et al. | 365/211 |
| 6,940,744 B2 | 9/2005 | Rinerson et al. | |
| 6,951,780 B1 | 10/2005 | Herner | |
| 6,952,030 B2 | 10/2005 | Herner et al. | |
| 6,952,043 B2 | 10/2005 | Vyvoda et al. | |
| 7,042,760 B2* | 5/2006 | Hwang et al. | 365/163 |
| 7,081,377 B2 | 7/2006 | Cleeves | |
| 7,110,286 B2* | 9/2006 | Choi et al. | 365/163 |
| 7,176,064 B2 | 2/2007 | Herner | |
| 7,217,630 B2 | 5/2007 | Basceri et al. | |
| 7,391,638 B2 | 6/2008 | Fasoli et al. | |
| 7,586,773 B2 | 9/2009 | Herner | |
| 7,764,534 B2 | 7/2010 | Thorp et al. | |
| 7,767,568 B2 | 8/2010 | An et al. | |
| 7,894,253 B2 | 2/2011 | Kreupl et al. | |
| 7,969,771 B2 | 6/2011 | Xi et al. | |
| 8,264,865 B2 | 9/2012 | Mitani et al. | |
| 8,345,465 B2 | 1/2013 | Muraoka et al. | |
| 2003/0156452 A1 | 8/2003 | Gilton | |
| 2006/0006472 A1 | 1/2006 | Jiang | |
| 2006/0087005 A1 | 4/2006 | Herner | |
| 2006/0092691 A1 | 5/2006 | Shiimoto et al. | |
| 2006/0245235 A1 | 11/2006 | Krieger et al. | |
| 2006/0250836 A1 | 11/2006 | Herner et al. | |
| 2007/0132049 A1 | 6/2007 | Stipe | |
| 2007/0194367 A1 | 8/2007 | Moon et al. | |
| 2007/0228354 A1 | 10/2007 | Scheuerlein | |
| 2008/0011996 A1 | 1/2008 | Bednorz et al. | |
| 2008/0025076 A1 | 1/2008 | Scheuerlein et al. | |
| 2008/0191261 A1 | 8/2008 | Moon et al. | |
| 2008/0247219 A1 | 10/2008 | Choi et al. | |
| 2008/0273365 A1 | 11/2008 | Kang et al. | |
| 2008/0278989 A1 | 11/2008 | Lee et al. | |
| 2009/0001343 A1 | 1/2009 | Schricker et al. | |
| 2009/0140232 A1 | 6/2009 | Ufert | |
| 2009/0152526 A1 | 6/2009 | Courtade et al. | |
| 2009/0227067 A1 | 9/2009 | Kumar et al. | |
| 2009/0302315 A1 | 12/2009 | Lee et al. | |
| 2010/0038791 A1 | 2/2010 | Lee et al. | |
| 2010/0085794 A1 | 4/2010 | Chen et al. | |
| 2010/0176365 A1 | 7/2010 | Park et al. | |
| 2010/0238703 A1 | 9/2010 | Kubo et al. | |
| 2010/0258782 A1 | 10/2010 | Kuse et al. | |
| 2010/0276658 A1 | 11/2010 | Chien et al. | |
| 2011/0248236 A1 | 10/2011 | Kim et al. | |
| 2011/0310653 A1 | 12/2011 | Kreupl et al. | |

FOREIGN PATENT DOCUMENTS

| | | | |
|---|---|---|---|
| WO | WO2009/015297 A1 | 1/2009 | |
| WO | WO 2010118380 A3 | 10/2010 | |
| WO | WO 2010/136056 A1 | 12/2010 | |

OTHER PUBLICATIONS

Liu, Qi, et al., "Improvement of Resistive Switching Properties in ZrO2-Based ReRAM With Implanted Ti Ions," IEEE Electron Device Letters, vol. 30, No. 12, Dec. 2009, 3 pages.

Hershberger, Matthew T., "Unipolar Resistive Switching in 100 nm$^2$ Pt-NiO-Ni-Pt Cells," National Nanotechnology Infrastructure Network, NNIN iREU Program, Nov. 2010, pp. 156-163.

Ayalew, Tesfaye, "SiC Semiconductor Devices Technology, Modeling, and Simulation," Dissertation retrieved from http://www.iue.tuwien.ac.at/phd/ayalew/mythesis.html#CHILD_LINKS, Jan. 2004, 8 pages.

Chen, An, "Ionic Memory Technology," Solid State Electrochemistry II: Electrodes, Interfaces and Ceramic Membranes, Apr. 2011, pp. 1-30.

Fissel, A., et al., "Low-temperature growth of SiC thin flims on Si and 6H-SiC by solid-source molecular beam epitaxy," Appl. Phys. Lett., vol. 66, No. 23, Jun. 5, 1995, American Institute of Physics, pp. 3182-3184.

Golecki, I., et al., "Single-crystalline, epitaxial cubic SiC films grown on (100) Si at 750° by chemical vapor deposition," Appl. Phys. Letter., vol. 60, No. 14, Apr. 6, 1992, American Insitute of Physics, pp. 1703-1705.

Lee, Myoung-Jae, et al., "A Low-Temperature-Grown Oxide Diode as a New Switch Element for High-Density, Nonvolatile Memories," Advanced Materials, vol. 19, Jan. 2007, pp. 73-76.

Kim, D.W., et al., "Electrode Dependence of Resistance Switching in NiO Thin Films," Journal of the Korean Physical Society, vol. 51, Oct. 2007, pp. S88-S91.

Kuo, Yue, "Mixed Oxide High-k Gate Dielectrics—Interface Layer Structure, Breakdown Mechanism, and Memories," ECS 210th Meeting, Abstract 1115, Oct. 2006, 1 page.

Ouyang, Jianyong, "Application of nanomaterials in two-terminal resistive-switching memory devices," Nano Reviews, published May 26, 2010, pp. 1-14.

Ye, Yu-Ren, et al., "Improved Resistive Switching Performance of $Gd_2O_3$ Films by Fluorine Incorporation and Gd/O Ratio Adjustment," retrieved from www.electrochem.org/meetings/scheduler/abstracts/217/0979.pdf on Apr. 22, 2011, 1 page.

Rosezin, R., et al., "Integrated Complementary Resistive Switches for Passive High-Density Nanocrossbar Arrays," IEEE Electron Device Letters, vol. 32, No. 2, Feb. 2011, pp. 191-193.

Semenov, A.V., et al., "Low temperature deposition and optical properties of RE doped nanocrystalline SiC films," 3rd International Conference on Novel Applications of Wide Bandgap Layers, Jun. 2001, 2 pages.

Sun, Xianwen, "Coexistence of the bipolar and unipolar resistive switching behaviours in $Au/SrTio_3/Pt$ cells," Journal of Physics D: Applied Physics, vol. 44, No. 12, Mar. 10, 2011, 6 pages.

Yu, Wei, et al., "Low temperature deposition of hydrogenated nanocrystalline SiC films by helicon wave plasma enhanced chemical vapor deposition," J. Vac. Sci. Technol. A, vol. 28, No. 5, American Vacuum Society, Sep. 3, 2010, pp. 1234-1239.

Pagnia & Sotnick, "Bistable Switching in Electroformed Metal-Insulator-Metal Device," Phys. Stat. Sol. (A) 108, 11-65, Jul. 1988.

Invitation to Pay Additional Fees and Communication Relating to the Results of the Partial International Search Report dated Aug. 24, 2011, International Application No. PCT/US2011/040105.

Wang, Yan, et al., "Investigation of resistive switching in Cu-doped HfO2 thin film for multilevel non-volatile memory applications," Nanotechnology, vol. 21, No. 4, Jan. 29, 2010, pp. 1-6.

Linn, Eike, et al., "Complementary resistive switches for passive nanocrossbar memories," Nature Materials, vol. 9, May 2010, pp. 403-406.

Kawahara, Toshio, "Thermoelectric Properties of and Dopant Distribution in SiC Thin Films," Japanese Journal of Applied Physics, vol. 38, Part 1, No. 8, Aug. 15, 1999, pp. 4852-4856.

Invitation to Pay Additional Fees and Communication Relating to the Results of the Partial International Search Report dated Sep. 9, 2011, International Application No. PCT/US20111040104.

Invitation to Pay Additional Fees and Communication Relating to the Results of the Partial International Search Report dated Sep. 26, 2011, International Application No. PCT/US2011/040103.

International Search Report & The Written Opinion of the International Searching Authority dated Oct. 10, 2011, International Application No. PCT/US2011/040107.

International Search Report & The Written Opinion of the International Searching Authority dated Jan. 2, 2012, International Patent Application No. PCT/US2011/040103.

International Search Report & The Written Opinion of the International Searching Authority dated Mar. 30, 2012, International Application No. PCT/US2011/040104.

Notice of Allowance and Fee(s) Due dated Jan. 11, 2013, U.S. Appl. No. 13/157,200, filed Jun. 9, 2011.

Notice of Allowance and Fee(s) Due dated Jan. 24, 2013, U.S. Appl. No. 13/157,208, filed Jun. 9, 2011.

International Search Report & The Written Opinion of the International Searching Authority dated Mar. 16, 2012, International Application No. PCT/US2011/040105.

Spiga, S., et al., "Resistance switching in amorphous and crystalline binary oxides grown by electron beam evaporation and atomic layer deposition," Microelectronic Engineering, vol. 85, No. 12, 2008, pp. 2414-2419.

Lee, J., et al., "Diode-less nano-scale Zr0x/Hf0x RRAM device with excellent switching uniformity and reliability for high-density cross-point memory applications," 2010 IEEE International Electron Devices Meeting, Dec. 6-8, 2010, pp. 19.5.1-19.5.4.

English abstract of German Publication No. DE102008050762 published May 12, 2010.

Amendment to Claims Under Article 19 dated May 15, 2012, International Application No. PCT/US2011/040105 filed Jun. 10, 2011.

International Preliminary Report on Patentability dated Dec. 19, 2012, International Application No. PCT/US2011/040103.

International Preliminary Report on Patentability dated Dec. 19, 2012, International Application No. PCT/US2011/040104.

International Preliminary Report on Patentability dated Dec. 19, 2012, International Application No. PCT/US2011/040105.

International Preliminary Report on Patentability dated Dec. 19, 2012, International Application No. PCT/US2011/040107.

Non-final Office Action dated Feb. 8, 2013, U.S Appl. No. 13/157,204, filed Jun. 9, 2011.

International Search Report & The Written Opinion of the International Searching Authority dated Mar. 7, 2013, International Application No. PCT/US2012/066912.

Response to Office Action dated May 8, 2013, U.S. Appl. No. 13/157,204, filed Jun. 9, 2011.

Non-final Office Action dated May 23, 2013, U.S. Appl. No. 13/157,204, filed Jun. 9, 2011.

* cited by examiner

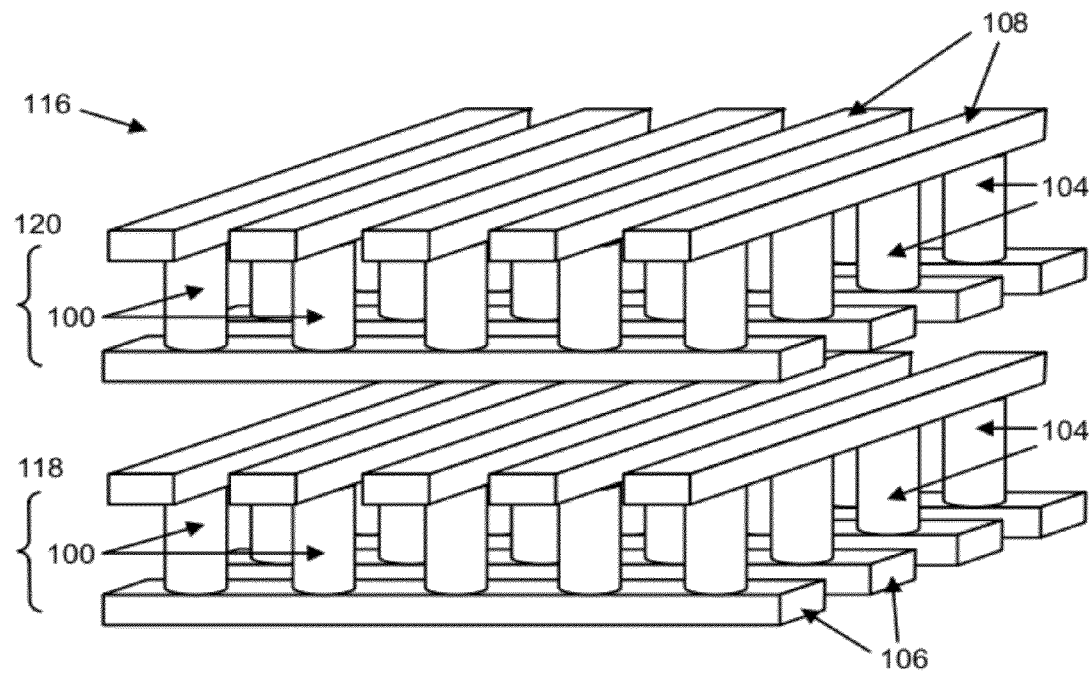
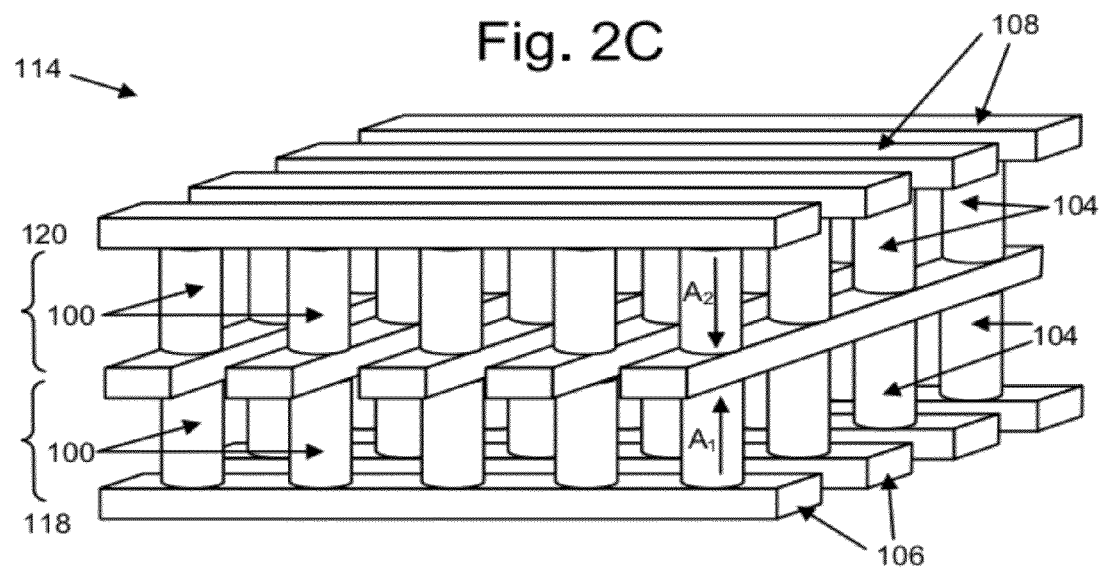

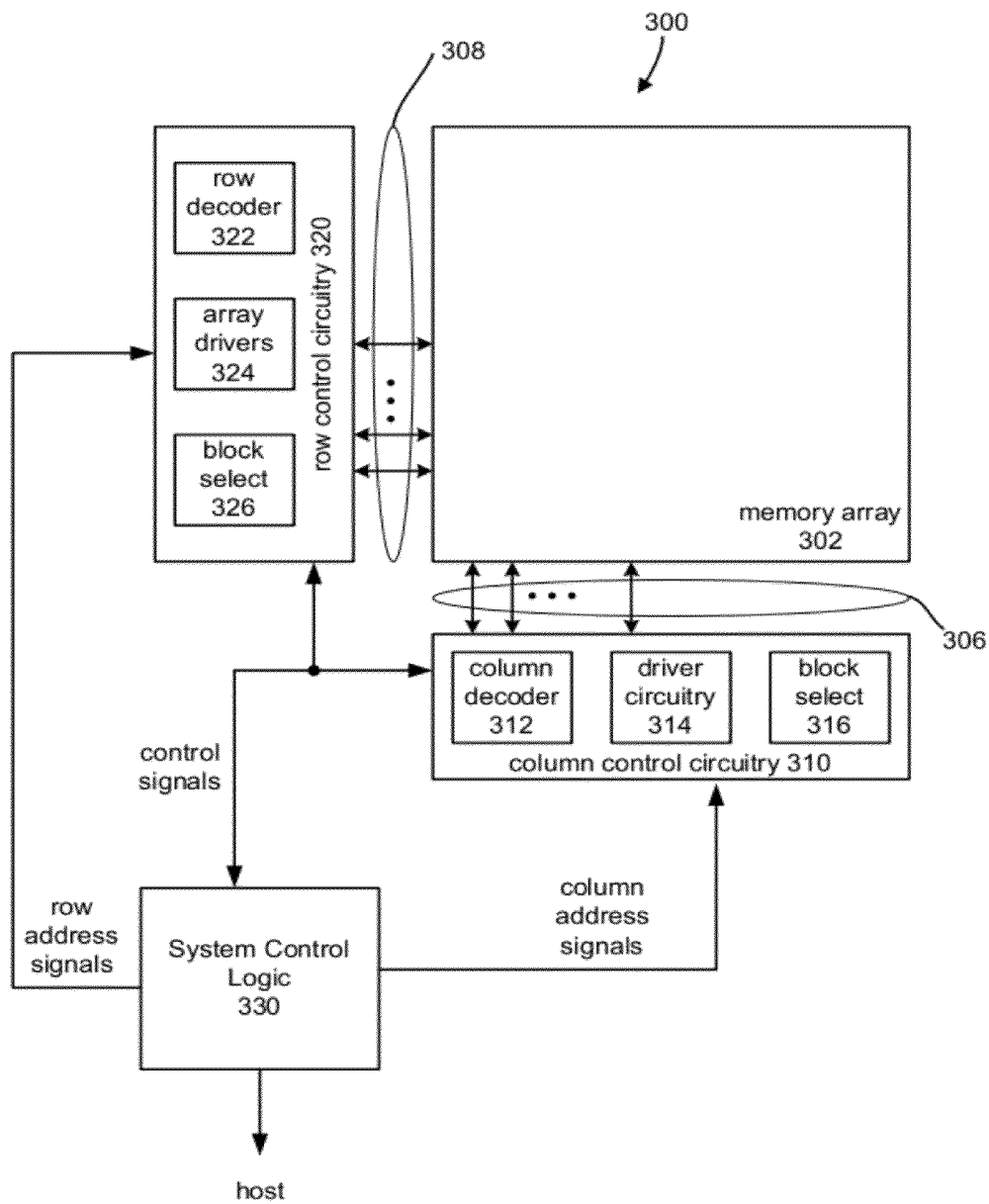

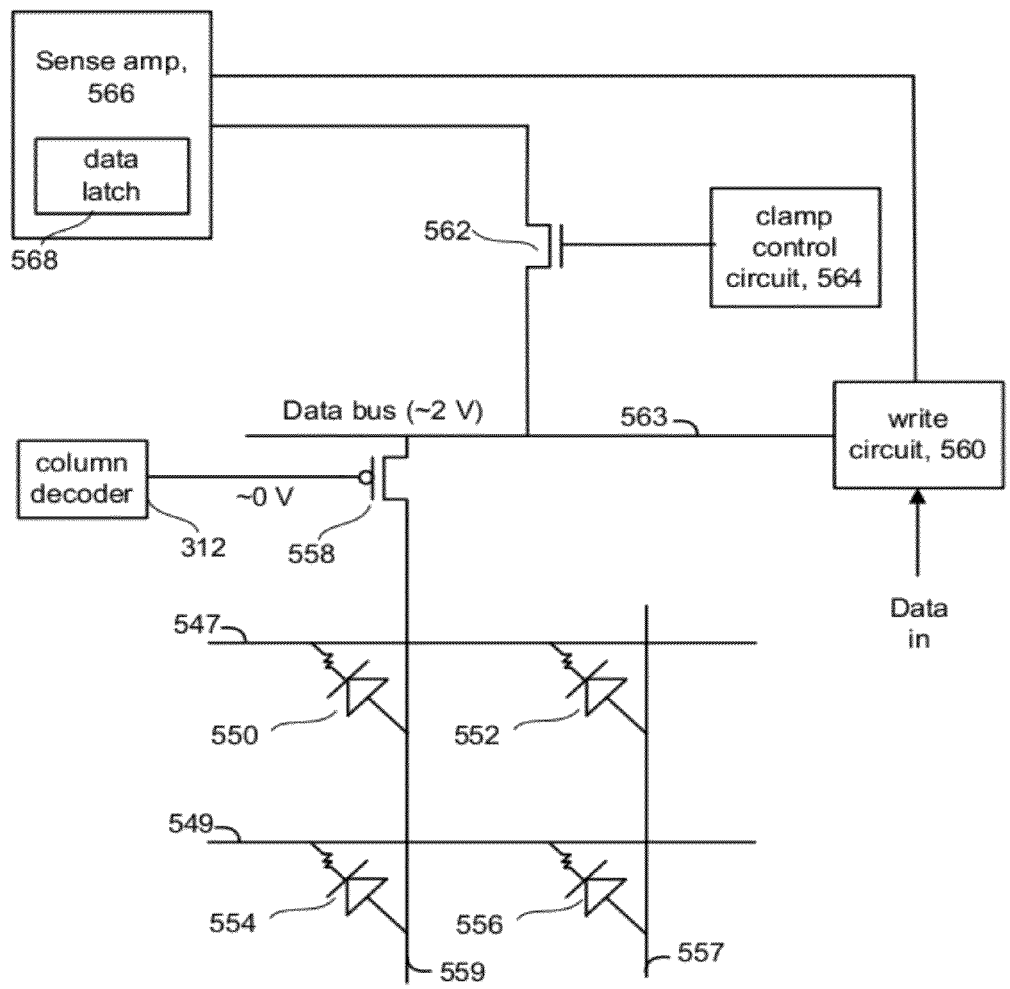

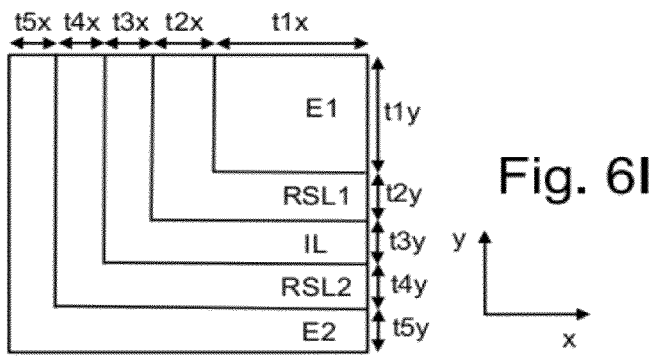
Fig. 6I
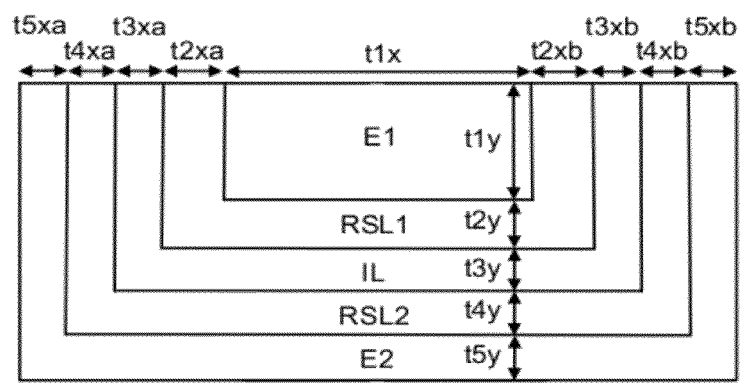
Fig. 6J
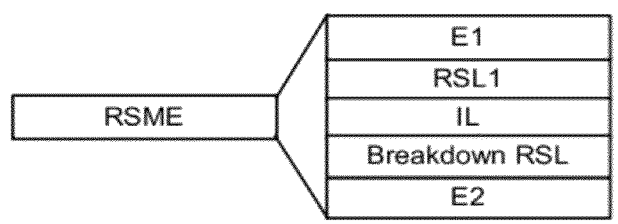
Fig. 6K1

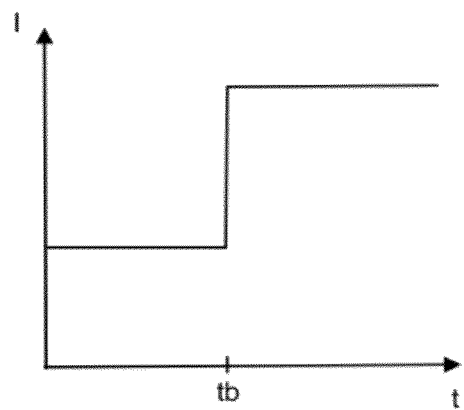
Fig. 6K2
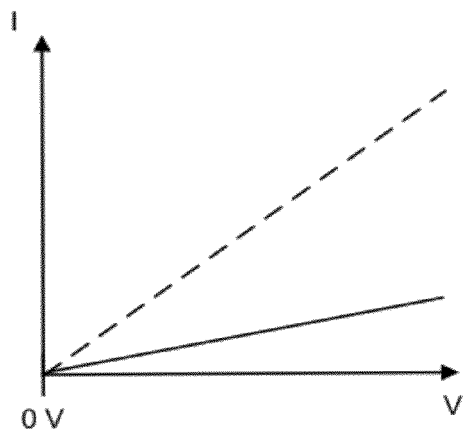
Fig. 6K3
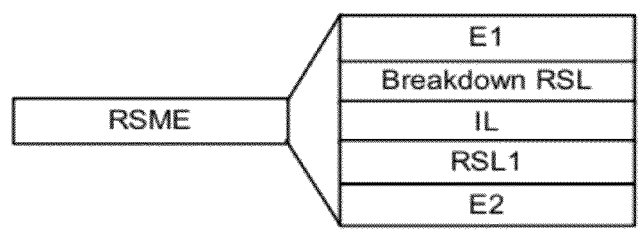
Fig. 6L

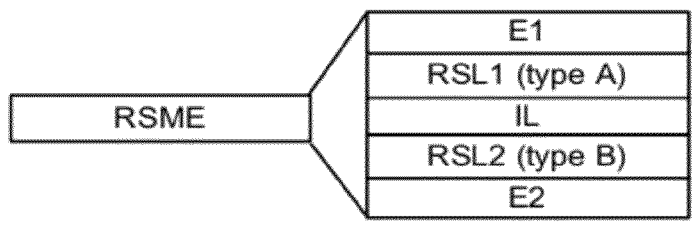
Fig. 6M
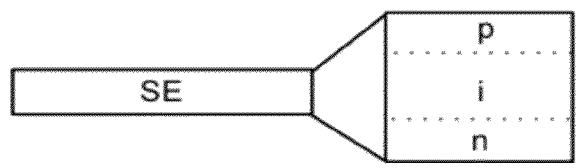
Fig. 7A
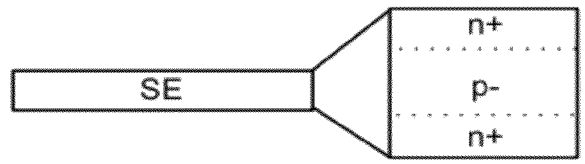
Fig. 7B
| Bit line |
| --- |
| BLC (W or NiSi) |
| AL1 (TiN) |
| E1 (n+ Si) |
| RSL1 (MeOx) |
| Cap1 (TiOx) |
| IL (TiN) |
| Cap2 (TiOx) |
| RSL2 (MeOx) |
| E2 (n+ Si) |
| AL (TiN) |
| SE (Si diode) |
| AL2 (TiN) |
| WLC (W or NiSi) |
| Word line |
Fig. 8

Fig. 10A

| E1 (TiN) |
| E1 (n+ Si) |
| RSL1 (MeOx) |
| Cap1 (TiOx) |
| IL (TiN) |
| Cap2 (TiOx) |
| RSL2 (MeOx) |
| E2 (n+ Si) |

Fig. 10B

| E1 (TiN) |
| Cap1 (TiOx) |
| RSL1 (MeOx) |
| IL (n+ Si) |
| RSL2 (MeOx) |
| Cap2 (TiOx) |
| E2 (TiN) |

Fig. 10C

| E1 (TiN) |
| Cap1 (TiOx) |
| RSL1 (MeOx) |
| IL (n+ Si) |
| IL (TiN) |
| Cap2 (TiOx) |
| RSL2 (MeOx) |
| E2 (n+ Si) |

Fig. 10D

| E1 (TiN) |
| E1 (n+ Si) |
| RSL1 (MeOx) |
| Cap1 (TiOx) |
| IL (TiN) |
| IL (n+ Si) |
| RSL2 (MeOx) |
| Cap2 (TiOx) |
| E2 (TiN) |

Fig. 11A

| E1 (n+ Si) |
| RSL1 (MeOx) |
| Cap1 (TiOx) |
| IL (TiN) |
| Cap2 (TiOx) |
| RSL2 (MeOx) |
| SiOx |
| E2 (n+ Si) |

Fig. 11B

| E1 (n+ Si) |
| RSL1 (MeOx) |
| Cap1 (TiOx) |
| IL (TiN) |
| Cap2 (TiOx) |
| RSL2 (MeOx) |
| TiOx |
| Ti |
| E2 (TiN) |

Fig. 11C

| E1 (n+ Si) |
| RSL1 (doped MeOx) |
| Cap1 (TiOx) |
| IL (TiN) |
| Cap2 (TiOx) |
| RSL2 (doped MeOx) |
| SiOx |
| E2 (n+ Si) |

Fig. 11D

| E1 (n+ Si) |
| RSL1 (doped MeOx) |
| Cap1 (TiOx) |
| IL (TiN) |
| Cap2 (TiOx) |
| RSL2 (doped MeOx) |
| TiOx |
| Ti |
| E2 (TiN) |

Fig. 11E

| E1 (n+ Si) |
| RSL1 (type A MeOx) |
| Cap1 (TiOx) |
| IL (TiN) |
| Cap2 (TiOx) |
| RSL2 (type B, MeOx) |
| SiOx |
| E2 (n+ Si) |

Fig. 11F

| E1 (n+ Si) |
| RSL1 (type A MeOx) |
| Cap1 (TiOx) |
| IL (TiN) |
| Cap2 (TiOx) |
| RSL2 (type B, MeOx) |
| TiOx |
| Ti |
| E2 (TiN) |

RESISTIVE RANDOM ACCESS MEMORY WITH LOW CURRENT OPERATION

CROSS-REFERENCE TO RELATED APPLICATIONS

This application is a continuation-in-part of U.S. patent application Ser. No. 13/157,204, filed Jun. 9, 2011, published as US2011/0310655 on Dec. 22, 2011, which in turn claims the benefit of U.S. provisional pat. app. No. 61/356,327, filed Jun. 18, 2010, and U.S. provisional pat. app. No. 61/467,936, filed Mar. 25, 2011, each of which is incorporated herein by reference.

BACKGROUND

The present technology relates to data storage.

A variety of materials show reversible resistance-change or resistance-switching behavior in which the resistance of the material is a function of the history of the current through, and/or voltage across, the material. These materials include chalcogenides, carbon polymers, perovskites, and certain metal oxides (MeOx) and metal nitrides (MeN). Specifically, there are metal oxides and nitrides which include only one metal and exhibit reliable resistance switching behavior. This group includes, for example, Nickel Oxide (NiO), Niobium Oxide (Nb2O5), Titanium Dioxide (TiO2), Hafnium Oxide (HfO2) Aluminum Oxide (Al2O3), Magnesium Oxide (MgOx), Chromium Dioxide (CrO2), Vanadium Oxide (VO), Boron Nitride (BN), and Aluminum Nitride (AlN), as described by Pagnia and Sotnick in "Bistable Switching in Electroformed Metal-Insulator-Metal Device," Phys. Stat. Sol. (A) 108, 11-65 (1988). A resistance-switching layer (RSL) of one of these materials may be formed in an initial state, for example, a relatively low-resistance state. Upon application of sufficient voltage, the material switches to a stable high-resistance state which is maintained even after the voltage is removed. This resistance switching is reversible such that subsequent application of an appropriate current or voltage can serve to return the RSL to a stable low-resistance state which is maintained even after the voltage or current is removed. This conversion can be repeated many times. For some materials, the initial state is high-resistance rather than low-resistance. A set process may refer to switching the material from high to low resistance, while a reset process may refer to switching the material from low to high resistance. A resistance-switching memory element (RSME) can include a RSL positioned between first and second electrodes.

These reversible resistance-change materials are of interest for use in nonvolatile memory arrays. One resistance state may correspond to a data "0," for example, while the other resistance state corresponds to a data "1." Some of these materials may have more than two stable resistance states. Moreover, in a memory cell, the RSME can be in series with a steering element such as a diode, which selectively limits the voltage across, and/or the current flow through, the RSME. For example, a diode can allow current to flow in only one direction of the RSME while essentially preventing a current flow in the opposite direction. Such a steering element itself is not typically a resistance-change material. Instead, the steering element allows a memory cell to be written to, and/or read from, without affecting the state of other memory cells in an array.

Non-volatile memories that have storage elements or cells formed from resistance-change materials are known. For example, U.S. Patent Application Publication No. 2006/0250836, titled "Rewriteable Memory Cell Comprising A Diode And A Resistance-Switching Material," incorporated herein by reference, describes a rewriteable non-volatile memory cell that includes a diode coupled in series with a resistance-change material such as a MeOx or MeN.

However, there is a continuing need for technologies which allow memory cells to be scaled down in size.

BRIEF DESCRIPTION OF THE DRAWINGS

FIG. 2B is a simplified perspective view of a portion of a three-dimensional memory array formed from a plurality of the memory cells of FIG. 1.

FIG. 2C is a simplified perspective view of a portion of a three-dimensional memory array formed from a plurality of the memory cells of FIG. 1.

FIG. 3 is a block diagram of one embodiment of a memory system.

FIG. 5 depicts an embodiment of a circuit for reading the state of a memory cell.

FIG. 6I depicts another example implementation of the RSME of FIG. 6A which includes L-shaped portions for RSL1, IL, RSL2 and E2.

FIG. 6J depicts another example implementation of the RSME of FIG. 6A which includes U-shaped portions for RSL1, IL, RSL2 and E2.

FIG. 6K1 depicts an example implementation of the RSME of FIG. 6A which uses one RSL and one breakdown layer, below the RSL.

FIG. 6K2 is a graph showing a transition from an initial state to a breakdown state for a breakdown layer.

FIG. 6K3 is a graph showing an I-V characteristic of a breakdown layer in an initial state (solid line) and in a breakdown state (dashed line).

FIG. 6L depicts an example implementation of the RSME of FIG. 6A which uses one RSL and one breakdown layer, above the RSL.

FIG. 6M depicts an example implementation of the RSME of FIG. 6A, in which the RSLs are of different types.

FIG. 7A depicts an example implementation of the steering element (SE) of the memory cell FIG. 6A as an Si diode.

FIG. 7B depicts an example implementation of the steering element (SE) of the memory cell of FIG. 6A as a punch-through diode.

FIG. 8 depicts an example implementation of the memory cell of FIG. 6A connected between a bit line and a word line.

FIG. 10A depicts an embodiment of the RSME of FIG. 6C describing alternative IL materials.

FIG. 10B depicts an embodiment of the RSME of FIG. 6C in an inverted, mirror stack configuration.

FIG. 10C depicts an embodiment of the RSME of FIG. 6C in an asymmetric, upright stack configuration.

FIG. 10D depicts an embodiment of the RSME of FIG. 6A in an asymmetric, inverted stack configuration.

FIG. 11A depicts an embodiment of the RSME of FIG. 6C showing the growth of SiOx when E2 is n+ Si.

FIG. 11B depicts an embodiment of the RSME of FIG. 6C showing the growth of a low band gap material such as TiOx when E2 is TiN.

FIG. 11C depicts an embodiment of the RSME of FIG. 6C in which the RSLs are made of a doped metal oxide to reduce operating voltage.

FIG. 11D depicts an embodiment of the RSME of FIG. 11C in which E2 is TiN instead of n+ Si.

FIG. 11E depicts an embodiment of the RSME of FIG. 6C in an asymmetric mirror cell configuration, where the RSLs are made of different materials.

FIG. 11F depicts an embodiment of the RSME of FIG. 6C in an asymmetric mirror cell configuration which is SiOx-free.

DETAILED DESCRIPTION

Figure 1:
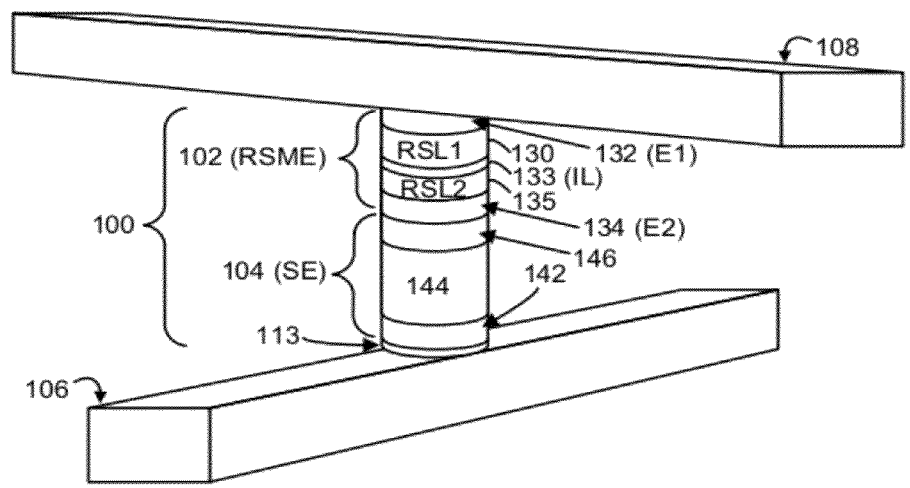
FIG. 1 is a simplified perspective view of one embodiment of a memory cell which includes a RSME in series with a steering element.

A memory system is provided that includes reversible resistivity-switching memory elements (RSME) having two or more resistance-switching layers (RSLs). In an example implementation, the RSME includes, in series, a first electrode (E1), a first resistance-switching layer (RSL1), an intermediate layer (IL), which is considered to be a scattering layer or coupling electrode, a second RSL (RSL2) and a second electrode (E2). In one approach, the RSME has a mirror configuration, in which the RSME configuration is symmetrical on either side of the IL. However, such a mirror configuration is not required. A layer can have any orientation, including horizontal or vertical.

Generally, as RSME-based memory devices are scaled down in size, a disadvantage is that a ballistic current flow during a set or reset process of the RSME can damage an associated steering element which is in series with the RSME or even prevent the operation of the memory cell at very reduced dimensions. Also generally, a plethora of RSL-based memory devices need a forming step during which the initially insulating properties of the RSL are broken down. This forming step is usually associated with a very short and very high discharge current peak, which can set the on-resistance level of the RSL for subsequent switching events. If the on-resistance level is very low (e.g., 100–30 kΩ), the associated switching currents are also very high and as a consequence, the memory cell would not be operable at very small technology nodes. A set or reset process is a type of resistance-switching operation for a RSL and RSME. To solve this problem, an RSME is provided which includes separate RSLs on either side of a conductive IL.

In particular, a memory cell which includes a RSME as provided herein can limit ballistic current overshoot by actively reducing the operating currents. A thin IL such as TiN can prevent the current overshoot and can limit the current flow, whereby it is easier to create a large electric field across the individual RSL. Due to the reduced current, the likelihood of damaging a steering element of the cell is reduced, and a thinner steering element can be used, facilitating the scaling down of the memory device and possibly reducing power consumption. The switching ability of the cell is maintained as an ionic current is still allowed.

The RSME is based on a qualitative model for an individual RSL which describes a number of findings, including: a switching current based on electron/hole and ion conduction, exponential E-field dependence of the ionic current, and the measured current is a ballistic current without use for the switching mechanism. Specifically, the qualitative model describes: (i) an avalanche-type set-current increase, (ii) why it is difficult to limit the set state to a high on-resistance state, (iii) sensitivity of cycling yield to the set process, (iv) why reset voltage can be higher than set voltage, (v) why higher reset voltage is needed for deeper reset, and (vi) why reset current is higher for deeper reset. The model of ballistic current may also be applicable to any other "thin" storage material/ionic memories such as TiSi, CBRAM (conductive-bridge RAM). For a RSL of MeOx, the findings also indicate that the electron/hole current does not contribute to the switching effect, but travels ballistically in the MeOx, delivering heat only to the contacts, and that this is different than thicker carbon or phase change materials, where this current generates heat in the memory cell, if the cell is long enough.

FIG. 1 is a simplified perspective view of one embodiment of a resistance-switching memory cell (RSMC) 100 which includes a RSME 102 coupled in series with a steering element 104 between a first conductor 106 and a second conductor 108.

The RSME 102 includes RSLs 130 and 135 on either side of a conductive intermediate layer (IL) 133. As mentioned, a RSL has a resistivity that may be reversibly switched between two or more states. For example, a RSL may be in an initial high-resistivity (high resistance) state upon fabrication that is switchable to a low-resistivity state upon application of a first voltage and/or current. Application of a second voltage and/or current may return the RSL to the high-resistivity state. Alternatively, the RSL may be in an initial low-resistance state upon fabrication that is reversibly switchable to a high-resistance state upon application of the appropriate voltage(s) and/or current(s). When used in a memory cell, one resistance state for each RSL (and a corresponding resistance state of the RSME) may represent a binary "0" of the RSME while another resistance state for each RSL (and a corresponding resistance state of the RSME) may represent a binary "1" of the RSME. However, more than two data/resistance states may be used. Numerous reversible resistance-change materials and operation of memory cells employing reversible resistance-change materials are described, for example, in the above-mentioned U.S. Patent Application Publication No. 2006/0250836.

In one embodiment, the process of switching the RSME from the high-resistivity state (representing, e.g., binary data "0") to the low-resistivity state (representing, e.g., binary data "1") is referred to as setting or forming, and the process of switching the RSME from the low-resistivity state to the high-resistivity state is referred to as resetting. In other embodiments, setting and resetting and/or the data encoding can be reversed. The set or reset process can be performed for a memory cell to program it to a desired state to represent binary data.

In some embodiments, the RSLs 130 and 135 may be formed from metal oxide (MeOx), one example of which is HfO2.

More information about fabricating a memory cell using reversible resistance-change material can be found in US 2009/0001343, published Jan. 1, 2009, titled "Memory Cell That Employs a Selectively Deposited Reversible Resistance Switching Element and Methods of Forming The Same," and incorporated herein by reference.

The RSME 102 includes electrodes 132 and 134. Electrode 132 is positioned between the RSL 130 and a conductor 108 such as a bit line or word line (control line). In one embodiment, electrode 132 is made of titanium (Ti) or titanium nitride (TiN). Electrode 134 is positioned between the RSL 133 and a steering element 104. In one embodiment, electrode 134 is made of Titanium Nitride (TiN), and serves as an adhesion and barrier layer.

Steering element 104 can be a diode, or other suitable steering element that exhibits non-ohmic conduction by selectively limiting the voltage across and/or the current flow through the RSME 102. In one approach, the steering element allows current to flow through the RSME in only one direction, e.g., from the bit line to the word line. In another approach, a steering element such as a punch-through diode allows current to flow through the RSME in either direction.

The steering element acts as a one-way valve, conducting current more easily in one direction than in the other. Below a critical "turn-on" voltage in the forward direction, the diode conducts little or no current. By use of appropriate biasing schemes, when an individual RSME is selected for programming, the diodes of neighboring RSMEs can serve to electrically isolate the neighboring RSMEs and thus prevent inadvertent resistance switching, so long as the voltage across the neighboring RSMEs does not exceed the turn-on voltage of the diode when applied in the forward direction, or the reverse breakdown voltage when applied in the reverse direction. neighboring RSMEs.

Specifically, in a large cross-point array of RSMEs, when relatively large voltage or current is required, there is a danger that RSMEs that share the top or the bottom conductor (e.g., word line or bit line) with the RSME to be addressed will be exposed to sufficient voltage or current to cause undesired resistance switching. Depending on the biasing scheme used, excessive leakage current across unselected cells may also be a concern. The use of a diode or other steering element can overcome this danger.

In this manner, the memory cell 100 may be used as part of a two- or three-dimensional memory array and data may be written to and/or read from the memory cell 100 without affecting the state of other memory cells in the array. Steering element 104 may include any suitable diode such as a vertical polycrystalline p-n or p-i-n diode, whether upward pointing with an n-region above a p-region of the diode or downward pointing with a p-region above an n-region of the diode. Or, even a punch-through diode or a Zener diode, which are operable in both directions, can be used. The steering element and the RSME together can be in the shape of a vertical pillar.

In other approaches, portions of the RSME are arranged laterally of one another, as discussed further below.

In some embodiments, steering element 104 may be formed from a polycrystalline semiconductor material such as polysilicon, a polycrystalline silicon-germanium alloy, polygermanium or any other suitable material. For example, the steering element 104 may include a heavily doped n+ polysilicon region 142, a lightly doped or an intrinsic (unintentionally doped) polysilicon region 144 above the n+ polysilicon region 142, and a heavily doped p+ polysilicon region 146 above the intrinsic region 144. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 142 to prevent and/or reduce dopant migration from the n+ polysilicon region 142 into the intrinsic region 144, as described, for example, in U.S. Pat. No. 7,405,465, titled "Deposited Semiconductor Structure To Minimize N-Type Dopant Diffusion And Method Of Making," issued Jul. 29, 2008, incorporated herein by reference. It will be understood that the locations of the n+ and p+ regions may be reversed.

When steering element 104 is fabricated from deposited silicon (e.g., amorphous or polycrystalline), a silicide layer may be formed on the diode to place the deposited silicon in a low resistivity state, as fabricated. Such a low resistivity state allows for easier programming of the memory cell as a large voltage is not required to switch the deposited silicon to a low resistivity state.

As described in U.S. Pat. No. 7,176,064, "Memory Cell Comprising a Semiconductor Junction Diode Crystallized Adjacent to a Silicide," incorporated herein by reference, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of the silicon diode during annealing). Lower resistivity silicon thereby is provided. Similar results may be achieved for silicon-germanium alloy and/or germanium diodes.

Conductors 106 and 108 include any suitable conductive material such as tungsten, any appropriate metal, heavily doped semiconductor material, a conductive silicide, a conductive silicide-germanide, a conductive germanide, or the like. In the embodiment of FIG. 1, conductors 106 and 108 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 106 and 108 to improve device performance and/or aid in device fabrication. The conductors 106 may be a word line while the conductor 108 is a bit line, or vice-versa.

While the RSME 102 is shown as being positioned above the steering element 104 in FIG. 1, it will be understood that in alternative embodiments, the RSME 102 may be positioned below the steering element 104. Various other configurations are possible as well. An RSL can exhibit unipolar or bipolar resistance-switching characteristics. With a unipolar resistance-switching characteristic, the voltages used for both set and reset processes are of the same polarity, i.e., either both positive or both negative. In contrast, with a bipolar resistance-switching characteristic, opposite polarity voltages are used for the set and reset processes. Specifically, the voltage used for the set process can be positive while the voltage used for the reset process is negative, or the voltage used for the set process can be negative while the voltage used for the reset process is positive.

Figure 2A:
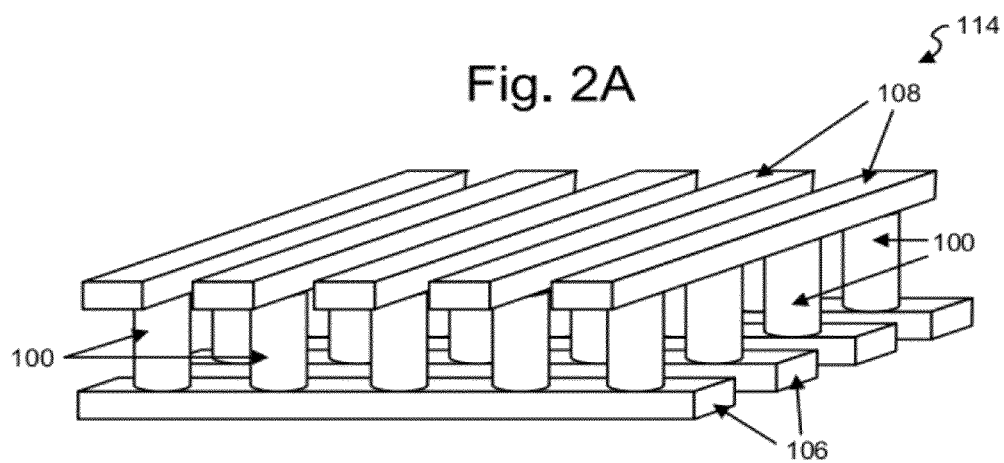
FIG. 2A is a simplified perspective view of a portion of a first memory level formed from a plurality of the memory cells of FIG. 1.

FIG. 2A is a simplified perspective view of a portion of a first memory level 114 formed from a plurality of the memory cells 100 of FIG. 1. For simplicity, the RSME 102, the steering element 104, and barrier layer 113 are not separately shown. The memory array 114 is a "cross-point" array including a plurality of bit lines (second conductors 108) and word lines (first conductors 106) to which multiple memory cells are coupled (as shown). Other memory array configurations may be used, as may multiple levels of memory.

FIG. 2B is a simplified perspective view of a portion of a monolithic three-dimensional array 116 that includes a first memory level 118 positioned below a second memory level 120. In the embodiment of FIG. 3, each memory level 118 and 120 includes a plurality of memory cells 100 in a cross-point array. It will be understood that additional layers (e.g., an inter-level dielectric) may be present between the first and second memory levels 118 and 120, but are not shown in FIG. 2B for simplicity. Other memory array configurations may be used, as may additional levels of memory. In the embodiment of FIG. 2B, all diodes may "point" in the same direction, such as upward or downward depending on whether p-i-n diodes having a p-doped region on the bottom or top of the diode are employed, simplifying diode fabrication.

In some embodiments, the memory levels may be formed as described in U.S. Pat. No. 6,952,030, "High-Density Three-Dimensional Memory Cell," incorporated herein by reference. For instance, the upper conductors of a first memory level may be used as the lower conductors of a second memory level that is positioned above the first memory level as shown in FIG. 2C. In such embodiments, the diodes on adjacent memory levels preferably point in opposite directions, as described in U.S. Pat. No. 7,586,773, titled "Large Array Of Upward Pointing P-I-N Diodes Having Large And Uniform Current," incorporated herein by reference. For example, the diodes of the first memory level 118 may be upward pointing diodes as indicated by arrow A1 (e.g., with p regions at the bottom of the diodes), while the diodes of the second memory level 120 may be downward pointing diodes as indicated by arrow A2 (e.g., with n regions at the bottom of the diodes), or vice versa.

A monolithic three-dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory," incorporated herein by reference. The substrates may be thinned or removed from the memory levels before bonding, but as the memory levels are initially formed over separate substrates, such memories are not true monolithic three-dimensional memory arrays.

The above examples show memory cells in a cylindrical or pillar shape and conductors in the shapes of rails according to the disclosed arrangements. However, the technology described herein is not limited to any one specific structure for a memory cell. Other structures can also be used to form memory cells that include RSMEs. For example, U.S. Pat. Nos. 6,952,043, 6,951,780, 6,034,882, 6,420,215, 6,525,953 and 7,081,377, each of which is incorporated herein by reference, provide examples of structures of memory cells that can be adapted to use RSMEs. Additionally, other types of memory cells can also be used with the techniques described herein.

FIG. 3 is a block diagram that depicts one example of a memory system 300 that can implement the technology described herein. Memory system 300 includes a memory array 302 that can be a two- or three-dimensional array of memory cells as described above. In one embodiment, memory array 302 is a monolithic three-dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from system control logic circuit 330, and typically may include such circuits as row decoders 322, array terminal drivers 324, and block select circuitry 326 for both read and programming (e.g., set and reset) operations. Memory system 300 also includes column control circuitry 310 whose input/outputs 306 are connected to respective bit lines of the memory array 302. Column control circuitry 306 receives a group of N column address signals and one or more various control signals from system control logic 330, and typically may include such circuits as column decoders 312, array terminal receivers or drivers 314, block select circuitry 316, as well as read/write circuitry, including sense amps 318, and I/O multiplexers. System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300. For example, write circuitry 460, read circuitry 461 and clamp control circuitry 464, discussed further below, may be provided.

In one embodiment, all of the components depicted in FIG. 3 are arranged on a single integrated circuit. For example, system control logic 330, column control circuitry 310 and row control circuitry 320 can be formed on the surface of a substrate and memory array 302 in a monolithic three-dimensional memory array formed above the substrate (and, therefore, above system control logic 330, column control circuitry 310 and row control circuitry 320). In some cases, a portion of the control circuitry can be formed on the same layers as some of the memory array.

Integrated circuits incorporating a memory array usually subdivide the array into a number of sub-arrays or blocks. Blocks can be further grouped together into bays that contain, for example, 16, 32, or a different number of blocks. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

As described above, RSME 102 may be reversibly switched between two or more states by reversibly switching each of its RSLs. For example, the RSME may be in an initial, high-resistivity state upon fabrication that is switchable to a low-resistivity state upon application of a first voltage and/or current. Application of a second voltage and/or current may return the RSME to a high-resistivity state. The memory system 300 can used with any RSME described herein.

Figure 4A:
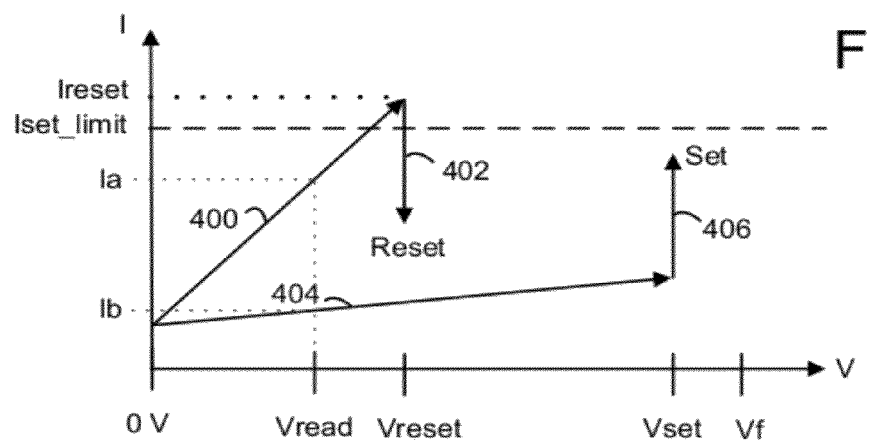
FIG. 4A is a graph depicting I-V characteristics of an example unipolar RSL.

FIG. 4A is a graph of voltage versus current for an example embodiment of a unipolar RSL. The x-axis depicts an absolute value of voltage, the y-axis depicts current and the lines are adjusted to meet at the origin of the graph. In the set process, line 404 represents the I-V characteristic of the RSL when in the high-resistivity, reset state, and line 406 represents a transition to the low-resistivity, set state at Vset. In the reset process, line 400 represents the I-V characteristic of the RSL when in the low-resistivity, set state, and line 402 represents a transition to the high-resistivity, reset state at Vreset. The example shows a unipolar operation mode where the polarity of the voltage is the same for the both the set and reset switching.

To determine the RSL's state, a voltage can be applied across the RSL and the resulting current is measured. A higher or lower measured current indicates that the RSL is in the low- or high-resistivity state, respectively. In some cases, the high resistivity state is substantially higher, e.g., two or three orders of magnitude (100-1,000) times higher than the low resistivity state. Note that other variations of a RSL having different I-V characteristics can also be used with the technology herein.

When in the reset state, the RSME exhibits the resistance characteristics shown by line 404 in response an applied voltage between 0 and Vset. When in the set state, however, the RSME exhibits the resistance characteristics shown by line 400 in response an applied voltage between 0 and Vreset, where Vreset<Vset. Thus, the RSME thus exhibits different resistance characteristics in response to the same voltages in the same voltage range (e.g., between 0 and Vreset) depending on the resistance state of the RSME. In a read operation, a fixed voltage Vread<Vreset can be applied, in response to which the sensed current is Ia in the set state or Ib in the reset state. The state of an RSL or RSME can thus be sensed by identifying at least one point of its I-V characteristic.

The RSME can include multiple RSLs which each exhibit a substantially similar unipolar switching characteristic, in one approach.

Figure 4B:
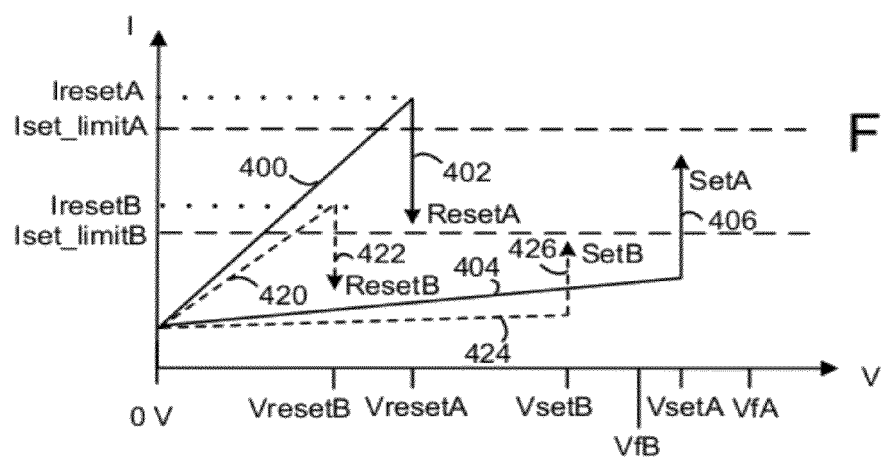
FIG. 4B is a graph depicting different I-V characteristics of two example unipolar RSLs.

FIG. 4B is a graph depicting different I-V characteristics of two example unipolar RSLs. For two or more unipolar RSLs, the I-V (current-voltage) characteristics can be substantially the same, so that I increases with V at a common rate, and the set and/or reset levels can be substantially the same, for instance. Or, the I-V characteristics of the RSLs can differ such that, e.g., I increases with V more quickly for one of the RSLs, or the set and/or reset levels can be different. In this example, "A" denotes a first type of RSL and "B" denotes a second type of RSL, where the RSLs have different unipolar resistance-switching characteristics. The x-axis depicts voltage (V) and the y-axis depicts current (I). For the type "A"

RSL, lines 400, 402, 404 and 406 are the same as in FIG. 4A. Also for the type "A" RSL, VsetA is the set voltage, VresetA is the reset voltage, IresetA is the reset current and Iset_limitA is the current set limit. For the type "B" RSL, lines 420, 422, 424 and 426 correspond to lines 400, 402, 404 and 406, respectively. Also for the type "B" RSL, VsetB is the set voltage, VresetB is the reset voltage, IresetB is the reset current and Iset_limitB is the current set limit. In the approach shown here, VsetA>VsetB, VresetA>VresetB, IresetA>IresetB and Iset_limitA>Iset_limitB, but this is only an example and other, alternative relations may apply.

When two or more RSLs are in the same RSME, the switching characteristic of the RSME will be a function of the switching characteristic of each of the RSLs. During a set process, for example, as V is increased, the type "B" RSL could switch before the type "A" RSL, if the voltage was split equally across each RSL. Similarly, during a reset process, for example, as V is increased, the type "B" RSL could switch before the type "A" RSL, assuming the same voltage is applied in each RSL.

It is alternatively possible for the type "A" and "B" RSLs to have different I-V characteristics of opposite polarity. For example, we could have VsetA>0 V and VresetA>0 V, while VsetB<0 V and VresetB<0 V. As an example, the characteristic of the type "A" RSL can be as described in FIG. 4A while the characteristic of the type "B" RSL can be as described in FIG. 4C, below. It is also possible, in theory, for one RSL in a RSME to have a unipolar characteristic while another RSL in the RSME has a bipolar characteristic. However, using only one kind of switching characteristic (unipolar or bipolar) among all RSLs in a RSME can allow for a simplified control scheme.

In some cases, a read out of an RSME switches the data state of one of the RSLs. For example, with a first RSL in the low resistance state and a second RSL in the high resistance state, a read operation would detect essentially no current, assuming the high resistance state was orders of magnitude higher than the low resistance state. That is, the resistance of the RSME, equal to the sum of the resistance of each RSL, would be very high, so the current would be very low or essentially zero. A read operation could switch the second RSL to the low resistance state, so that the resistance of the RSME was low, and the current through it is relatively high and detectable. A write back operation could be performed next to switch the second RSL back to the high resistance state.

When a voltage is applied across the electrodes of an RSME, it will be divided across each RSL according in proportion to each RSL's resistance. When the first RSL is in the low resistance state and the second RSL is in the high resistance state, the first RSL will transfer the potential at the electrode to the IL, so that substantially all of the voltage is applied across the second RSL. This voltage will switch the second RSL if it is of the appropriate magnitude and polarity.

Moreover, an RSL can use a material that can be operated as a unipolar or bipolar device, such as described in Sun et al., "Coexistence of the bipolar and unipolar resistive switching behaviours in Au/SrTiO3/Pt cells," J. Phys. D: Appl. Phys. 44, 125404, Mar. 10, 2011, incorporated herein by reference.

Figure 4C:
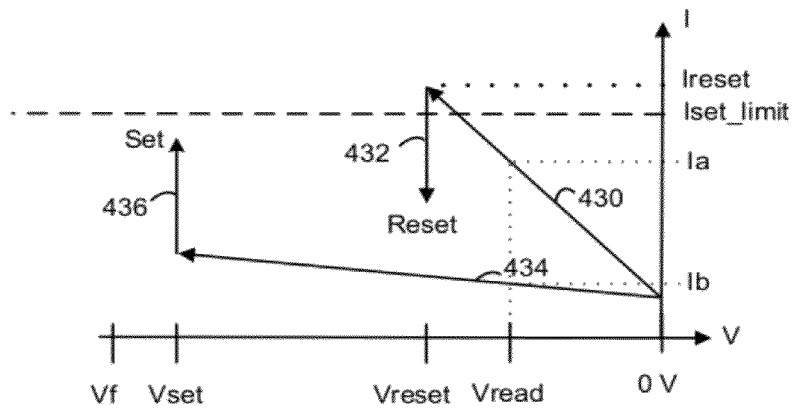
FIG. 4C is a graph depicting I-V characteristics of another example unipolar RSL.

FIG. 4C is a graph depicting I-V characteristics of another example unipolar RSL. Compared to the characteristic of FIG. 4A, negative voltages are used instead of positive during the set and reset processes. In the set process, line 434 represents the I-V characteristic of the RSL when in the high-resistivity, reset state, and line 436 represents a transition to the low-resistivity, set state at Vset. In the reset process, line 430 represents the I-V characteristic of the RSL when in the low-resistivity, set state, and line 432 represents a transition to the high-resistivity, reset state at Vreset. Vread, Vreset, Vset and Vf are all negative voltages. In a read operation, a fixed voltage Vread>Vreset can be applied, in response to which the sensed current is Ia in the set state or Ib in the reset state.

Figure 4D:
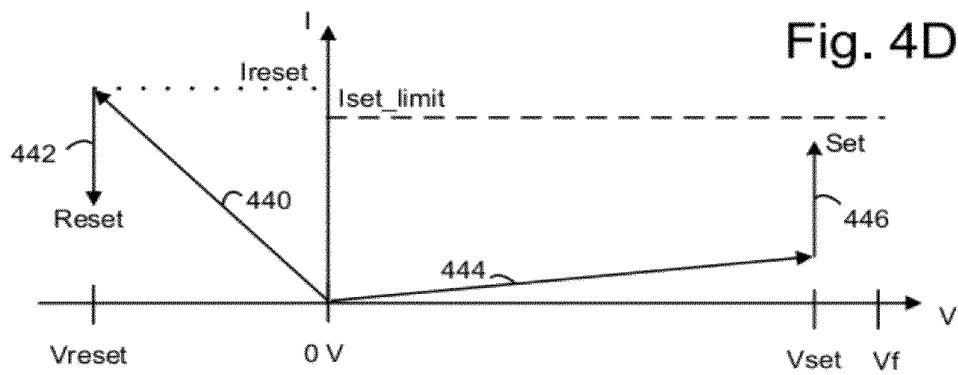
FIG. 4D is a graph depicting I-V characteristics of an example bipolar RSL.

FIG. 4D is a graph depicting I-V characteristics of an example bipolar RSL. Here, opposite polarity voltages are used for the set and reset processes. Moreover, positive voltages are used for the set process and negative voltages are used for the reset process. In this bipolar RSL, the set process occurs when a positive voltage is applied, and the reset process occurs when a negative voltage is applied. In the set process, line 444 represents the I-V characteristic of the RSL when in the high-resistivity, reset state, and line 446 represents a transition to the low-resistivity, set state at Vset. In the reset process, line 440 represents the I-V characteristic of the RSL when in the low-resistivity, set state, and line 442 represents a transition to the high-resistivity, reset state at Vreset. Vset and Vf are positive voltages and Vreset is a negative voltage.

Figure 4E:
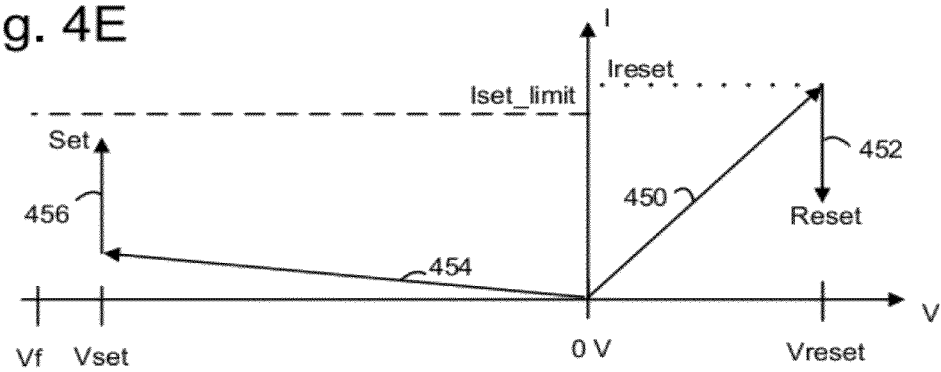
FIG. 4E is a graph depicting I-V characteristics of another example bipolar RSL.

FIG. 4E is a graph depicting I-V characteristics of another example bipolar RSL. In this bipolar RSL, the reset process occurs when a positive voltage is applied, and the set process occurs when a negative voltage is applied. In the set process, line 454 represents the I-V characteristic of the RSL when in the high-resistivity, reset state, and line 456 represents a transition to the low-resistivity, set state at Vset. In the reset process, line 450 represents the I-V characteristic of the RSL when in the low-resistivity, set state, and line 452 represents a transition to the high-resistivity, reset state at Vreset. Vset and Vf are positive voltages and Vreset is a negative voltage.

Although the Ireset level in FIG. 4D and FIG. 4C is higher than the Iset level, it should be emphasized that it can be the other way around. This means that Iset level in FIG. 4D and FIG. 4C can be higher than the Ireset level for the opposite polarity.

FIG. 5 depicts an embodiment of a circuit for reading the state of a memory cell. A portion of a memory array includes memory cells 550, 552, 554 and 556. Two of the many bit lines and two of the many word lines are depicted. Bit line 559 is coupled to cells 550 and 554, and bit line 557 is coupled to cells 552 and 556. Bit line 559 is the selected bit line and may be at 2 V, for instance. Bit line 557 is an unselected bit line and may be at ground, for instance. Word line 547 is the selected word line and may be at 0 V, for instance. Word line 549 is an unselected word line and may be at 2 V, for instance.

A read circuit for one of the bit lines 559 is depicted to be connected to the bit line via transistor 558, which is controlled by a gate voltage supplied by column decoder 312 in order to select or unselect the corresponding bit line. Transistor 558 connects the bit line to a Data bus 563. Write circuit 560 (which is part of system control logic 330) is connected to the Data bus. Transistor 562 connects to the Data bus and operates as a clamp device that is controlled by clamp control circuit 564 (which is part of system control logic 330). Transistor 562 is also connected to a sense amp 566, which includes a data latch 568. The output of sense amp 566 is connected to a data out terminal (to system control logic 330, a controller and/or a host). Write circuit 560 is also connected to the sense amp 566 and the data latch 568.

When attempting to read the state of the RSME, all word lines are first biased at Vread (e.g., approximately 2 V) and all bit lines are at ground. The selected word line is then pulled to ground. For example, this discussion will assume that memory cell 550 is selected for reading. One or more selected bit lines 559 are pulled to Vread through the data bus (by turning on transistor 558) and the clamp device (transistor 562, which receives ~2 V+Vth, the threshold voltage of the transistor 562). The clamp device's gate is above Vread but controlled to keep the bit line near Vread. In one approach, current is pulled by the selected memory cell 550 through transistor 562 from a sense node in the sense amp. The sense node can receive a reference current that is between a high-resistivity state current and a low-resistivity state current. The sense node moves corresponding to the current difference between the cell current and the reference current. Sense amp 566 generates a data out signal by comparing the sensed voltage to a reference read voltage. If the memory cell current is larger than the reference current, the memory cell is in the low-resistivity state and the voltage at the sense node will be lower than the reference voltage. If the memory cell current is smaller than the reference current, the memory cell is in the high-resistivity state and the voltage at the sense node will be higher than the reference voltage. The output data signal from the sense amp 566 is latched in data latch 568.

Referring again to FIG. 4A, for example, while in the high-resistivity state, if the voltage Vset and sufficient current is applied, the RSL will be set to the low-resistivity state. Line 404 shows the behavior when Vset is applied. The voltage will remain somewhat constant and the current will increase toward Iset_limit. At some point, the RSL will be set and the device behavior will be based on line 406. Note that the first time the RSL is set, Vf (the forming voltage) is needed to set the device. After that, Vset is sufficient to set the device be used. The forming voltage Vf may be greater than Vset in absolute magnitude.

While in the low-resistivity state (line 400), if Vreset and sufficient current (Ireset) are applied, the RSL will be reset to the high-resistivity state. Line 400 shows the behavior when Vreset is applied. At some point, the RSL will be reset and the device behavior will be based on line 402.

In one embodiment, Vset is approximately 7 V, Vreset is approximately 9 V, Iset_limit is approximately 10 μA and Ireset could be as low as 100 nA. These voltages and currents apply to the circuit of FIG. 5 where we have a RSME and a diode in series.

FIGS. 6A-6M can be a cross-sectional view in a vertical or horizontal plane of an RSME, for instance.

Figure 6A:
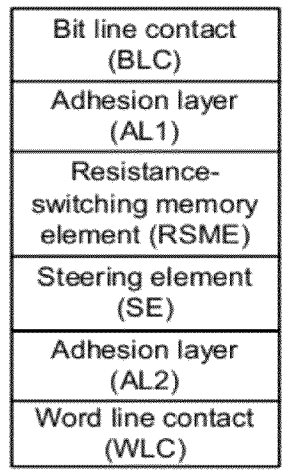
FIG. 6A depicts an example memory cell having a RSME and a steering element (SE) below the RSME.

FIG. 6A depicts an example memory cell having a RSME and a steering element (SE) below the RSME. The memory cell can have various configurations. One configuration is a stacked configuration in which each type of material is provided in a layer, and each layer is positioned beneath the layer above it and typically has a similar cross-sectional area. In another possible configuration, one or more layers can be arranged end-to-end with one or more other layers (see FIGS. 6F-6J).

Note that, in the figures, any two layers or materials which are pictured as being adjacent to one another may be in contact with one another. However, unless otherwise specified, this is not required, and any two layers or materials which are pictured as being adjacent to one another may be separated by one or more layers of other materials which are not depicted. Additionally, in some cases, a material can be formed as a byproduct of fabrication, such as a SiOx layer which is formed on an Si layer. Such byproducts are not necessarily depicted in the figures. Moreover, variations of the described implementations are possible. For example, the order of layers in each implementation can be reversed so that the word line is on top and the bit line is on the bottom, for instance. One or more intermediate layers can be provided between each of the layers depicted. Also, the position of the steering element can be changed so that it is located above or below other layers including the RSLs. The orientation of the layers can be modified from vertical to horizontal or any other orientation. Multiple layers or portions which can form a common conductive path are said to be serially connected.

The memory cell includes a bit line contact (BLC) material such as W or NiSi, which is connected to a bit line of a memory device. The bit line is a type of control line, so that the BLC is also a contact to a first control line. After the BLC in a serial path is a first adhesion layer (AL1) such as TiN which helps the BLC adhere to the RSME, as well as acting as a barrier. A TiN layer can be deposited by any conventional method, such as sputtering. After the RSME in the serial path is a steering element (SE) such as a diode. The steering element allows a signal such as a voltage or current to be applied selectively to one or more memory cells, via word lines and bit lines, to individually control the cells such as to change their respective data states by switching their RSMEs. The resistance-switching behavior of the RSME is independent of the SE. The SE could have a resistance-switching behavior itself; however, this behavior would be independent of the resistance-switching behavior of the RSME.

After the SE in the serial path is a second adhesion layer (AL2) such as TiN. After the AL2 in the serial path is a word line contact (WLC) material such as W or NiSi, which is connected to a word line of a memory device. The word line is a type of control line, so that the WLC is also a contact to a second control line. The depicted portions of the memory cell are arranged thus serially.

Figure 6B:
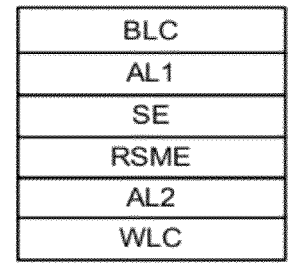
FIG. 6B depicts an alternative configuration of a memory cell having a RSME, where the steering element (SE) is above the RSME.

FIG. 6B depicts an alternative configuration of a memory cell having a RSME, where the steering element (SE) is above the RSME. The order of the other layers from top to bottom can be reversed as well, from bottom to top.

Figure 6C:
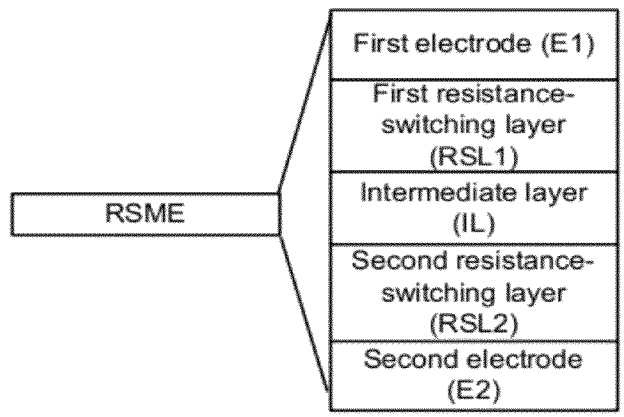
FIG. 6C depicts an example implementation of the RSME of FIG. 6A as a mirror resistive switch (MRS) in a vertical stack.

FIG. 6C depicts an example implementation of the RSME of FIG. 6A as a mirror resistive switch (MRS) in a vertical stack. The RSME includes a first electrode (E1), which is a top electrode in some configurations, a first resistance-switching layer (RSL1) and a conductive intermediate layer (IL), which acts as a scattering layer, coupling electrode or coupling layer. The RSME also includes a second RSL (RSL2), and a second electrode (EL2), which is a bottom electrode in some configurations. The RSLs can be reversible RSLs, for instance. A reversible RSL can be switched from one state to another state and back to the one state. The IL is electrically between, and in series with, E1 and E2. RSL1 is electrically between, and in series with, E1 and IL. RSL2 is electrically between, and in series with, E2 and IL. "Electrically between" or similar can mean in an electrically conductive path. For example, the IL can be electrically between E1 and E2 with or without being physically between E1 and E2.

For example, an RSME can be formed by connecting two bipolar memristor (memory-resistor) elements anti-serially into one mirror resistive switch (MRS). A memristor is a passive two-terminal circuit element in which the resistance is a function of the history of the current through and voltage across the device. Such a MRS can be made of a first memristive element which includes an E1 such as n-type Silicon, RSL1, which can be a transition metal oxide such as Hafnium Oxide (HfO2) or an Hafnium Silicon Oxynitride (HfSiON) and an IL, which can be an oxidizable electrode (such as TiN) which is capable of undergoing a chemical reaction with oxygen.

The RSME includes a second memristive element which is made of the same (or different) materials, but in a reverse order, sharing the oxidizable electrode of the IL. Moreover, the first and second memristive elements can both have bipolar or unipolar I-V (current-voltage) characteristics, in one approach. In another approach, one of the memristive elements has a unipolar characteristic and the other memristive element has a bipolar characteristic. By merging the two memristive elements to one RSME, the RSME has an I-V characteristic which is a superposition of the I-V characteristics of the constituent memristive elements, but with the additional benefit, that it is operating at much lower currents than the individual memristive elements.

More generally, the RSME will have an I-V characteristic which is a superposition of the I-V characteristics of the constituent RSLs, but enables operation at low currents.

The IL acts as a scattering layer by scattering electrons which enter the IL from the RSLs, thereby slowing an electron flow which does not contribute to the switching mechanism, to avoid damage to a steering element. Moreover, the IL acts as a coupling electrode or layer which is capacitive coupled to a voltage which is applied to the RSME by setting potentials of E1 and E2.

Through such scattering, the IL provides a resistance which reduces a peak current flow during a set or reset process while achieving a low current operation. The current limiting operation is believed to originate from two aspects of the IL layer. First, hot electrons are scattered very well in the IL layer by an electron-electron interaction. Second, as soon as one of the RSLs starts to break down and deliver excess charge Q onto the IL, the applied voltage on the RSL is effectively reduced by $V=Q/C$, where C is the capacitance of the IL layer towards the electrodes E1 and E2. At the same time, a higher voltage is now at the second RSL, inducing a breakdown of the second RSL. Because the available amount of charge Q is limited, the current which can flow here is also very limited. In this way, this RSME enables the operation of the memory cell at low currents. The resistance is believed to be based on the ability of the IL to scatter electrons and give very efficient negative feedback to the applied bias voltage so that small conductive filaments are formed which allow switching to occur at low currents. Without the IL, a filament with very low resistance would be formed when a voltage is applied, leading to a high current peak (due to the relationship of $I=V/R$) in the memory cell and the required switching currents would also be very high.

The RSME has a mirror configuration relative to the IL because the sequence of an RSL and an electrode extends on either side of the IL. A mirror configuration may also use the same material for the RSLs and electrodes. The combination of E1, RSL1 and the IL forms a first memristive (memory-resistor) element, and the combination of E2, RSL2 and the IL forms a second memristive element. The two memristive elements can be bipolar memristor elements which are connected anti-serially or serially into one mirror resistive switch (MRS).

In use, when a voltage is applied across E1 and E2, an electric field (E) is generated which is the voltage divided by the distance between E1 and E2. The IL can float, which means it is not directly driven with a voltage/current signal and instead can be capacitively coupled to one or more other electrodes (such as E1 and/or E2) which are directly driven with a voltage/current signal. Due to capacitive coupling, one portion of the voltage between E1 and E2 will be imposed from E1 to the coupling layer and across RSL1, while another portion of the voltage between E1 and E2 will be imposed from the coupling layer to E2 and across RSL2. The voltage is divided across each RSL in proportion to each RSL's resistance.

Furthermore, the first memristor may have a first I-V characteristic, while the second memristor has a second I-V characteristic, so that the overall I-V characteristic of the memory cell is a superposition of the I-V characteristics of the first and second memristors, but with the additional benefit, that it is operating at much lower currents than the individual memristive elements. In one approach, the I-V characteristics of the first and second memristors differ but have the same polarity. In another approach, the I-V characteristics of the first and second memristors have opposite polarities. FIGS. 4A-4E, discussed previously, provide example I-V characteristics of a RSL.

The elements of the RSME can be provided in many possible configurations which are detailed further below. Example materials for E1 include n+ Si (polysilicon), p+ Si (polysilicon), TiN, TiSix, TiAlN, TiAl, W, WN, WSix, Co, CoSi, p+ Si, Ni and NiSi. Example materials for RSL1 and RSL2 include metallic materials such as MeOx and MeN. However, non-metallic materials could also be used, as discussed in some of the embodiments herein. RSL1 and RSL2 can be of the same type or of different types. A RSL could also be a phase change cell, carbon-based, carbon nanotube-based, nano-ionic memory, conductive bridge, or a cell which changes its phase, spin, magnetic component, and so forth. The RSLs can have an on-resistance (conductive state resistance) in the MΩ range, e.g., 1-10 MΩ or more. This is in contrast to programmable metallization cells (PMCs) such as a conductive-bridging RAM, or CBRAM, which form quantum point contacts, and have a much lower resistance of about 25 KΩ or lower. The higher resistance provides a low current operation and better scalability.

Example materials for E2 include n+ Si, n+ SiC, p+ SiC and p+ Si (polysilicon), TiN, TiAlN, TiAl, W, WN Co, CoSi, p+ Si, Ni and NiSi. Particular combinations of materials in the different layers can be advantageous. Various configurations are discussed in further detail below.

Example materials for the IL include TiN, TiN, Al, Zr, La, Y, Ti, TiAlN, TixNy, TiAl alloy and p+ SiC. The IL can thus be made of an oxidizable material (e.g., TiN, Al, Zr, La, Y, Ti) or a non-oxidizable material (e.g., TiAlN, TixNy, TiAl alloy and Carbon, including, e.g., graphene, amorphous carbon, carbon nanotubes, carbon with different crystal structures and p+ SiC). Generally, the same material of E1 and E2 can be used for the IL layer. In some cases, one or more oxide layers are formed intentionally or un-intentionally, as a byproduct of the deposition and formation step. For example, Si can be oxidized by deposition of MeOx on top of the Si. Even TiN or other suggested metals might be oxidized on one side by MeOx deposition and can be oxidized at the interface by an interfacial reaction of MeOx and TiN.

As mentioned, E1, E2 and the IL are made of a conductive material. A conductive material can be characterized by its conductivity $\sigma=1/\rho$ or its reciprocal, which is resistivity $\rho=E/J$. Conductivity is measured in siemens per meter (S/m), and resistivity is measured in ohm-meters (Ω-m) or Ω-cm. E is the magnitude of the electric field in V/m and J is the magnitude of the current density in A/m2. For an insulator, $\rho>108$ Ω-cm or $\sigma<10-8$ S/cm. For a semiconductor, $10-3$ Ω-cm$<\rho 108$ Ω-cm or $103$ S/cm$>\sigma>10-8$ S/cm. For a conductor, $10-3$ Ω-cm$>\rho$ or $103$ S/cm$<\sigma$. A semiconductor can be distinguished from a conductor in that a semiconductor can be made electrically conductive by doping it to be p-type or n-type semiconductor, while a conductor does not rely on doping. A semiconductor diode can also be distinguished from a conductor in that a semiconductor diode allows current to flow based on the polarity of an applied voltage, so that current can strongly flow in one direction but not the opposite direction. The direction in which a semiconductor diode allows a forward current to flow depends on whether it is from a p-type region to an or n-type region. In contrast, a conductor allows current to flow equally well in either direction. A conductive material is meant to include a semiconductor (a semiconductive material) and a conductor. A conductor may also be referred to as a conductive material. A conductor has a higher conductivity than a semiconductor.

Note that the RSME does not rely on a high band-gap triple stack (a relatively high band gap material between layers of a relatively low band gap material) since the IL is a conductive material which can received a coupling voltage.

Figure 6D:
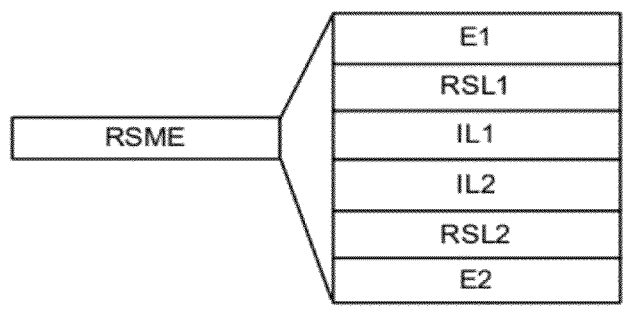
FIG. 6D depicts an example implementation of the RSME of FIG. 6A using multiple intermediate layers (ILs) between RSLs.

FIG. 6D depicts an example implementation of the RSME of FIG. 6A using multiple ILs of different types between RSLs. Multiple adjacent intermediate layers are used, including a first IL (IL1) of type "1" and a second IL (IL2) of type "2." An advantage of this embodiment is that the ILs can be of different types, which have different scattering properties and work functions, to provide an additional capability to tailor the performance of the RSME. Moreover, the use of multiple ILs of the same or different types can increase scattering/resistance in the path, thereby decreasing current flow since I=V/R. Multiple adjacent ILs can increase scattering, as can a thicker single IL. However, a thicker IL poses a scaling challenge in that, if the stack height increases, the aspect ratio for the pillar-etch increases. As a result, fabrication processes such as etching, cleaning and gap-fill become very challenging. It may be preferable to have two (or more) adjacent (or non-adjacent) thinner ILs (or similar or dissimilar properties/materials) instead of one thicker IL. For example, two ILs of 5 nm thickness may provide comparable scattering as a single thicker IL of, e.g., 20 nm.

IL1 and IL2 can be of different materials having different resistivity and crystal structure, for instance. They could also be of the same material, but may have different crystal structure or orientation or different grain-size, that would scatter the charge carriers differently. As another example, one IL can be composed of a fine-grained material or nanoparticles (that may be same or different than the other IL).

If RSL1 and RSL2 are of different materials, and IL1 and IL2 are of different materials and/or types of materials, the optimal placement of the ILs with respect to the RSLs would be material-dependent.

One possible implementation uses a pn-junction with IL1 being n+ Si and IL2 being p+ Si. IL1 and IL2 can each have a thickness of at least 20 nm, for instance. Another possible combination uses a metal such as TiN for one of the ILs and n+ or p+ Si for another of the ILs. See FIG. 10C, for example.

Figure 6E:
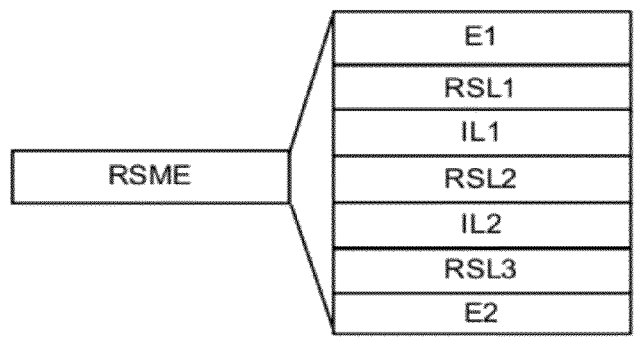
FIG. 6E depicts an example implementation of the RSME of FIG. 6A using a repeating RSL/IL pattern.

FIG. 6E depicts an example implementation of the RSME of FIG. 6A using a repeating RSL/IL pattern. The pattern or combination of an RSL and an IL is repeated at least twice. For example, RSL1 and a first IL (IL1) are provided, in addition to RSL2 and a second IL (IL2). The third RSL (RSL3) is adjacent to E2. The RSLs can be of the same or different types, and the ILs can be of the same or different types. An advantage of this embodiment is that multiple scattering layers can increase the amount of scattering/resistance in the path of the RSME. Additionally, the ability to use ILs and RSLs of different types provides an additional capability to tailor the performance of the RSME.

It is possible that the three RSLs have a multitude of characteristics (all the same, two the same and one different, all different, etc.) The use of more than one IL together with dissimilar RSLs will change the characteristics of the RSME and provide additional functionality to tune its performance.

When a voltage is applied across the RSME, it is divided across each RSL according to each RSLs resistance. In one possible implementation, two of the RSLs have the same I-V characteristic, and the other RSL has a different I-V characteristic, so that the two RSLs are both in a low resistance state when the other RSL is in a high resistance state, for instance, or the two RSLs are both in a high resistance state when the other RSL is in a low resistance state. Other variations are possible.

Figure 6F:
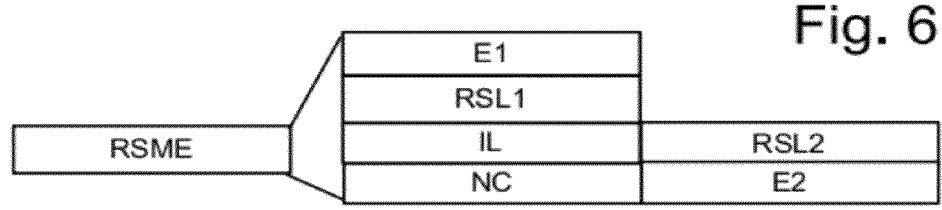
FIG. 6F depicts an example implementation of the RSME of FIG. 6A where each layer of the RSME extends horizontally and one or more of the layers are arranged end-to-end.

FIG. 6F depicts an example implementation of the RSME of FIG. 6A where each layer of the RSME extends horizontally and one or more of the layers are arranged end-to-end. Instead of a fully stacked (vertical) configuration, portions of the RSME are arranged laterally of (to the side of), or end-to-end with, other portions of the RSME. For example, E1, RSL1 and the IL are in one stack, while the RSL2 and E2 are in another stack, and the RSL2 is arranged side-to-side with the IL. Referring to FIG. 6A, the BLC and AL1 can be provided above E1, and the SE, AL2 and WLC can be provided below E2. A non-conductive (NC) layer can be provided under the IL, in one possible approach, and arranged side-to-side with E2. The portions/layers of the RSME are still arranged serially. In another possible implementation, E2 is on the side of the RSL2 rather than under it, so that three portions (IL, RSL2 and E2) are arranged end-to-end. Other variations are possible. Having portions of the RSME extend end-to-end or otherwise laterally of one another provides an additional capability to tailor the layout of the RSME. For example, the height of the RSME can be reduced. In one approach, the BLC and AL1 can be provided above E1, and the SE, AL2 and WLC can be provided below E2.

Figure 6G:
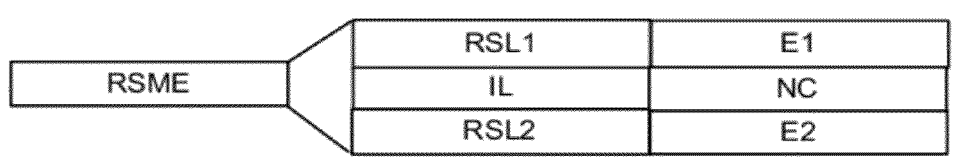
FIG. 6G depicts another example implementation of the RSME of FIG. 6A where each layer of the RSME extends horizontally and one or more of the layers are arranged end-to-end.

FIG. 6G depicts another example implementation of the RSME of FIG. 6A where each layer of the RSME extends horizontally and one or more of the layers are arranged end-to-end. Portions of the RSME are arranged laterally of, or end-to-end with, other portions of the RSME. RSL1, IL and RSL2 are in one stack, while E2, a non-conductive layer (NC) and E2 are in another, adjacent stack. E1 is arranged at the side of RSL1, end-to-end, and E2 is arranged at the side of RSL2, end-to-end. The portions can still be said to be arranged serially, e.g., in a serial path of E1, RSL1, IL, RSL2, E2. In another option, E1 extends laterally of and above RSL, for instance, and E2 extends laterally of and below RSL. In one approach, the BLC and AL1 can be provided above E1, and the SE, AL2 and WLC can be provided below E2.

Generally, it can be said that at least one E1, E2, IL, RSL1 and RSL2 can be arranged laterally, at least in part, of at least one other of E1, E2, IL, RSL1 and RSL2.

In FIGS. 6F and 6G, the lateral arrangement is end-to-end. For instance, RSL1 is arranged laterally, end-to-end, with E1 and/or RSL2 is arranged laterally, end-to-end, with E2. Also, the IL is arranged laterally, end-to-end, with at least one of RSL1 and RSL2.

Figure 6H:
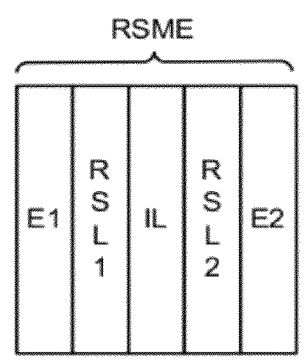
FIG. 6H depicts another example implementation of the RSME of FIG. 6A where each layer of the RSME extends vertically.

FIG. 6H depicts another example implementation of the RSME of FIG. 6A where each layer of the RSME extends vertically. Portions of the RSME are arranged laterally of, or face-to-face with, other portions of the RSME. The BLC can be above, below or to the side of E1, while the WLC is above, below or to the side of E2, for instance. The BLC and WLC are in a serial path with the RSME. Fabrication can involve n repeated cycles of a layer deposition and a layer spacer etch, with a final CMP step. For example, the E1 layer can be deposited, as a horizontally extending layer, then etched to form the vertically extending portion shown. The RSL1 layer can then be deposited, as a horizontally extending layer, then etched to form the vertically extending portion shown. This is repeated for each of the IL, RSL2 and E2 portions. In one approach, the AU and BLC (FIG. 6A) extend vertically upward from E1 and the SE, AL2 and WLC extend vertically downward from E2.

Two or more of the layers can be arranged laterally of one another, face-to-face. For example, RSL1, the IL and RSL2 can be each arranged laterally with one another, face-to-face.

Also, E1, RSL1, the IL, RSL2 and E2 can be each arranged laterally with one another, face-to-face.

The RSME portions of, e.g., FIGS. 6D-6H have a rectangular cross-section, compared to the L-shaped cross-section of FIG. 6I and the U-shaped cross-section of FIG. 6J.

FIG. 6I depicts another example implementation of the RSME of FIG. 6A which includes L-shaped portions for RSL1, IL, RSL2 and E2. For example, assume the cross-sectional view is in a vertical or horizontal plane with perpendicular axes x and y. In the x direction, E1 has a thickness t1$x$, RSL1 has a thickness t2$x$, IL has a thickness t3$x$, RSL2 has a thickness t4$x$ and E2 has a thickness t5$x$. In the y direction, E1 has a thickness t1$y$, RSL1 has a thickness t2$y$, IL has a thickness t3$y$, RSL2 has a thickness toy and E2 has a thickness t5$y$. The x-direction thickness can be the same or different than the corresponding y-direction thickness for each portion. The order of the layers could be reversed so that they extend in the order E2, RSL2, IL, RSL1, E1 instead of E1, RSL1, IL, RSL2, E2. The BLC can be above, below or to the side of E1, while the WLC is above, below or to the side of E2, for instance. The BLC and WLC are in a serial path with the RSME. By providing L-shaped portions, conductive filaments can form in a set process of the RSME, where the filaments extend in both x- and y-directions. Since there is a relatively large area over which filaments an extend, their creation is potentially facilitated. The implementation pictured can be rotated by 90 or 180 degrees as well.

In this approach, portions of the layers are arranged laterally of one another, similar to the concept of FIGS. 6F-6H, but the layers are in nested L-shapes, having two portions extending at a right angle from one another. For example, the L-shaped RSL2 is nested within the L-shaped E2, the L-shaped IL is nested within the L-shaped RSL2, and the L-shaped RSL1 is nested within the L-shaped IL. E1 is nested within the L-shaped RSL1 but is not itself L-shaped in this example. Each portion can be the same or different in one or more dimensions.

Here, it can be said that at least one E1, E2, IL, RSL1 and RSL2 is arranged laterally, at least in part, of at least one other of E1, E2, IL, RSL1 and RSL2.

FIG. 6J depicts another example implementation of the RSME of FIG. 6A which includes U-shaped portions for RSL1, IL, RSL2 and E2. For example, assume the cross-sectional view is in a vertical or horizontal plane with perpendicular axes x and y. In the x direction, E1 has a thickness t1$x$, RSL1 has thickness t2$xa$ and t2$xb$, IL has thickness t3$xa$ and t3$xb$, RSL2 has thickness t4$xa$ and t4$xb$, and E2 has thicknesses t5$xa$ and t5$xb$. In the y direction, E1 has a thickness t1$y$, RSL1 has a thickness t2$y$, IL has a thickness t3$y$, RSL2 has a thickness toy, and E2 has a thickness t5$y$. The xa thicknesses can be the same or different than the corresponding xb thicknesses. Also, the xy thicknesses can be the same or different than the corresponding xa and/or xb thicknesses. The order of the layers could be reversed so that they extend in the order E2, RSL2, IL, RSL1, E1 instead of E1, RSL1, IL, RSL2, E2. The BLC can be above, below or to the side of E1, while the WLC is above, below or to the side of E2, for instance. The BLC and WLC are in a serial path with the RSME. By providing U-shaped portions, conductive filaments can form in a set process of the RSME, where the filaments extend in the x-direction on either side of E1 and in the y-direction. The implementation pictured can be rotated by 90 or 180 degrees as well.

In this approach, portions of the layers are arranged laterally of one another, similar to the concept of FIGS. 6F-6H, but the layers are in nested U-shapes, having two parallel portions extending at a right angle to a base portion. For example, the U-shaped RSL2 is nested within the U-shaped E2, the U-shaped IL is nested within the U-shaped RSL2, and the U-shaped RSL1 is nested within the U-shaped IL. E1 is nested within the U-shaped RSL1 but is not itself U-shaped in this example. Each portion can be the same or different in one or more dimensions.

Generally, any of the vertical stack embodiments can be adapted to an L- or U-shaped embodiment.

Here, it can be said that at least one E1, E2, IL, RSL1 and RSL2 is arranged laterally, at least in part, of at least one other of E1, E2, IL, RSL1 and RSL2.

FIG. 6K1 depicts an example implementation of the RSME of FIG. 6A which uses one RSL and one breakdown layer, below the RSL. RSL1 is used as discussed previously, but a breakdown layer is used between the IL and E2 in place of a RSL2. The breakdown layer is a material which does not have a resistance-switching behavior, and can provide a baffle layer between the IL and E2. A material with a resistance-switching behavior can typically be switched repeatedly between starting and ending resistance states. In contrast, a breakdown material is a material which has been broken down by the application of a relatively high voltage and/or current from an initial state, with an associated I-V characteristic, to a breakdown state, with another associated I-V characteristic, and generally can transition only once from the initial state to the breakdown state. A resistance-switching material can be considered to be a many-times programmable material while a breakdown material can be considered to be a one-time programmable material. Here, programmable can include having the ability to change a resistance state. Although a resistance-switching material can be paired with a fuse or antifuse to form a one-time programmable, the resistance-switching material itself remains many-times programmable. A one-time programmable material is useful, e.g., in setting a unique identifier for a chip, or setting operating parameters such as a clock or voltage parameter.

Example materials for the breakdown layer (and an associated range of resistivity $\rho$ for some examples before breakdown, in the initial state) include: SiN ($\rho$=1014 $\Omega$-cm for Si3N4 at 25 C), SiO2 ($\rho$=1014-1016 $\Omega$-cm at 25 C), SiC ($\rho$=102-106 $\Omega$-cm), SiCN, SiON or any layer which can be broken down, e.g., changed from a higher resistance, generally non-conductive state to a lower resistance, conductive state, but is not generally known as a reversible resistance-switching material itself. The breakdown layer can be a material which maintains a resistance of at least about 1-10 M$\Omega$ while being conductive in the breakdown state. The resistance in the initial state is typically one or more orders of magnitude higher than in the breakdown state. If the resistance of the layer is too low, it is less effective as a protective layer. The resistance of the breakdown layer material is R=$\rho$1/A. where 1 is the length of the material and A is the cross-sectional area. The length is the breakdown layer thickness. Knowing $\rho$ and R, size of the material can be chosen using A and 1.

The breakdown layer can be a one-time-programmable breakdown layer. Such a breakdown layer can be considered to be a non-switchable breakdown layer or a one-time switchable breakdown layer because the breakdown process is irreversible. That is, once the breakdown layer is broken down from the starting non-conductive state, the breakdown layer remains in the broken down state and cannot return to the starting state. In contrast, in some cases, a unipolar or bipolar cell can be operated in a one-time-programmable mode but is usually not physically broken down while maintaining a resistance of at least about 1-10 M$\Omega$ while being conductive.

One or more RSLs can be configured in a breakdown state such as by applying a relatively high voltage or current to the RSL. For example, an applied voltage may be significantly higher than the threshold voltage of the material. The breakdown process may be due in part to thermal effects. See FIGS. 6K2 and 6K3 for further details.

FIG. 6K2 is a graph showing a transition from an initial state to a breakdown state for a breakdown layer. The transition can be achieved by applying a current or voltage across the breakdown layer for a period of time which can be extended, e.g., several minutes. At a time tb, a current through the breakdown layer increases step-wise (since the resistance decreases step wise) when a breakdown event occurs. In some cases, multiple breakdown events can occur. For an applied voltage, the voltage applied across the RSME will be divided across the breakdown layer and RSL1 in proportion to their respective resistances. RSL1 can be configured in a low resistance state so that essentially all of the voltage is applied across the breakdown layer.

FIG. 6K3 is a graph showing an I-V characteristic of a breakdown layer in an initial state (solid line) and in a breakdown state (dashed line). For a given voltage, the current is higher (and the resistance is lower) in the breakdown state. An RSME in which a breakdown layer is in the initial state can be distinguished from an RSME in which the breakdown layer is in the breakdown state, so that a bit of data can be stored according to the state of the breakdown layer. The RSL can further be modulated between two states to store a bit of data. By applying appropriate read voltages, the states of the breakdown layer and RSL can be determined.

FIG. 6L depicts an example implementation of the RSME of FIG. 6A which uses one reversible RSL (RSL1) and one breakdown RSL, above RSL1. This is an alternative to the configuration of FIG. 6K1.

FIG. 6M depicts an example implementation of the RSME of FIG. 6A, in which the resistance-switching layers (RSLs) are of different types. RSL1 and RSL2 can be made of different types of material which have different switching characteristics, such as to allow more than one bit of data to be stored by the RSME. Example materials for RSL1 and RSL2 include: TiO2, NiOx, HfSiON, HfOx, ZrOx and ZrSiON.

FIG. 7A depicts an example implementation of the steering element (SE) of the memory cell FIG. 6A as a Si diode. The SE is a Si diode having an n-type region, an intrinsic (i) region and a p-type region. As mentioned, a SE selectively limits the voltage across, and/or the current flow through, the RSME. The SE allows a memory cell to be written to, and/or read from, without affecting the state of other memory cells in an array.

FIG. 7B depicts an example implementation of the steering element (SE) of the memory cell of FIG. 6A as a punch-through diode. The punch-through diode includes an n+ region, p− region and n+ region. A punch-through diode is operable in both directions. In particular, a punch-through diode allows bipolar operation of a cross-point memory array, and may have a symmetrical non-linear current/voltage relationship. The punch-through diode has a high current at high bias for selected cells and a low leakage current at low bias for unselected cells. Therefore, it is compatible with bipolar switching in cross-point memory arrays having resistive switching elements. The punch-through diode may be a n+/p−/n+ device or a p+/n−/p+ device.

While example implementations involving a memory cell having a diode as a steering element are provided, the techniques provided herein are generally applicable to other devices and steering elements, including a transistor, a punch-through transistor, a punch-through diode, a PN diode, NP diode, a PIN diode, Zener diode, an NPN diode, PNP diode, a Schottky diode, an MIN diode, a carbon silicone diode, a transistor layout and so forth.

In another approach, the steering element could be a transistor, such as a bipolar or CMOS transistor.

Moreover, in some configurations a steering element need not be used.

FIG. 8 depicts an example implementation of the memory cell of FIG. 6A connected between a bit line and a word line. The bit line contact (BLC) is W or NiSi, the first adhesive layer (AL1) is TiN, the first electrode (E1) is n+ Si, the RSL1 is MeOx, such as HfO2, the IL is TiN, RSL2 is MeOx such as HfO2, an additional adhesive layer (AL) is provided for the Si diode which is the steering element (SE), the second adhesive layer (AL2) is TiN and the word line contact (WLC) is W or NiSi. Additionally, one or more cap layers can be provided using a material selected from the group consisting of TiOx, Al2O3, ZrOx, LaOx and YOx. Generally, the cap layer can be a metal oxide. In this example, the cap layers are adjacent to the IL and the RSLs. Specifically, one cap layer (Cap1) is between RSL1 and IL, as well as adjacent to each of RSL1 and IL, and another cap layer (Cap2) is between IL and RSL2, as well as adjacent to IL and RSL2. A cap layer may serve as a source or getter of oxygen, from a perspective of the MeOx, which facilitates switching in an RSL. When acting as a getter of oxygen, the cap layer can assist in providing oxygen to an IL/electrode from an MeOx RSL, for instance. When acting as a source of oxygen, the cap layer can assist in providing oxygen to an MeOx RSL from an IL/electrode, for instance. A getter is a location in which a material such as oxygen is moved to. Gettering is a process in which the material such as oxygen is moved to the getter location. The getter location is an alternative location where the oxygen will prefer to reside due to the oxygen being in a lower energy state.

The RSME is made up of the layers extending from E1 to E2. In an example implementation, E1 and E2 each have a thickness or height of about 1-3 nm, or about 1-10 nm, for instance, and the IL may have a thickness or height of about 1-5 nm, or about 1-10 nm, for instance. Thus, the overall thickness of the RSME can be very small.

Figure 9A:
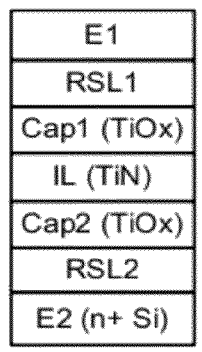
FIG. 9A depicts an embodiment of the RSME of FIG. 6C in which E1 is made of Co, CoSi, n+ Si, p+ Si or p+ SiC, and E2 is made of n+ Si.

FIG. 9A depicts an embodiment of the RSME of FIG. 6C in which E1 is made of Co, CoSi, n+ Si, p+ Si or p+ SiC, and E2 is made of n+ Si. The order of layers, from top to bottom, is: E1, RSL1, Cap1, IL, Cap2, RSL2, E2. The RSME also includes a RSL1 such as MeOx, an IL such as TiN, a RSL2 such as MeOx, and a second electrode (E2) such as n+ Si. Additionally, cap layers such as TiOx are provided between RSL1 and IL (Cap1), and between IL and RSL2 (Cap2). This embodiment can provide an asymmetric structure when E1 and E2 are made of different materials. For example, E1 made of Cobalt (Co) is desirable because it has a relatively high work function of about −5 eV, which is close to the work function of Ni, and can result in better switching. This is due to a higher barrier height which can be a benefit of having a high work function. In another approach, E1 made of Cobalt Silicon (CoSi) is also desirable because it also has a relatively high work function. In another approach, E1 is made of n+ Si (polysilicon), which provides the benefit of a high work function (about 4.1 to 4.15 eV) as well as being oxidation-resistant. Other suitable materials include p+ Si (polysilicon), having a work function of about 5.1 to 5.2 eV, and p+ Silicon Carbide (SiC), with a very high work function of about 6.6 to 6.9 eV due to a high energy gap. See FIG. 9C. For example, the energy gap is about 3.23 eV for the (4H polytype), and about 3.05 eV for the 6H alpha polytype. These energy gaps are significantly higher than that of Si, for instance, for which the energy gap is about 1.1 eV.

In one embodiment, p+ SiC can be deposited and then doped, e.g. by ion implantation, by a dopant such as B, Al, Be or Ga, for instance, to a concentration of about 10E19 to 10E20 atoms per cubic centimeter. This is an example of in situ doping. SiC is inert chemically and therefore resistant to oxidation. It practically does not melt due to a sublimation temperature of 2700 C, and has a high thermal conductivity of 3.6 to 4.9 W/(cm*K) (compared to 1.49 W(cm*K) for Si) which may be beneficial for memory cell operation due to high current densities.

Figure 9B:
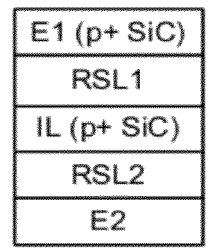
FIG. 9B depicts an embodiment of the RSME of FIG. 6C in which E1 and the IL are made of p+ SiC, and E2 is made of n+ Si, n+ SiC or p+ SiC.

FIG. 9B depicts an embodiment of the RSME of FIG. 6C in which E1 and the IL are made of p+ SiC, and E2 is made of n+ Si, n+ SiC or p+ SiC. The order of layers, from top to bottom, is: E1 (e.g., p+ SiC), RSL1, IL (e.g., p+ SiC), RSL2, E2. The high work function of E1 and the IL may contribute to cell current reduction, where the IL serves as a scattering layer. Moreover, by modulating the doping of the IL, it is possible to modulate the layer resistance to increase scattering and to reduce current. With increased doping, the IL is less resistive, so that there is less depletion width and less voltage drop on the depletion layer.

Furthermore, E2 can be made of n+ Si, n+ SiC or p+ SiC. When E2 is made of n+ SiC, there is a thinner SiO2 layer formed between E2 and RSL2 during fabrication. Operating voltages are reduced since a voltage drop across a SiO2 layer is avoided. In contrast, in the case of an n+ Si bottom electrode, a thicker SiO2 layer may be formed between E2 and RSL2. E2 can be made of p+ SiC as an alternative to n+ SiC. RSL1 and RSL2 can be MeOx, for instance.

In one approach, the IL can be made of nano-particles such as by providing the IL as a nanocrystalline SiC film. See, e.g., W. Yu et al., discussed below.

Figure 9C:
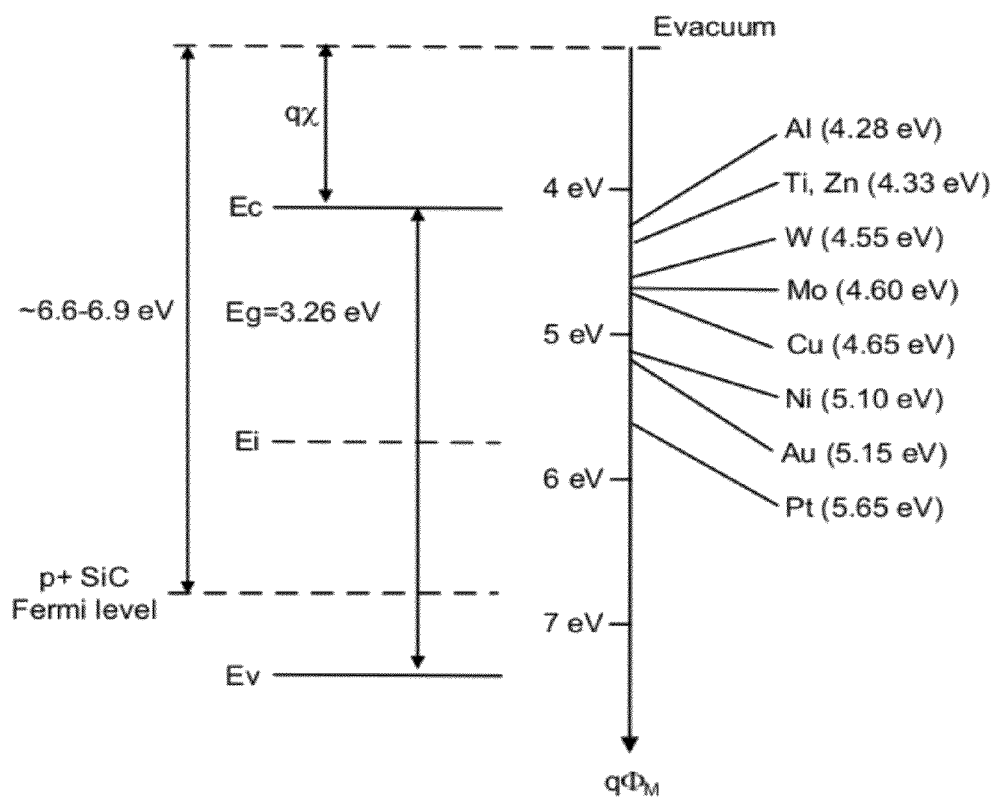
FIG. 9C is a diagram depicting the Fermi level of p+ SiC relative to other materials.

FIG. 9C is a diagram depicting the Fermi level of p+ SiC relative to other materials. It was mentioned above that p+ SiC has a very high work function of about 6.6 to 6.9 eV due to a high energy gap. To illustrate this fact, an energy diagram is provided for 4H—SiC which depicts the energy level in a vacuum (Evacuum), the energy level for the conductance band (Ec), the intrinsic energy level (Ei) and the energy level for the valence band (Ev). The diagram is from T. Ayalew, Dissertation, "SiC Semiconductor Devices Technology, Modeling And Simulation," Institute for Microelectronics, Vienna, Austria, January 2004, incorporated herein by reference. Other example materials and their Fermi levels are also depicted: Al (4.28 eV), Ti, Zn (4.33 eV), W (4.55 eV), Mo (4.60 eV), Cu (4.65 eV), Ni (5.10 eV), Au (5.15 eV) and Pt (5.65 eV). As mentioned, p+ SiC has a relatively high work function. In particular, the Fermi level will be close to the valence band energy level.

In practice, undoped SiC has a work function of about 4.5-4.8 eV, or about 4.9 eV if covered with oxygen. However, for p+ SiC, the Fermi level will be closer to the valence band, so that the work function is higher. Depending on level of p+ doping and the SiC poly type (energy band gap Eg=3.23-3.26 eV for 4H—SiC or Eg=3.05 eV for 6H—SiC), the work function $q\phi M$ can be about 6.6-6.9 eV as shown.

The SiC can be applied by deposition at an appropriate temperature which is not excessively high. Various techniques are available for relatively low temperature deposition. For example, deposition at 750° C. has been described in I. Golecki et al., "Single-crystalline, epitaxial cubic SiC films grown on (100) Si at 750° C. by chemical vapor deposition," Applied Physics Letter, vol. 60, issue 14, pp. 1703-1705, April 1992, incorporated herein by reference. In this approach, SiC films were grown by low-pressure chemical vapor deposition, using methylsilane (SiCH3H3), a single precursor with a Si:C ratio of 1:1, and H2.

In another example approach, SiC has been deposited at low temperatures using molecular beam epitaxy, such as described in A. Fissel et al. "Low-temperature growth of SiC thin films on Si and 6H—SiC by solid-source molecular beam epitaxy," Applied Physics Letter, vol. 66, issue 23, pp. 3182-3184, June 1995, incorporated herein by reference. This approach involved epitaxial growth of stoichiometric SiC on Si(111) and 2°-5° off-oriented 6H—SiC(0001) substrates at low temperatures of about 800-1000° C. using solid-source molecular beam epitaxy controlled by a quadrupole mass spectrometry based flux meter. The films were obtained on Si-stabilized surfaces showing (3×3) and (2×2) superstructures in the case of SiC(0001). The reflection high-energy diffraction (RHEED) patterns and damped RHEED-oscillations during the growth on 6H—SiC(0001) at T>900° C. indicate that two-dimensional nucleation on terraces is the dominant growth process.

Another example low temperature approach for depositing SiC is described in W. Yu et al., "Low temperature deposition of hydrogenated nanocrystalline SiC films by helicon wave plasma enhanced chemical vapor deposition," J. Vac. Sci. Technol. A 28(5), American Vacuum Society, p. 1234-1239, Sep. 3, 2010, incorporated herein by reference. Here, hydrogenated nanocrystalline silicon carbide (nc-SiC:H) films were deposited by using helicon wave plasma enhanced chemical vapor deposition technique at low substrate temperature. The influences of radio frequency (rf) power and substrate temperature on the properties of the deposited nc-SiC:H films were investigated. It was found that hydrogenated amorphous SiC films were fabricated at a low rf power, while the nc-SiC:H films with a microstructure of SiC nanocrystals embedded in amorphous counterpart could be deposited when the rf power is 400 W or more. The plasma transition from the capacitive dominated discharge to the helicon wave discharge with high plasma intensity influences the film microstructure and surface morphology. The analysis of the films deposited at various substrate temperatures reveals that the onset of SiC crystallization occurs at the substrate temperature as low as 150° C.

FIG. 10A depicts an embodiment of the RSME of FIG. 6C describing alternative IL materials. The order of layers, from top to bottom, is: E1 (e.g., TiN), E1 (e.g., n+ Si), RSL1 (e.g., MeOx), cap1 (e.g., TiOx), IL (e.g., TiN), cap2 (e.g., TiOx), RSL2 (e.g., MeOx), E2 (e.g., n+ Si). In one implementation, E1 includes a combination of a TiN layer above an n+ Si layer. Additionally, cap layers such as TiOx are provided between RSL1 and IL, and between IL and RSL2. A further Ti contact (not shown) can be above E1. As an alternative, the IL can be selected from the group consisting of Al, Zr, La, Y, Ti, TiAlN, TixNy and TiAl alloy. These are favorable coupling layers that can enable lower V and I cell operation. This embodiment provides a mirror structure with respect to the IL since a cap layer, an RSL and an electrode extend from both sides of the IL, in the same order and optionally of the same material (e.g., same cap layer material, e.g., TiOx, above and below the IL, followed by the same RSL material, e.g., MeOx, above and below the IL, followed by the same electrode material, e.g., n+ Si above and below the IL).

FIG. 10B depicts an embodiment of the RSME of FIG. 6C in an inverted, mirror stack configuration. The order of layers, from top to bottom, is: E1 (e.g., TiN), cap1 (e.g., TiOx), RSL1 (e.g., MeOx), IL (e.g., n+ Si), RSL2 (e.g., MeOx), cap2 (e.g., TiOx), E2 (e.g., TiN). In one approach, E1 is made of TiN, the IL is made of n+ Si and E2 is made of TiN. The IL layer can be n+ Si with a 10-100 nm thickness, for instance. This embodiment is an inverted mirror configuration which provides an inverted stack, relative to the embodiment of FIG.

10A, since the n+ Si layer is now the IL rather than the E1 or E2 layer, and the cap layer is between the RSL and electrode layers (cap1 between RSL1 and E1; cap2 between RSL2 and E2) instead of between the RSL and IL. Specifically, an RSL, a cap layer and an electrode extend from both sides of the IL, in the same order and optionally of the same material (e.g., same RSL material, e.g., MeOx, above and below the IL, followed by the same cap layer material, e.g., TiOx, above and below the IL, followed by the same electrode material, e.g., TiN above and below the IL).

FIG. 10C depicts an embodiment of the RSME of FIG. 6C in an asymmetric, upright stack configuration. The order of layers, from top to bottom, is: E1 (e.g., TiN), cap1 (e.g., TiOx), RSL1 (e.g., MeOx), IL (e.g., n+ Si), IL (e.g., TiN), cap2 (e.g., TiOx), RSL2 (e.g., MeOx), E2 (e.g., n+ Si). In one approach, the IL is a combination of a layer of n+ Si (e.g., 10-100 nm thickness) above a layer of TiN. Cap layers such as TiOx are provided above and adjacent to the MeOx layers. For instance, cap1 is above and adjacent to RSL1, and cap2 is above and adjacent to RSL2. The configuration is asymmetric and in an upright stack, with all layers arranged vertically. A mirror configuration is not used. The configuration is asymmetric because the layers which extend above the IL (n+ Si) include RSL1 followed by cap1, while the layers which extend below the IL (TiN) include cap2 followed by RSL2. The configuration is upright because cap1 is above RSL1 and cap2 is above RSL2.

FIG. 10D depicts an embodiment of the RSME of FIG. 6A in an asymmetric, inverted stack configuration. The order of layers, from top to bottom, is: E1 (e.g., TiN), E1 (e.g., n+ Si), RSL1 (e.g., MeOx), cap1 (e.g., TiOx), IL (e.g., TiN), IL (e.g., n+ Si), RSL2 (e.g., MeOx), cap2 (e.g., TiOx), E2 (e.g., TiN). A mirror configuration is not used. The configuration is asymmetric because, above the ILs, a cap is followed by an RSL, but below the ILs, an RSL is followed by a cap. The configuration is inverted relative to the embodiment of FIG. 10C, since the n+ Si layer is now the E1 layer rather than the E2 layer, and the TiN layer is now the E2 layer rather than the lower E1 layer. The IL layer can be a combination of n+ Si with a 10-100 nm thickness, for instance, and TiN, in a manner reverse to that of FIG. 10C.

Other embodiments of the IL use one or more of metals such as a metal selected from the group consisting of TiAlN, WN, W, NiSi, CoSi and C.

FIG. 11A depicts an embodiment of the RSME of FIG. 6C showing the growth of SiOx when E2 is n+ Si. The order of layers, from top to bottom, is: E1 (e.g., n+ Si), RSL1 (e.g., MeOx), cap1 (e.g., TiOx), IL (e.g., TiN), cap2 (e.g., TiOx), RSL2 (e.g., MeOx), SiOx, E2 (e.g., n+ Si). There can be a large variation of forming voltage in the RSLs due to thickness variations of a SiOx layer which forms between RSL2 and E2 when E2 is made of Si and RSL2 comprises a metal oxide. For example, when RSL2 is metal oxide and is deposited directly on, and is in contact with an E2 which contains n+ Si, a top portion of the n+ Si layer is oxidized, resulting in a layer of SiOx. In an example implementation, a 1-2 nm layer of SiOx may form between RSL2 and E2, where the RSLs each are made of 2-4 nm of a MeOx such as HfO2 and E2 is made of n+ Si. Alternatively, E1 and/or E2 can be made of p+ Si, tungsten nitride (e.g., WN, WN2, N2W3), TiN or SiGe.

FIG. 11B depicts an embodiment of the RSME of FIG. 6C showing the growth of a low band gap material such as TiOx when E2 is TiN. The order of layers, from top to bottom, is: E1 (e.g., n+ Si), RSL1 (e.g., MeOx), cap1 (e.g., TiOx), IL (e.g., TiN), cap2 (e.g., TiOx), RSL2 (e.g., MeOx), Ti/TiOx, E2 (e.g., TiN). To prevent SiOx formation, we can replace the n+ Si layer of E2 with a material such as Ti deposited on a TiN electrode. The Ti layer can be considered to be part of the electrode. Specifically, during the deposition of a MeOx layer (RSL2) such as HfOx above the Ti layer, a top portion of the Ti layer (~1-5 nm) is oxidized and is converted to a layer of TiOx. The thickness of the TiOx layer depends on the temperature of the MeOx deposition. In this case, the second electrode (E2) comprises a layer of Ti on a layer of TiN, the second resistance-switching layer (RSL2) comprises MeOx, and a layer of TiOx is formed on the layer of Ti, and is in contact with the second resistance-switching layer.

The band gap of Ti/TiOx is much lower than that of SiOx, so large variations in the forming voltage can be avoided. E1 can be n+ Si or a high work function material such as Ni or NiSi. In an example implementation, the RSLs each are made of 2-4 nm of a MeOx such as HfO2.

Furthermore, a high work function material can be used for E1 to reduce operating current. For example, Ni with a work function of 5.1 eV may be used. NiSi is another alternative. In comparison, the work function of a TiN is about 4.2-4.7 eV, and the work function of n+ Si is about 4.1-4.3 eV.

FIG. 11C depicts an embodiment of the RSME of FIG. 6C in which the RSLs are made of a doped metal oxide to reduce operating voltage. The order of layers, from top to bottom, is: E1 (e.g., n+ Si), RSL1 (e.g., doped MeOx), cap1 (e.g., TiOx), IL (e.g., TiN), cap2 (e.g., TiOx), RSL2 (e.g., doped MeOx), SiOx, E2 (e.g., n+ Si). For example, a heavily doped MeOx layer such as HfOx or HfSiON can be used. Doping of the MeOx can be achieved by implanting or diffusing a dopant such as Ti, Al or Zr into the MeOx layer at a concentration of about 0.01-5%. Test results indicate that these dopants provide good properties. Ion implantation or in-situ atomic layer deposition (ALD) can be used, for instance. In an example implementation, the RSLs each are made of 2-4 nm of a MeOx such as HfO2 and a 1-2 nm layer of SiOx is formed on E2, which is n+ Si.

FIG. 11D depicts an embodiment of the RSME of FIG. 11C in which E2 is TiN instead of n+ Si. The order of layers, from top to bottom, is: E1 (e.g., n+ Si), RSL1 (e.g., doped MeOx), cap1 (e.g., TiOx), IL (e.g., TiN), cap2 (e.g., TiOx), RSL2 (e.g., doped MeOx), Ti/TiOx, E2 (e.g., TiN). In an example implementation, the RSLs each are made of 2-4 nm of a MeOx such as HfO2 and a layer of Ti/TiOx is formed on E2.

FIG. 11E depicts an embodiment of the RSME of FIG. 6C in an asymmetric mirror cell configuration, where the RSLs are made of different materials. The order of layers, from top to bottom, is: E1 (e.g., n+ Si), RSL1 (e.g., type A MeOx), cap1 (e.g., TiOx), IL (e.g., TiN), cap2 (e.g., TiOx), RSL2 (e.g., type B MeOx), SiOx, E2 (e.g., n+ Si). It can be problematic to have the RSME switched in both positive and negative directions, so that it might be preferred to switch in a certain polarity. One possible solution is to use different materials for RSL1 and RSL2. For example, RSL1 can be of type "A" while RSL2 is of type "B". For instance, two different types of MeOx could be used to control switching polarity, such that RSL1 is of MeOx type "A" while RSL2 is of MeOx type "B". Examples of MeOx include AlOx, TiOx, NiOx, ZrOx, CuOx, WOx, such that the RSL1 can use one of these materials and the RSL2 can use another of these materials. The RSL materials can be selected to obtain a desired switching performance, where switching occurs at desired conditions such as specified I-V conditions. E1 and E2 may be made of n+ Si or TiN, for example.

FIG. 11F depicts an embodiment of the RSME of FIG. 6C in an asymmetric mirror cell configuration which is SiOx-free. The order of layers, from top to bottom, is: E1 (e.g., n+ Si), RSL1 (e.g., type A MeOx), cap1 (e.g., TiOx), IL (e.g., TiN), cap2 (e.g., TiOx), RSL2 (e.g., type B MeOx), Ti/TiOx, E2 (e.g., TiN). In this case, the second electrode (E2) is a material such as TiN instead of n+ Si so that there is no SiO2 layer is formed during fabrication. As discussed in connection with FIG. 11B, Ti is deposited on a TiN electrode and, during the deposition of a MeOx layer such as HfOx above the Ti, a top portion of the Ti layer is oxidized, resulting in a layer of TiOx.

Figure 12:
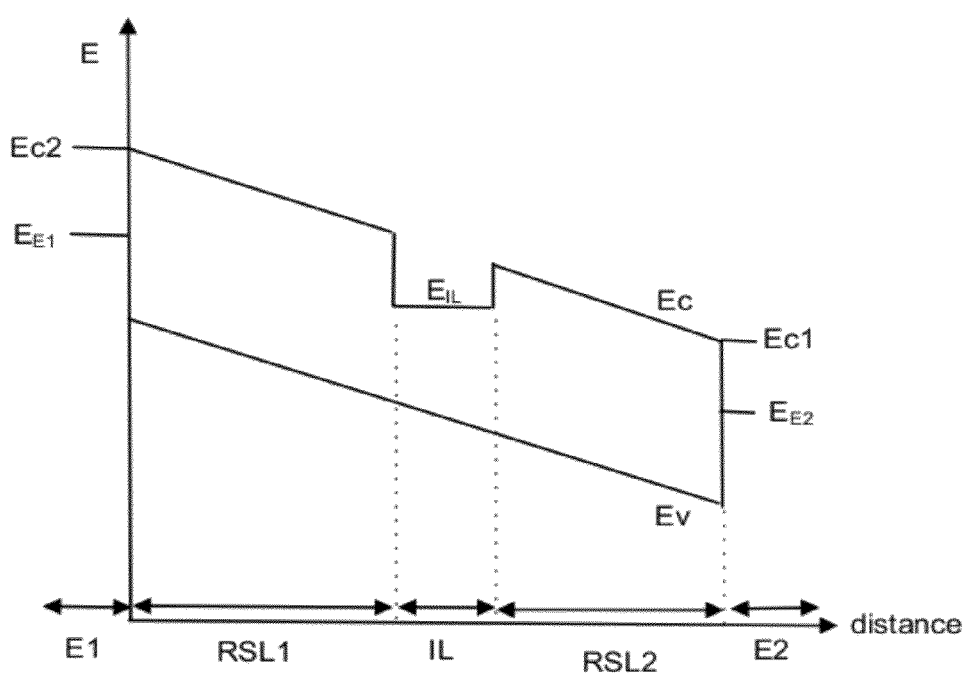
FIG. 12 depicts an energy diagram of the RSME of FIG. 6C.

FIG. 12 depicts an energy diagram of the RSME of FIG. 6C. The horizontal axis depicts a distance along the RSME, from E1 to E2, while the vertical axis denotes an energy level. Ec is the conductance band, which ranges from a high level of Ec2 at the junction between E1 and RSL1, to a low value of Ec1 at the junction between E2 and RSL2. EE1 is the energy level of E1, EIL is the energy of the IL, and EE2 is the energy level of E2. Ev is the valence band. A notch in the conductance band represents a lower energy level which is realized at the IL, as described below.

A MRS relies on ionic conductance as a switching mechanism. In ionic conductors, the current is transported by ions moving around, as well as by movement of electrons and holes. For example, electrical current transport via ions, or ions and electrons/holes, is found in conducting liquids called electrolytes, and ion conducting solids, also called solid electrolytes. Moreover, ionic conductivity is important for many products, such as Type I and type II batteries (i.e., regular and rechargeable), fuel cells, electrochromic windows and displays, solid state sensors, especially for reactive gases, conductive-bridge switching and bipolar MeOx switching as described herein.

In contrast to purely electronic current transport, there is a chemical reaction (e.g., the system changes with time) tied to the current flow that takes place wherever the ionic current is converted to an electronic current, i.e., the contacts or electrodes. This is a significant difference compared to current flow with electrons (or holes), where no chemical reaction is needed for current flow across contacts. Bipolar MeOx switching tries to move oxygen vacancies in the MeOx to create a metallic filament, thereby storing the oxygen at the interface. Electronic conduction can be provided by mechanisms including: Fowler-Nordheim, Schottky, Space Charge Limited Current (SCLC), SCLC and Poole-Frenkel (PF) together, PF and Hill's Law. Ionic conduction includes conductivity, diffusion and field types.

Typical ionic conductivity values are relatively low and are dependent on a supply of oxygen from air of an electrode, temperature and electric field (exponentially).

Figure 13:
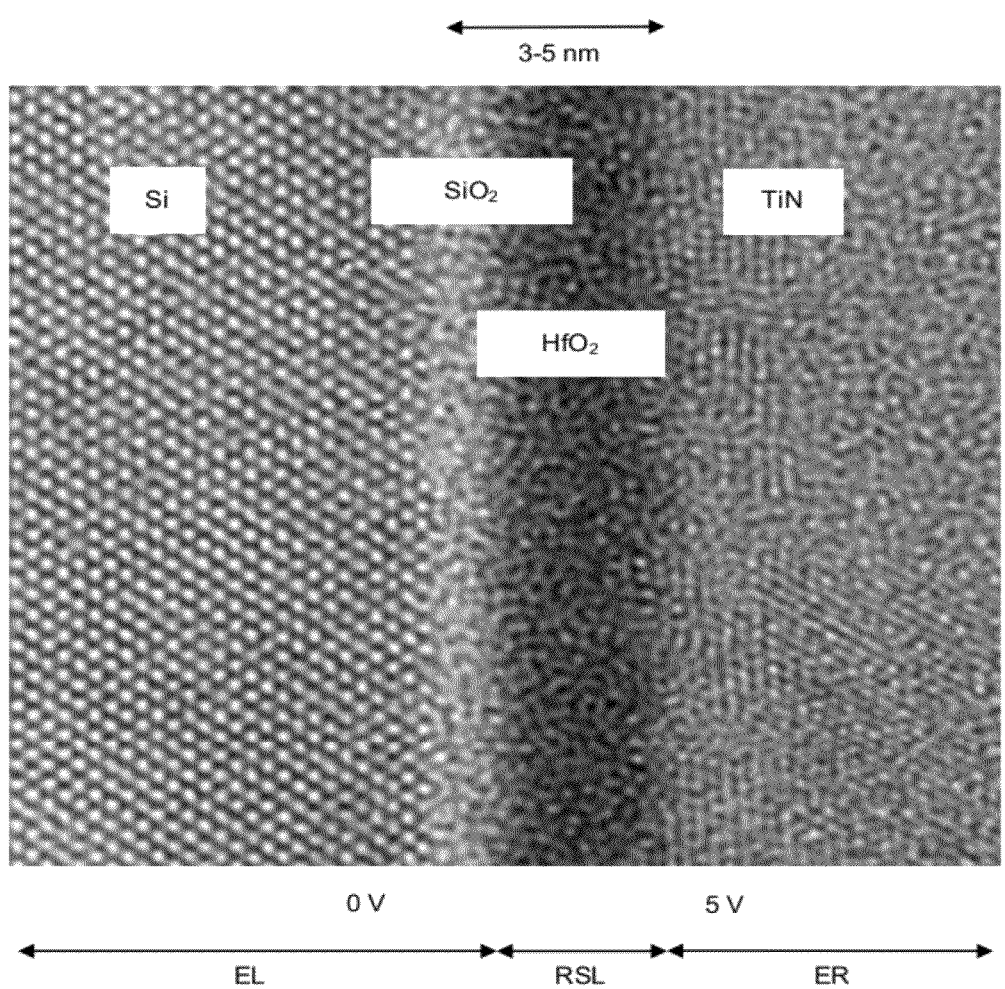
FIG. 13 depicts application of a high electric field in a set process of a RSL.

FIG. 13 depicts application of a high electric field in a set process of a RSL. This scanning electron microscope image depicts a left hand electrode (EL) of n+ Si including a grown layer of SiO2, a RSL of HfO2 and a right hand electrode (ER) of TiN. A high electric field can be applied to move oxygen into a RSL of MeOx such as HfO2. Here, in an example implementation, a high electric field is present in a region of HfO2 which is 3-5 nm wide. Using the 5 nm value, the electric field is therefore 5 V/5 nm=10 MV/cm.

FIGS. 14A-14D depict different stages in the formation of a conductive filament in a set process of a RSL. The normally occurring breakdown of a single MeOX film is depicted. The left-hand electrode (EL) is set at 0 V as a grounded electrode, the middle region represents a RSL such as HfO2, and the right-hand region represents a driven right-hand electrode (ER) at 5V, for instance. The 5 V is an approximation for the case that there is no current limiter (resistor). These figures indicate the expected behavior of a RSME having two or more or such RSLs. Recall that, in an RSME, the right hand electrode would receive a coupling voltage and is not directly driven.

In a set or forming process, the RSL is initially non-conductive. An open or white circle denotes an oxygen ion, and a closed or black circle denotes metal. The high electric field couples to the negatively charged oxygen ions, extracting the oxygen ions from the HfO2 and attracting them to the ER. After the condition of FIG. 14A, the condition of FIG. 14B exists in which some of the oxygen ions have been extracted and stored at the ER (as represented by the open circles at the ER), and the region of the HfO2 from which the oxygen was extracted becomes metallic (as represented by the closed circles). This process continues so that after the condition of FIG. 14B, the condition of FIG. 14C is reached, in which additional oxygen ions have been extracted and stored at the intermediate electrode, and additional regions of the HfO2 from which the oxygen was extracted become metallic. Finally, after the condition of FIG. 14C, the condition of FIG. 14D is reached, in which additional oxygen ions have been extracted and stored at the ER, and a sufficient portion of the HfO2 from which the oxygen was extracted becomes metallic, forming a conductive filament or path through the RSL as a short circuit between the electrodes.

Thus, there is a transition from an off state, in which the RSL is in a relatively high resistance state, similar to an open (non-conductive) circuit, to an on state, in which the RSL is in a relatively low resistance state, similar to a short (conductive) or closed circuit.

Figure 14A:
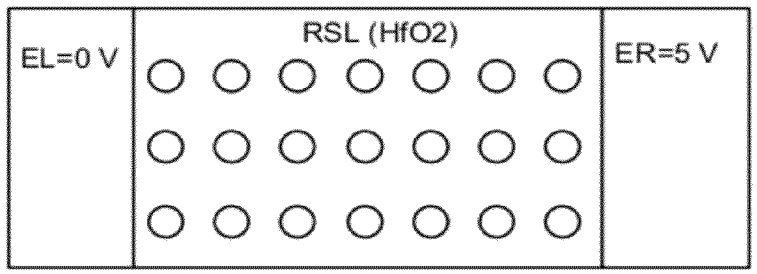
FIGS. 14A-14D depict different stages in the formation of a conductive filament in a set process of a RSL.
Figure 14B:
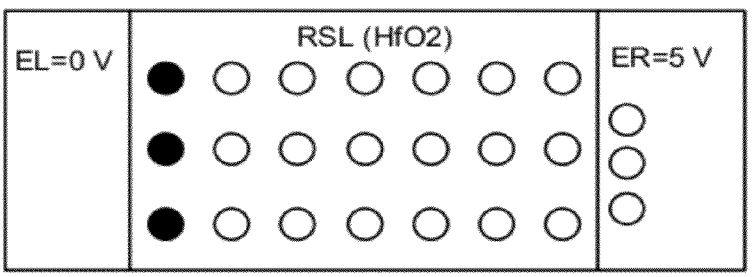
Figure 14C:
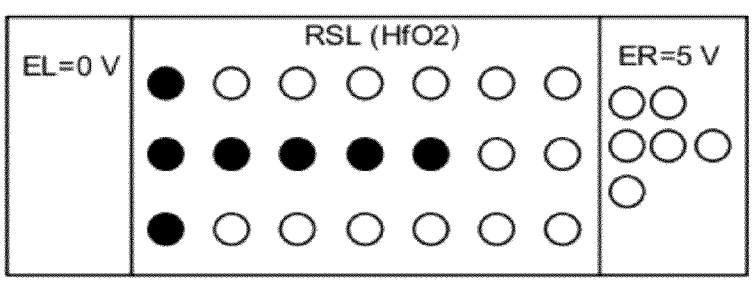
Figure 14D:
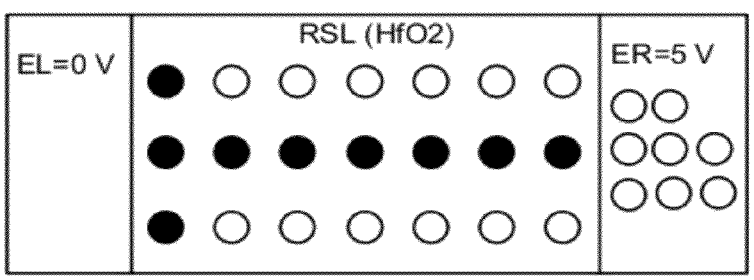
Figure 14E:
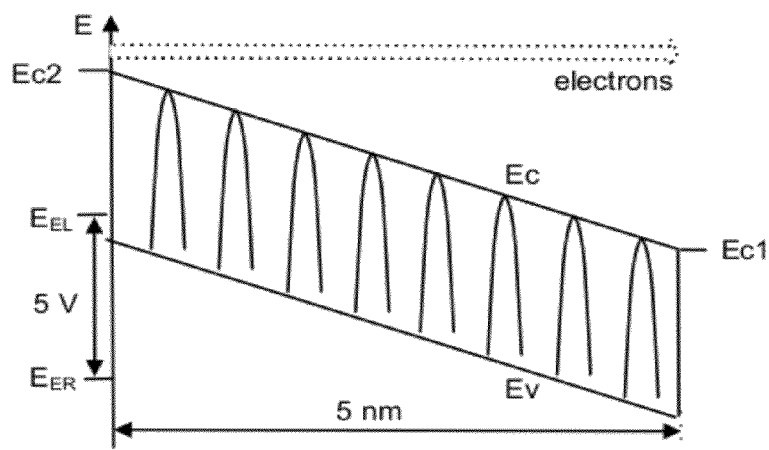
FIGS. 14E, 14F and 14G are energy diagrams which describe the set process stages of FIGS. 14A, 14B and 14D, respectively.
Figure 14F:
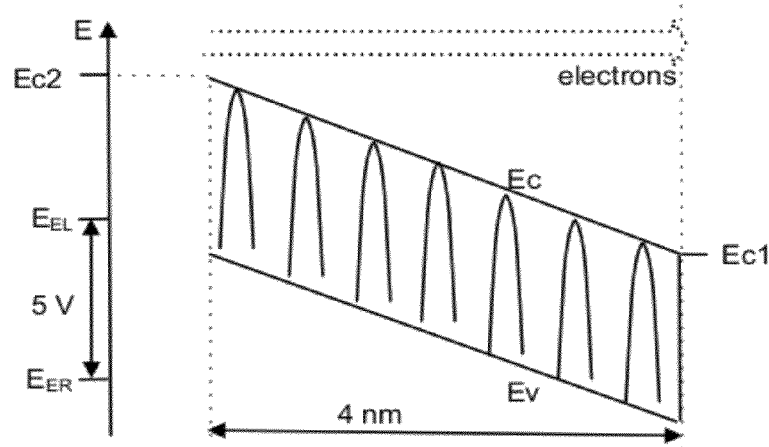
Figure 14G:
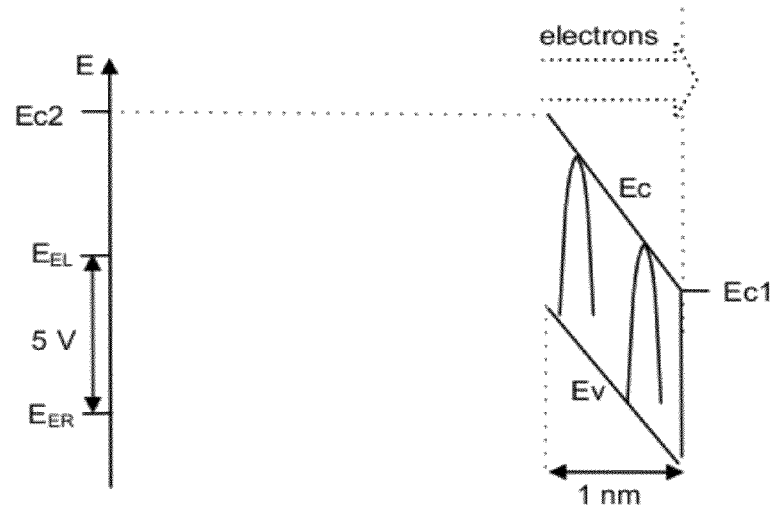

FIGS. 14E, 14F and 14G are energy diagrams which describe the set process stages of FIGS. 14A, 14B and 14D, respectively. The y-axis depicts energy and the x-axis depicts distance in the RSME. The peaks represent barriers to electron transport which are imposed by the oxygen in the HfO2. The peaks follow the conductance band Ec, which ranges from Ec1 to Ec2. The conductance band maintains this fixed range in FIGS. 14E-14G. EEL is the energy of EL, and EER is the energy of ER. Also, an idealized case of linear band bending is depicted.

At the start of the process, the electric field (E) is at a starting level of 10 MV/cm (5 V/5 nm), assuming 5 V is applied across EL and ER, and that they are separated by 5 nm. A relatively small amount of current flows, as represented by the thin dotted arrow (FIG. 14E). As the process continues, oxygen is extracted from the RSL and replaced by a metallic region which is part of a growing filament. The metallic region essentially becomes an extension of the Si electrode, so that the effective distance between EL and ER decreases, e.g., from 5 nm to 4 nm, and the E field increases correspondingly to 12 MV/cm (5 V/4 nm). Due to the higher field, a larger amount of current flows, as represented by the thicker dotted arrow (FIG. 14F). Subsequently, additional oxygen is extracted from the HfO2 so that the filament grows and the effective distance between EL and ER decreases, e.g., from 4 nm to 1 nm, and the E field increases to 50 MV/cm (5 V/1 nm) due to the exponential relationship between the field and the distance. Due to the even higher field, an even larger amount of current flows as a ballistic current, as represented by the even thicker dotted arrow (FIG. 14G).

Note that the height of the first and last energy peaks is about the same in FIGS. 14E-14G, but the presence of fewer peaks indicates a lower barrier to electron transport. The proposed RSME can thus advantageously avoid a ballistic current in a form and set process, by the current limiting effect of the IL layer.

Figure 15A:
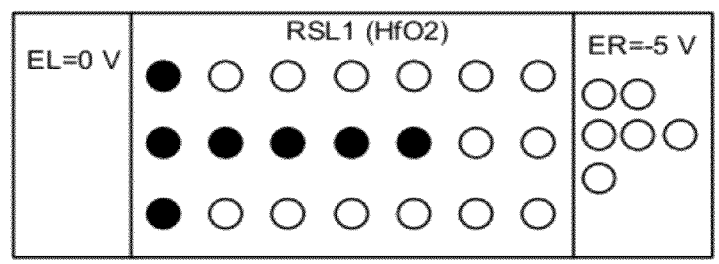
FIGS. 15A-15C depict different stages in the removal of a conductive filament in a reset process of a RSL.
Figure 15B:
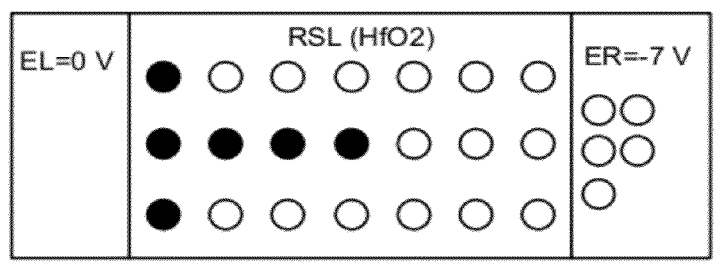
Figure 15C:
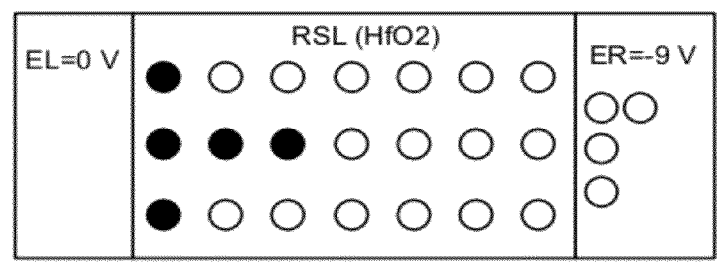

FIGS. 15A-15C depict different stages in the removal of a conductive filament in a reset process of a RSL.

Figure 15D:
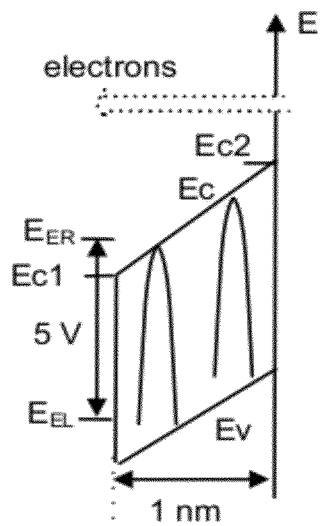
FIGS. 15D, 15E and 15F are energy diagrams which describe the reset process stages of FIGS. 15A, 15B and 15C, respectively.
Figure 15E:
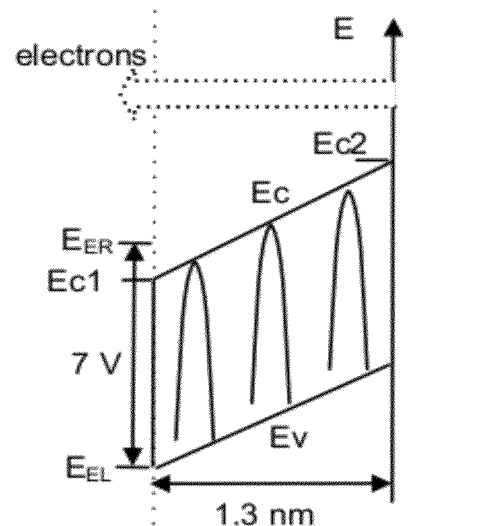
Figure 15F:
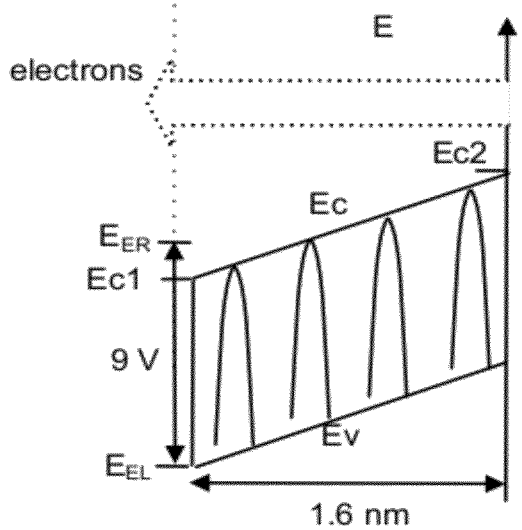

FIGS. 15D, 15E and 15F are energy diagrams which describe the reset process stages of FIGS. 15A, 15B and 15C, respectively. The left-hand region represents a grounded electrode (EL), the middle region represents a RSL such as HfO2, and the right-hand region represents a driven electrode (ER). The voltages and electrons depicted are an approximation for the case where there is no current limiting effect of the IL. These figures indicate the expected behavior of a RSL. Recall that a RSME consists of at least two RSLs in series, and in an RSME, the right hand electrode would receive a coupling voltage and is not directly driven and therefore the current flow is effectively reduced.

The reset process is substantially the reverse of the set process of FIGS. 14A-14D. At the start of the reset process (FIGS. 15A and 15D), the E field is 50 MV/cm, and a relatively small number of oxygen ions are returned to a portion of the HfO2 which is near the ER, breaking the short circuit formed by the filament. A voltage of −5 V, for instance, is applied across the ER and EL, using an opposite polarity compared to the set process. Thus, during reset, we might start at −5 V, for instance. An effective distance over which the E field is applied is 1 nm, for instance, resulting in an E field of 50 MV/cm. Subsequently, a voltage of −7 V is applied over a distance of 1.3 nm, resulting in an E field of 53 MV/cm (FIGS. 15B and 15E). Subsequently, a voltage of −9 V is applied over a distance of 1.6 nm, resulting in an E field of 56 MV/cm (FIGS. 15C and 15F). This process is completely different in a RSME which can thus advantageously avoid the ballistic current in a reset process.

With a bipolar MeOx switch, an ionic movement is provided in which ions are removed from the RSL, so that the RSL becomes more metallic. This is a self-amplification effect because, as soon as we have removed one ion, removal of other ions accelerates because the field increases, and the dependence of the movement on the field is exponential. So if we have removed one ion, then the field has increased and the mobility of the ions to move increases exponentially. So the device has a faster avalanche effect. This explains the set and forming dependencies.

In addition to the ion movement, at the same time, the electrons can move in the RSL by figuratively hopping over the energy peaks. Initially, only a small amount of electrons are flowing. But as soon as the electric field is increased, more electrons can flow over the energy peaks and it is much easier for them to flow. Finally, we have a lot of electrons flowing ballistically towards the IL. However, this electron flow is undesirable because the electrons do not contribute to the switching mechanism, which relies on the movement of individual ions. In order to move the ions, we need to build up a sufficient electric field. The associated electron flow is undesirable because if we have a steering element such as a diode in series with the RSL, the diode needs to be able to sustain the current from not only the small ion current but also from the larger electronic current.

Also, during the reset, the oxygen moves back to the resistance-switching element and, therefore, the effective distance between the IL and E1 or E2 increases again. An electric field is developed which allows a lot of the electrons to flow.

The RSME structure allows an electric field to build up which is sufficient to move ions a little bit, without flowing the electrons too much. The RSME essentially provides a bad conductor which does not conduct very many electrons. Also, the IL provides a barrier which stops and reflects electrons. Together with the capacitive coupling effect, we can therefore move the ions without having too much electronic current flowing.

The RSME can be generally symmetric, having an IL between RSL1 and RSL2, so we can focus the switching mechanism at the IL, in between the RSLs. The IL allows the electric field to build up in the center of the device so that the ions will move in the RSLs but will not cross over the IL in the middle region. The IL is a conductor, and is able to store oxygen ions. The IL can be metallic, although it is possible that it is not metallic. The IL could be very thin, and should be able to reflect and/or hold electrons so that they sit at the IL. The capacitance of the IL can be adjusted by varying its thickness. This can be especially important for scaled down devices.

A goal is to provide a RSME having an energy diagram such as depicted in FIG. 12, and which includes a potential step where the electrons are reflected but, nevertheless, there is an electric field built up. A symmetric construction can be used, where RSL1 and RSL2 have the same thickness, or it is also possible to have different thicknesses for RSL1 and RSL2. One RSL might be a little bit thicker than the other so that we can build up a voltage drop and not induce switching. This will result in shifting the band gap diagram as shown in FIG. 12 based on the thicknesses of RSL1 and RSL2. If the thicknesses of the RSLs are the same, then their voltages will behave the same, and they would switch with the same voltage. On the other hand, by introducing an asymmetry, we can modulate only on one RSL, in which case the other RSL becomes a baffle layer without switching.

Regarding the ballistic current, this occurs because the distance between the IL and E1 or E2 is so short that there is no chance to interact with the volume. In an electric conductor, an electron is accelerated in an electric field and travels in an average mean free path until it is scattered by an electron-to-electron, electron-to-phonon, electron-to-impurity or electron-to-interface mechanism. A typical scattering mean free path is around 40 nm for typical conductors such as silicon or copper. In a scaled memory device, the current is ballistic because our typical dimensions are much smaller, so that the electrons overshoot and get scattered deep inside the electrode, and do not deliver energy to the switching region.

Figure 16A:
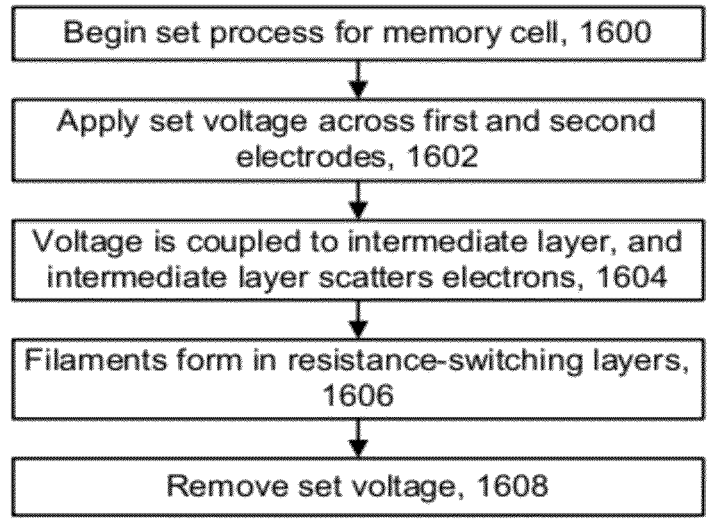
FIG. 16A depicts a set process for the RSME of FIG. 6A.

FIG. 16A depicts a set process for the RSME of FIG. 6A. At step 1600, the set process begins for a memory cell. In practice, a set or reset process can be performed concurrently for multiple memory cells in a memory device by applying appropriate voltages to the appropriate bit lines and word lines. At step 1602, a set voltage is applied across the first and second electrodes. The voltage is applied across the first and second electrodes of the resistance-switching memory cell via a steering element which is in series with the resistance-switching memory cell.

The set voltage can have a desired waveform such as a fixed amplitude pulse or pulses, ramp or staircase, for example. Thus, the voltage can be a time-varying voltage signal, e.g., increasing in magnitude with time. For a fixed amplitude pulse, the amplitude can be at or above a level such as Vset (FIG. 4A), for instance. For a ramp or staircase, the set voltage can start at a level below Vset and increase to Vset or higher. In one approach, the set voltage is applied blindly, for a specified time period, without determining whether the set state was actually achieved. In this case, the set voltage has a duration and/or magnitude which is sufficient to achieve the set state for close to 100% of all memory cells based on a prior statistical analysis of the memory device.

In another approach, the state of the memory cell is monitored while the set voltage is applied, and the set voltage is removed when the monitoring indicates that the set state has been reached. Removing a voltage can mean allowing the first and second electrodes to float. This approach is described further in, e.g., U.S. Pat. No. 7,920,407, issued Apr. 5, 2011, titled "Set And Reset Detection Circuits For Reversible Resistance Switching Memory Material," issued Apr. 5, 2011, and in U.S. Pat. No. 7,391,638, titled "Memory device for protecting memory cells during programming" issued Jun. 24, 2008, both of which are incorporated herein by reference.

At step 1604, the voltage is coupled to the intermediate layer (IL), and the IL scatters electrons which enter the IL from the RSLs. At step 1606, one or more filaments form in the RSLs. See also FIGS. 14A-14D. The formation of the filaments can proceed at different rates and complete at different times in the different RSLs. For example, referring to FIG. 4B, the set state will be reached first for the type "B" RSL when the set voltage reaches VsetB, and subsequently for the type "A" RSL when the set voltage reaches VsetA. The set voltage is sufficient to form a filament in each of the RSLs to provide a conductive path in the RSLs, thereby providing a conductive path throughout the RSME and the memory cell. As a result, a low resistance state is achieved in each of the RSLs and in the RSME. The low resistance state of the RSME can be assigned to a first binary data state, e.g., 0 or 1. At step 1608, the set voltage is removed and the memory cell, including the RSME, is discharged. Note that steps 1602-1606 occur concurrently, at least in part.

Optionally, it is possible that only one of the RSLs completes the set process, or fewer than all the RSLs in the RSME, complete the set process.

Figure 16B:
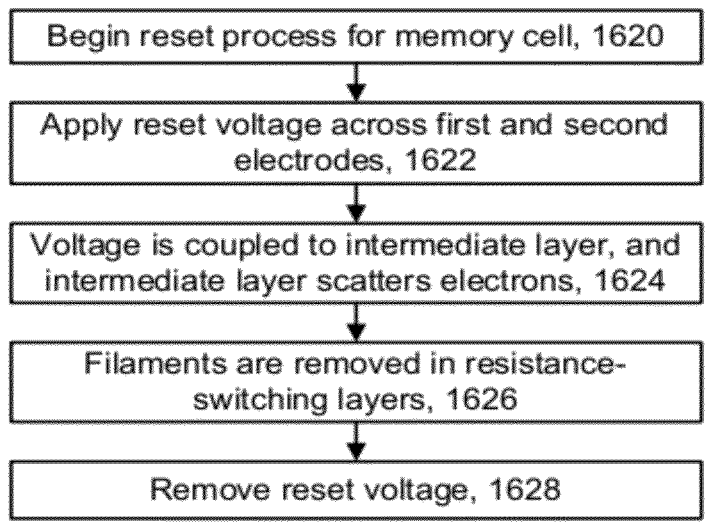
FIG. 16B depicts a reset process for the RSME of FIG. 6A.

FIG. 16B depicts a reset process for the RSME of FIG. 6A. At step 1620, the reset process begins for a memory cell. At step 1622, a reset voltage (Vreset, see FIG. 4A) is applied across the first and second electrodes. The voltage is applied across the first and second electrodes of the resistance-switching memory cell via a steering element which is in series with the resistance-switching memory cell. The set voltage can have a desired waveform such as a fixed amplitude pulse, or a ramp. Thus, the voltage can be a time-varying voltage signal, e.g., increasing in magnitude with time. As before, in one approach, the set voltage is applied blindly, without determining whether the set state was actually achieved. In this case, the reset voltage has a duration and/or magnitude which is sufficient to achieve the reset state for close to 100% of all memory cells.

In another approach, the state of the memory cell is monitored while the reset voltage is applied, and the reset voltage is removed when the monitoring indicates that the reset state has been reached. This approach is described further in US 2010/0085794 and U.S. Pat. No. 7,391,638, mentioned above.

At step 1624, the voltage is coupled to the intermediate layer, and the IL scatters electrons which enter the IL from the RSLs. At step 1626, one or more filaments are removed or destroyed in the RSLs. See also FIGS. 15A-15C. The removal of the filaments can proceed at different rates and complete at different times in the different RSLs. For example, referring to FIG. 4B, the reset state will be reached first for the type "B" RSL when the reset voltage reaches VresetB, and subsequently for the type "A" RSL when the reset voltage reaches VresetA. The reset voltage is sufficient to remove filaments in each of the RSLs to remove a conductive path in the RSLs, thereby removing a conductive path through the RSME and the memory cell. As a result, a high resistance state is achieved in each of the RSLs and in the RSME. The high resistance state of the RSME can be assigned to a second binary data state, e.g., 1 or 0, opposite the low resistance data state. At step 1628, the reset voltage is removed and the memory cell, including the RSME, is discharged. Note that steps 1622-1626 occur concurrently, at least in part.

Optionally, it is possible that only one of the RSLs completes the reset process, or fewer than all the RSLs in the RSME, complete the reset process.

The methods above can include applying a voltage across first and second electrodes of the resistance-switching memory cell to set a first data state in the memory cell, where the voltage is capacitively coupled to a conductive intermediate layer electrically between, and in series with, the first and second electrodes, and the voltage causes a resistance state to be switched in at least one of: (a) a first resistance-switching layer which is electrically between, and in series with, the first electrode and the conductive intermediate layer, and (b) a second resistance-switching layer which is electrically between, and in series with, the second electrode and the conductive intermediate layer, and removing the voltage to allow the resistance switching memory cell to discharge. The resistance-switching layers can be reversible or irreversible.

The methods above can also include changing a resistance state in a resistance-switching memory cell by the steps of: (a) increasing a magnitude of a time-varying voltage which is applied across the resistance-switching memory cell until a resistance state is switched in one of first and second resistance-switching layers of the resistance-switching memory cell, and (b) subsequently, further increasing the magnitude of the time-varying voltage which is applied across the resistance-switching memory cell until a resistance state is switched in another of the first and second resistance-switching layers of the resistance-switching memory cell. The switching of the resistance state can be reversible or irreversible.

The methods above can also include applying a voltage across first and second control lines, where the first control line is connected to one end of a resistance-switching memory cell, the second control line is connected to a steering element which is in series with the resistance-switching memory cell, and the voltage is applied across first and second resistance-switching layers of the resistance-switching memory cell, and across a conductive intermediate layer which is between the first and second resistance-switching layers, and removing the voltage to allow the resistance switching memory cell to discharge. The resistance-switching layers can be reversible or irreversible.

Figure 17A:
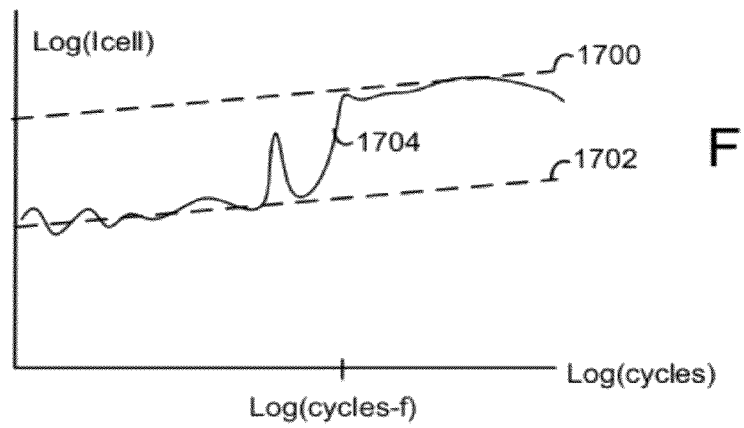
FIG. 17A depicts increasing switching currents of a memory cell as a function of set-reset cycles due to memory cell degradation.

FIG. 17A depicts increasing switching currents of a memory cell as a function of set-reset cycles due to memory cell degradation. A set-reset cycle comprises a set process and a subsequent reset process. Line 1700 depicts a representative set current and line 1702 depicts a representative reset current for a set of cells. Line 1704 depicts a set current of an example memory cell which enters a fail mode at some number of cycles referred to as log(cycles-f). After log(cycles-f), set leads to, and reset switching occurs at, the same, higher current represented by line 1700.

As mentioned, bipolar switching is generally understood to involve oxygen ions moving in and out of filaments to change the resistivity in a memory cell. Such switching can occur in a resistive RAM (ReRAM). The forming and set processes align the oxygen vacancies to connect the anode and the cathode, while the reset process moves oxygen vacancies away to break the filament. The ReRAM cell current is determined by filament size. With a larger filament, more energy is needed to perform the set and reset. The cell current with some structures can be difficult to control. Since most of the switching energy focuses on the filament, extremely high local temperatures can result. However, the high temperatures cannot quickly disperse. As a result, the ReRAM cell can degrade so that the set and reset currents drift to higher levels as more set-reset cycles are performed, as indicated by plots 1700 and 1702. The ratio of the on or set current of waveform 1700 to the off or reset current of the waveform 1702 may be about 3:1, for instance. Lines 1700 and 1702 track set/reset transient current values over cycles. When the reset transient current is represented by 1702, the read current in both on/off states should be lower and their ratio should be opposite to the ratio of values represented by lines 1702 and 1700.

Figure 17B:
FIG. 17B depicts relatively constant switching currents of a memory cell as a function of set-reset cycles due to reduced memory cell degradation.

FIG. 17B depicts relatively constant switching currents of a memory cell as a function of set-reset cycles due to reduced memory cell degradation. Line 1706 depicts a representative set current and line 1708 depicts a representative reset current for a set of cells. In this case, the respective currents are relatively constant as cycles are performed. This characteristic can be achieved by the RSME of FIG. 17D, for instance, discussed further below, which provides a memory cell having one resistance-switching layer which undergoes set and reset switching and another resistance-switching layer which acts as a protective resistor and does not undergo set and reset switching.

Figure 17C:
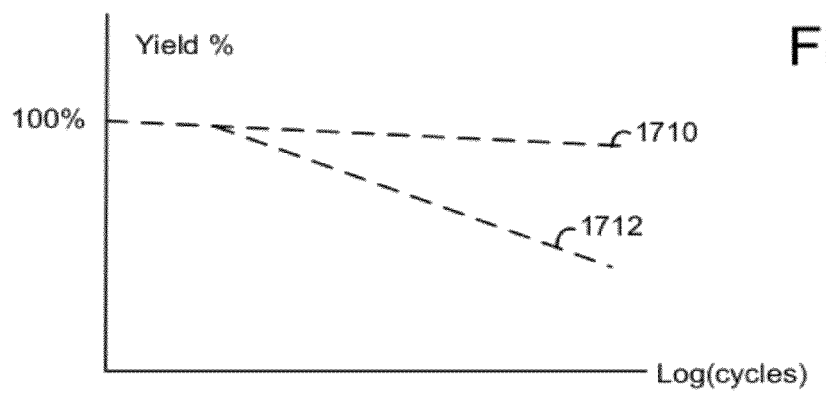
FIG. 17C depicts yield as a function of set-reset cycles for a memory cell with no protective resistor (plot/line 1710) and for a memory cell with a protective resistor (plot/line 1712).

FIG. 17C depicts yield as a function of set-reset cycles for a memory cell with no protective resistor (plot 1712) and for a memory cell with a protective resistor (plot 1710). The yield is a percentage of memory cells which have not entered the failure mode depicted by waveform 1704 in FIG. 17A. It is problematic to control the cell switching within an intended window. Online resistors can be used to prevent large transient currents during switching, but cannot be placed in the cell. Online Resistors are resistors serially connected with the memory cell, but out of the memory cell stack. They can be used to prevent large transient currents during switching. Online resistors can be word line or bit line resistors. For example, if a high current occurs locally in a cell (such as due to a local capacitor discharge—from outside the cell, such as from a bit line), an online (full line) resistor cannot help to protect the cell. A local capacitor can include a partial line capacitor as well as a parasitic cell capacitor. At the array level, an initialization switch can be used to move the cell switching window to the right level. Regarding an initialization switch, due to oxygen ions sometime show unstable in new formed filaments, initialization switch or "initial training" is the method driving the memory cell to stable switching. Regarding the cell switching window moving to the right level, even when the memory cell is in stable switching, it still can be degraded with more cycles (such as depicted by line 1704 in FIG. 17A). Especially, near-near bits are more easily degraded due to lacking online resistor protection. However, even with this approach, some cells lacking online resistor protection (such as near-near bits—bits near bit line and word line drivers) show worse endurance.

After a memory stack is cycled repeatedly in a low/medium current regime, a main failure mode occurs for some cells in which both set and reset switching involve the same, higher current. Once bits/cells enter the higher current switching state, they can subsequently be cycled only in the higher current regime and cannot be cycled in the low/medium current regime. Plot 1710 represents an advantageous endurance characteristic which can be achieved with the RSME of FIG. 17D, while plot 1712 represents a less desirable endurance characteristic which may occur in other cases. Plots 1710 and 1712 are representative for a set of cells. As described below, by placing a local resistor in an RSME, the RSME is protected from going into the failure mode of the high current state, so that endurance is improved.

Figure 17D:
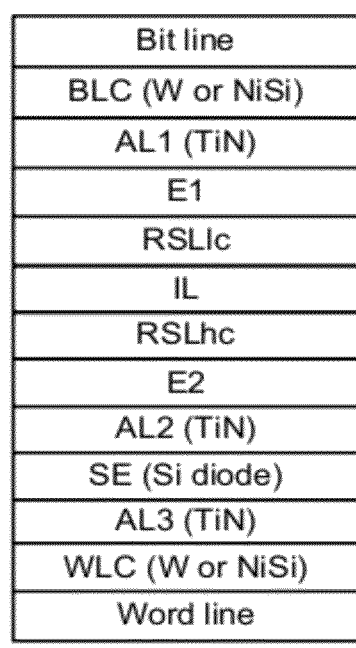
FIG. 17D depicts an embodiment of the RSME of FIG. 6C in which RSL1 is a low current material and RSL2 is a high current material.

FIG. 17D depicts an embodiment of the RSME of FIG. 6C in which RSL1 is a low current material/switch and RSL2 is a high current material/switch. The memory cell includes a bit line contact (BLC) material such as W or NiSi, which is connected to a bit line (e.g., a first control line) of a memory device. After the BLC in a serial path is a first adhesion layer/material (AL1) such as TiN. After AU is a first electrode E1. After E1 is a low current RSL/material referred to as "RSLlc" (where "lc" denotes "low current switching") or a low current resistance-switching material. After RSL1 is an intermediate layer/material IL. After IL is a high current RSL/material referred to as "RSLhc" (where "hc" denotes "high current switching") or a high current resistance-switching material. After RSL2 is a second electrode EL2. After E2 is an adhesive layer AL2 such as TiN. After AL2 is a steering element (SE) such as an Si diode. After the SE is another adhesive layer AL3 such as TiN. After AL3 is a word line contact WLC such as W or NiSi. After WLC is a word line (e.g., a second control line). E1, RSL1, IL, RSL2 and E2 as well as the other materials are arranged serially with one another, in any desired configuration. The low current RSL can be above or below the high current RSL, or in another relative configuration.

This configuration provides a re-writable memory cell such as a ReRAM in which RSLlc and RSLhc are separate modules which are head-to-back and share IL as a common electrode. Specifically, RSLlc is a low current module which has a bipolar switching property, where one direction (voltage polarity) is forming and set, and the reverse direction is reset. Before the memory can be operated in user mode, all cells need to be formed, i.e. both low current and high current modules need to be brought to the conductive state in each cell. After that, all user mode operations are in a relatively low current regime. Thus, cells may have to conduct high current (e.g., 22 µA or more) during in-factory forming operations, but should be restricted to low current (e.g., 15 µA or less) in user mode switching operations. For RSLlc, E1 is a top electrode, IL is a bottom electrode, a voltage drops from E1 to IL in a forming or set process, and a voltage drops from IL to E1 in a reset process. In one possible approach, the resistance of RSLlc is at least 1.5 times the resistance of RSLhc, and the high current is at least 1.5 times the low current.

RSLhc is a high current module which also has a bipolar switching property, where one direction is forming and set, and the reverse direction is reset. Switching can occur in relatively high current regime, such that the switching current in RSLhc is higher than in RSLlc. However, the cell can be operated such that no switching occurs in RSLhc if the range of the current is maintained in the regime of RSLlc. For RSLhc, IL is a top electrode, E2 is a bottom electrode, a voltage drops from IL to E2 in a forming or set process, and a voltage drops from E2 to IL in a reset process.

Figure 17E:
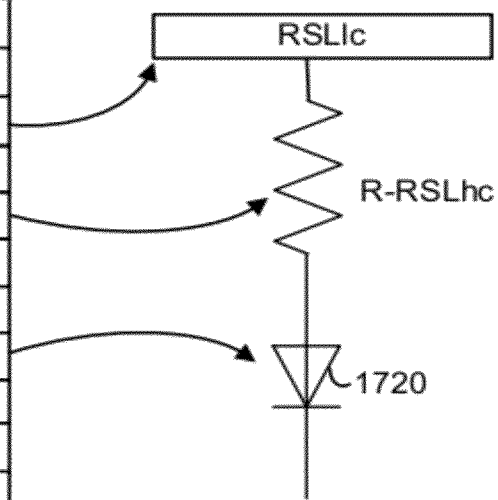
FIG. 17E depicts a circuit diagram corresponding to the RSME of FIG. 17D.
Figure 17F:
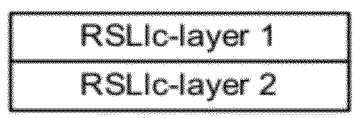
FIG. 17F depicts a dual layer for RSL1 of FIG. 17D.

FIG. 17E depicts a circuit diagram corresponding to the RSME of FIG. 17D. The circuit includes RSLlc, a non-linear resistor R-RSLhc which represents RSLhc, and the SE such as a diode 1720. The resistor R-RSLhc acts as a protective resistor for RSLlc when RSLlc switches, in a set or reset process, by preventing high local currents in RSLlc. R-RSLhc drops voltage that would otherwise be dropped on, and degrade, RSLlc. Example materials for E1 and E2 include: TiN, n+ Poly, n− Poly, p+ Poly, p− Poly, W and WN. Example materials for IL include TiN, W and WN. RSLlc can be a single layer of a material such as HfOx, ZrOx, Al2O3 or other metal oxide. Materials such as HfSiOx and HfSiON may potentially be suitable as well. Or, RSLlc can be formed of multiple layers, such as depicted in FIG. 17F, including a first layer or sub-layer, RSL1-layer 1 and a second layer or sub-layer, RSL1-layer 2. In one approach, the first layer is Hf-rich HfOx and the second layer is stoichiometric HfO2. This approach may be useful because it is believed that switching occurs at the interface area between the electrode and the switching layer. To improve the switching property, different materials may be used near the interface. In another approach, the first layer is HfO2 and the second layer is SiOx. This approach may be useful because native SiOx on top of an n+ electrode may serve the purpose of switching control as needed—which reduces the complexity and cost (as no extra deposition/growth is needed) of the overall process flow.

Figure 17G:
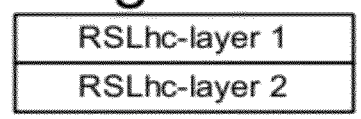
FIG. 17G depicts a dual layer for RSL2 of FIG. 17D.

Example materials for RSLhc include a single layer of a material such as HfOx, SiOx, SiN, p+ Poly, p– Poly, n+ Poly, n– Poly, or intrinsic poly. Or, RSLhc can be formed of multiple layers, such as depicted in FIG. 17G, including a first layer or sub-layer RSL2-layer 1 and a second layer or sub-layer RSL2-layer 2. In one approach, the first layer is HfO2 and the second layer is SiO2. In another approach, the first layer is SiO2 and the second layer is SiN. This approach may be useful because, since SiN is a very leaky material, it may not be adequate to prevent high current. SiO2 plus SiN can provide more resistance than SiN alone and thereby prevent high current. In one approach, RSLlc and RSLhc are respective layers in a stack having a uniform cross-section, such as a circular or rectangular (including square) cross-section. If both layers are made of the same material, they can have different respective thicknesses or widths which allow them to have the desired different switching currents. For example, the thickness of RSLlc can be greater than the thickness of RSLhc by at least a factor of 1.5. For instance, a thickness of the low current resistance-switching layer can be, e.g., 3-6 nm, and a thickness of the high current resistance-switching layer can be, e.g., 1.5-3 nm, where the thickness ratio is 2. A suitable thickness ratio can be based on factors such as film growth conditions. Thickness has a direct impact on voltage, so the factor can be based on a reasonable array operating voltage.

In another approach, the low current resistance-switching material comprises a stoichiometric metal oxide, and the high current resistance-switching material comprises a metal oxide which is metal rich (non-stoichiometric). Any degree of improvement of metal richness increases the abrupt formation of localized oxygen deficient layer which modulates the conductivity of the film and improves forming and cycling.

In another approach, the low current resistance-switching material and the high current resistance-switching material comprise an oxide of a same metal (e.g., HfOx, ZrOx or Al2O3), where the oxide of the metal of the high current resistance-switching material is more leaky than the oxide of the metal of the low current resistance-switching material by a factor of at least 1.5, 2 or by a factor of up to 5-20. Leakiness can be expressed in terms of current per area such as amps/cm2. Increased leakiness results in a lower resistance. We can adjust leakiness to fine-tune the resistance to the desired range.

In another approach, the low current resistance-switching material and the high current resistance-switching material comprise an oxide of a same metal, the oxide of the metal of the high current resistance-switching material is doped with another metal, e.g., at a concentration of at least 10%, and the oxide of the metal of the low current resistance-switching material is not doped with the another metal or is doped with the another metal at a concentration of no more than, e.g., 1%.

Oxygen vacancies play an important role in resistance switching. Generally, doping of trivalent metal such as Ti, Al, La or Ga (example dopants) into the tetravalent metal oxides such as HfO2 or ZrOx can control the formation of oxygen vacancy filaments along the doping sites to improve overall switching. The optimum doping percentage will depend on factors such as the film quality and growth conditions. If the doping concentration is too high, the resistance switching film can become very leaky and may not switch well. A doping concentration of about 10% or more can improve the forming process and switching behavior.

Thus, in one approach, the low current resistance-switching material and the high current resistance-switching material comprise an oxide of a same metal, the oxide of the metal of the high current resistance-switching material is doped with another metal and the oxide of the metal of the low current resistance-switching material is not doped with the another metal, the oxide of the metal is a tetravalent metal oxide and the another metal is a trivalent metal. The trivalent metal is one of Ti, Al, La and Ga, and the tetravalent metal oxide is one of HfO2 and ZrOx.

The reset switching current of the high current resistance-switching material can be higher than the largest set and/or reset switching current of the low current resistance-switching material by a factor of at least about 1.5, or at least 2.0. This provides a sufficient window between the switching currents of the two resistance-switching materials. The high current resistance-switching material has a relatively high switching current, and the low current resistance-switching material has a relatively low switching current. While 1.5 is believed to be a reasonable factor, the optimal factor for a given implementation can be determined by testing. The factor of 1.5 represents an example minimum ratio of reset currents between high current and low current switching modules. Since modules are connected in series, both should carry the same current. Switching is triggered in pulses of incrementing voltage (current). Thus the low current module should switch (reset) first, leaving the high current switching module in a conductive state, but at low voltage across so it could not switch.

Generally, the set switching current of the low current resistance-switching layer is a current which is sufficient to switch the low current resistance-switching layer from a respective off state to a lower resistance, respective on state. Similarly, the set switching current of the high current resistance-switching layer is a current which is sufficient to switch the high current resistance-switching layer from a respective off state to a lower resistance, respective on state. The reset switching current of the low current resistance-switching layer is a current which is sufficient to switch the low current resistance-switching layer from a respective on state to a higher resistance, respective off state. The reset switching current of the high current resistance-switching layer is a current which is sufficient to switch the high current resistance-switching layer from a respective on state to a higher resistance, respective off state.

Further, the reset switching current (I-RSLhc(reset)) of the high current resistance-switching layer can be higher than a set switching current (I-RSLhc(set)) of the high current resistance-switching layer, and the reset switching current (I-RSLlc(reset)) of the low current resistance-switching layer can be lower than the set switching current (I-RSLlc(set)) of the low current resistance-switching layer. In one approach, the reset switching current (I-RSLhc(reset)) of the high current resistance-switching layer can be higher than the set switching current (I-RSLlc(set)) of the low current resistance-switching layer. This means the lowest switching current of the high current resistance-switching layer is higher than the highest switching current of the low current resistance-switching layer.

The IL can be a conductor, semiconductor or semi-insulating material.

Figure 18A:
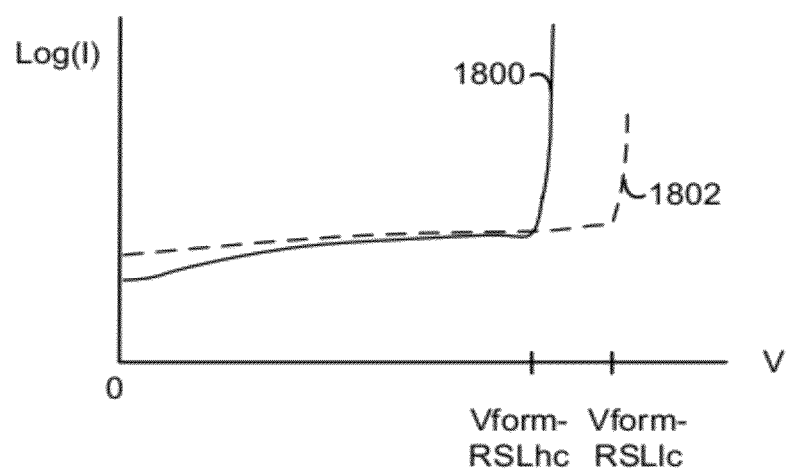
FIG. 18A depicts I-V forming curves for RSLlc and RSLhc of FIG. 17D.

FIG. 18A depicts I-V forming curves for RSLlc and RSLhc of FIG. 17D. V is the voltage across RSLlc or RSLhc, and I is the current in RSLlc or RSLhc. Initially, before forming, both RSLlc and RSLhc show high resistive behavior. With the forming operation (soft-breakdown), RSLlc and RSLhc become conductive, but their conduction level is different.

RSLhc is more conductive than RSLlc. In particular, plot 1800 represents the I-V characteristic of RSLhc, indicating that the current increases sharply at a respective forming voltage, Vform-RSLhc. Plot 1802 represents the I-V characteristic of RSLlc, indicating that the current increases sharply at a respective forming voltage, Vform-RSLlc>Vform-RSLhc.

Figure 18B:
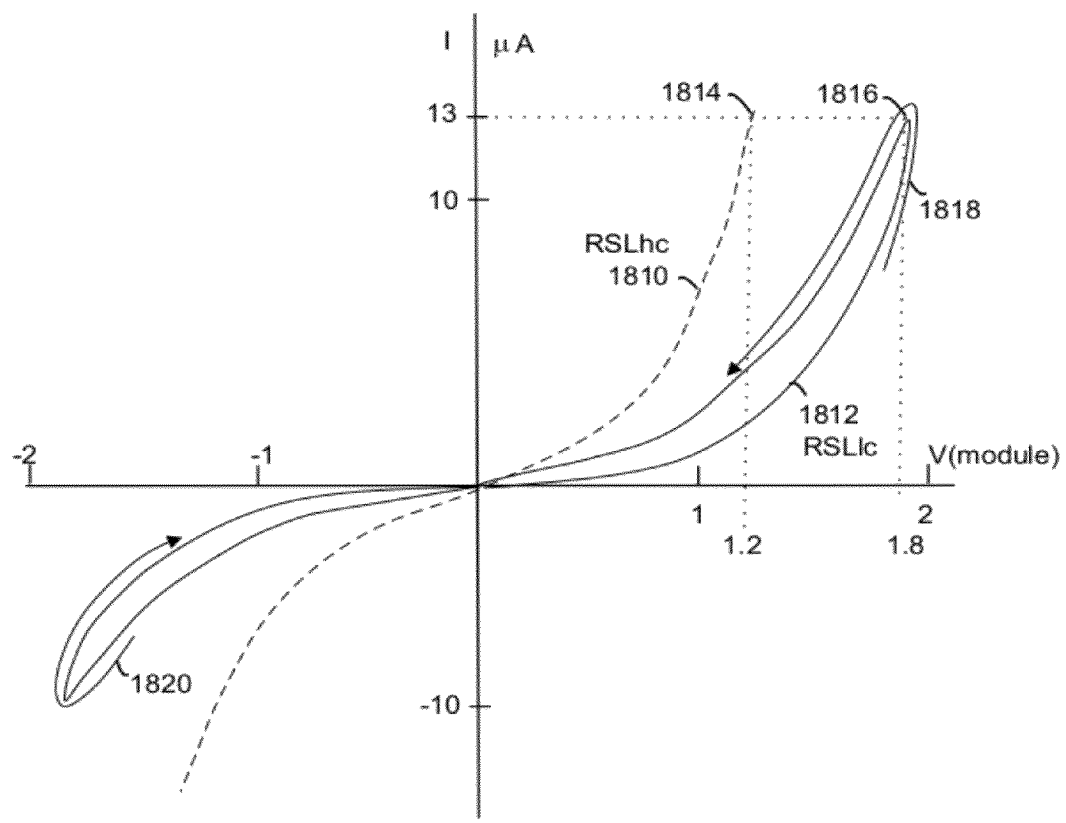
FIG. 18B depicts I-V curves for RSLlc and RSLhc of FIG. 17D after forming.

FIG. 18B depicts I-V curves for RSLlc and RSLhc of FIG. 17D after forming. The I-V curve is for each module alone. V(module) is the voltage across the RSLlc module or RSLhc module, and I is the current in the module. Generally, the current of the cell is the same current in each module due to the serial connection of the modules. RSLlc and RSLhc show different conduction behavior. Plot 1810 depicts the I-V characteristic of RSLhc, while plot 1812 depicts the I-V characteristic of RSLlc. At a given voltage, RSLhc has more current than RSLlc.

In one possible implementation, the voltage drop along the low-current filament (RSL1) in the low-resistance and/or high-resistance state is larger than the voltage drop along the high-current filament (RSL2) in the conductive state by at least a factor of 1.5 at any arbitrary current value. For example, example data point 1814 and 1816 correspond to a cell current of about 13 µA and a module voltage of about V-RSLhc=1.2 V and V-RSLlc=1.8 V (a factor of 1.5). Moreover, for the high-resistance filament, the set current may not exceed about 15 µA to and reset current may not exceed about 10 µA to in absolute values and opposite directions, in one approach. The total voltage drop for low-current and high-current resistance switching filaments connected in series at the switching current in either direction may be about 3V.

In a set process, Vcell is a positive voltage which is ramped up in magnitude over time. Portions of Vcell are dropped across RSLlc and RSLhc as V-RSLlc and V-RSLhc, respectively, where Vcell=V-RSLlc+V-RSLhc. Thus, the total voltage on the cell (Vcell) at any current is the sum of the voltage drop on the low current module (line 1812) plus the voltage drop on the high current module (line 1810). Vcell is ramped up until V-RSLlc (V(module)) reaches V-RSLlc(set), e.g., about 2 V, the voltage at which RSLlc sets, as represented by moving along line 1812 based on the direction of arrow 1818. In a reset process, Vcell is a negative voltage (dropped across RSLlc and RSLhc) which is ramped up in magnitude over time until V-RSLlc (V(module)) reaches V-RSLlc(reset), e.g., about −2 V, the voltage at which RSLlc resets, as represented by moving along line 1812 based on the direction of arrow 1820. Since RSLhc requires a substantially higher voltage and current than RSLlc to switch, RSLhc will not switch if Vcell is removed when the set or reset in RSLlc is detected. RSLlc thus becomes the switching material and RSLhc becomes the protective resistor which does not switch, when the memory device is appropriately controlled.

Figure 19A:
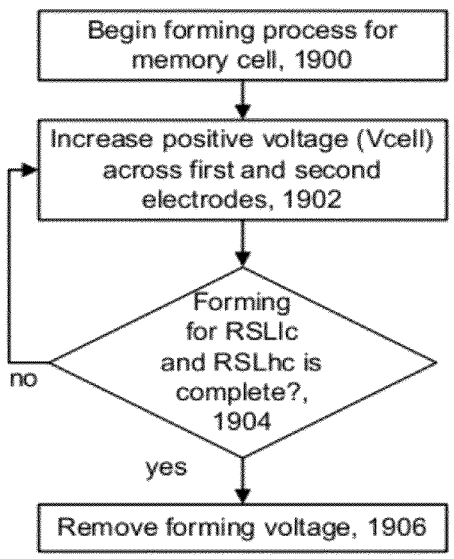
FIG. 19A depicts a forming process for the memory cell of FIG. 17D.

FIG. 19A depicts a forming process for the memory cell of FIG. 17D. Step 1900 begins the forming process for the memory cell. Step 1902 increases a positive voltage (Vcell) across the first and second electrodes (E1 and E2). As mentioned, the voltage is divided across RSLlc and RSLhc. See also FIG. 20A. Decision step 1904 determines if RSLlc and RSLhc are formed. Since the two modules are in series and carry equal currents, it is generally not feasible to determine when only one of them has become conductive. Forming is therefore observed when both modules, and the overall cell, conduct current. If the forming is not complete, the increase in Vcell continues at step 1902. If the forming is complete, step 1906 removes the forming voltage.

Figure 19B:
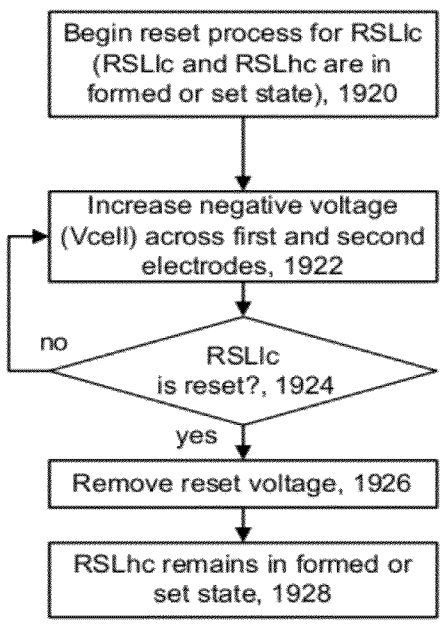
FIG. 19B depicts a reset process for RSLlc of the memory cell of FIG. 17D.

FIG. 19B depicts a reset process for RSLlc of the memory cell of FIG. 17D. Step 1920 begins the reset process. RSLlc and RSLhc are in a formed or set state. Step 1922 increases a negative voltage (Vcell) across the first and second electrodes (E1 and E2). The voltage is divided across RSLlc and RSLhc. See also FIG. 20B. Decision step 1924 determines if RSLlc is reset. If RSLlc is not reset, the increase in Vcell continues at step 1922. If RSLlc is reset, step 1926 removes the reset voltage. At step 1928, RSLhc remains in the formed or set state. In the low resistance set state, RSLhc can carry current to RSLlc. RSLhc will then remain in the set state in subsequent set and reset processes of the cell, which will involve RSLlc but not RSLhc. In one approach, RSLhc does not reset.

Figure 19C:
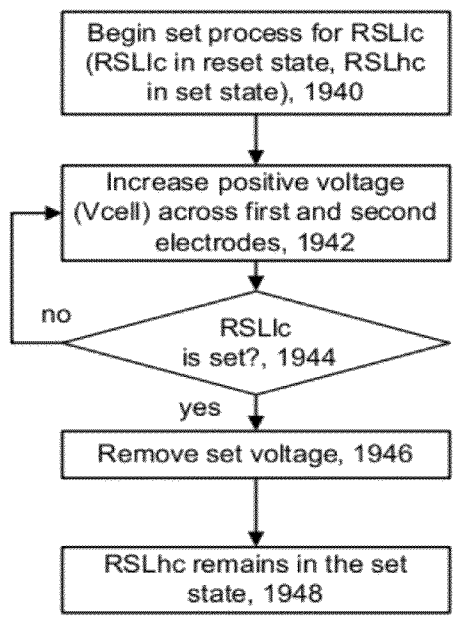
FIG. 19C depicts a set process for RSLlc of the memory cell of FIG. 17D.

FIG. 19C depicts a set process for RSLlc of the memory cell of FIG. 17D. Step 1940 begins the set process. RSLlc is in the reset state and RSLhc is in the set state. Step 1942 increases a positive voltage (Vcell=Vset) across the first and second electrodes (E1 and E2). The voltage is divided across RSLlc and RSLhc. See also FIG. 20A. Decision step 1944 determines if RSLlc is set. If RSLlc is not set, the increase in Vcell continues at step 1942. If RSLlc is set, step 1946 removes the set voltage. At step 1948, RSLhc remains in the set state.

Figure 20A:
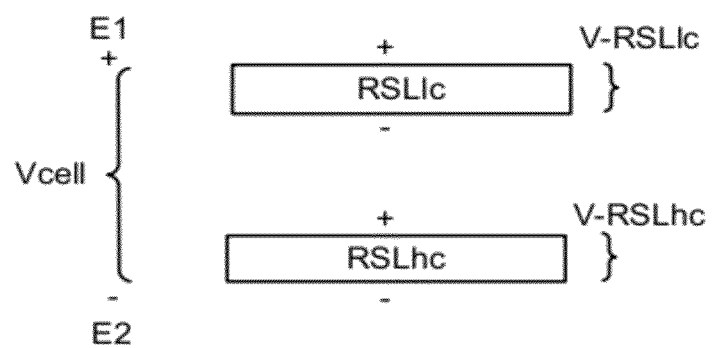
FIG. 20A depicts voltages across RSLlc and RSLhc during the forming process of FIG. 19A and during the set process of FIG. 19C.

FIG. 20A depicts voltages across RSLlc and RSLhc during the forming process of FIG. 19A and during the set process of FIG. 19C. Vcell is applied across E1 and E2, with the polarity shown (E1 is at the higher potential). Vcell is divided between RSLlc and RSLhc. For example, a voltage V-RSLlc across RSLlc with the polarity shown and a voltage V-RSLhc across RSLhc with the polarity shown, result. The forming or set polarity is the same for both switching materials. After forming is successfully completed for both switching materials, RSLlc stays in a low conductive state while RSLhc stays in a high conductive state and acts as a non-linear resistor.

Figure 20B:
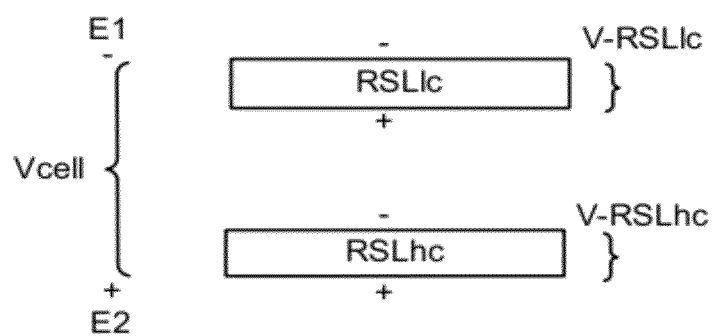
FIG. 20B depicts voltages across RSLlc and RSLhc during the reset process of FIG. 19B.

FIG. 20B depicts voltages across RSLlc and RSLhc during the reset process of FIG. 19B. Vreset is applied across E1 and E2, with the polarity shown (E1 is at the lower potential). Vreset is divided between RSLlc and RSLhc. A voltage V-RSLlc across RSLlc with the polarity shown and a voltage V-RSLhc across RSLhc with the polarity shown, result. The voltage across the high-resistance filament in RSLlc can be, at a minimum 1.5 times the voltage across the low-resistance filament in RSLhc, for instance. The maximum Vcell=Vreset may be, e.g., 3 V. Thus, we might have V-RSLlc=1.8 V and V-RSLhc=1.2 V, with Vreset=3 V, just before the reset transition.

The reset polarity is the same for both switching modules. RSLhc is more conductive than RSLlc, so the cell current is limited by RSLlc, and most of Vcell drops on RSLlc. Since the reset current of RSLhc is much higher than that of RSLlc, only RSLlc resets while RSLhc acts as a protection resistor.

Referring to FIG. 20A again, FIG. 20A also depicts voltages across RSLlc and RSLhc during the set process of FIG. 19C. Vset is applied across E1 and E2, with the polarity shown (E1 is at the higher potential). Vset is divided between RSLlc and RSLhc. A voltage V-RSLlc across RSLlc with the polarity shown and a voltage V-RSLhc across RSLhc with the polarity shown, result. The voltage drop on RSLlc and RSLhc is expected to change after the set transition. The above relationship of the reset process may hold after the set transition, where the voltage across the high-resistance filament in RSLlc can be, at a minimum 1.5 times the voltage across the low-resistance filament in RSLhc, for instance. The maximum Vcell=Vset may be, e.g., 3 V. Thus, we might have V-RSLlc=1.8 V and V-RSLhc=1.2 V, with Vset=3 V, just before the set transition.

The set polarity is the same for both switching modules. RSLhc is more conductive than RSLlc, so the cell current is limited by RSLlc, and most of Vcell drops on RSLlc. After the set process is completed, the conductivity of RSLhc is much higher than that of RSLlc. Since the set current of RSLhc is much higher than that of RSLlc, only RSLlc sets while RSLhc acts as a protection resistor.

Figure 21A:
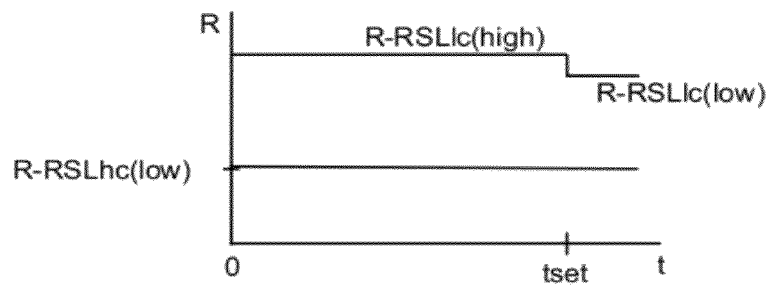
FIG. 21A depicts resistances for RSLlc and RSLhc during the reset process of FIG. 19C.

FIG. 21A depicts resistances for RSLlc and RSLhc during the set process of FIG. 19C. Time extends along the x-axes. R-RSLhc(low) is the resistance of RSLhc, which remains in the lower resistance, set state. R-RSLlc(high) is the resistance of RSLlc when it is in the reset state. R-RSLlc(low) is the resistance of RSLlc when it is in the lower resistance, set state. In one approach, R-RSLlc(high)>R-RSLlc(low)>R-RSLhc(low). When the set transition occurs at tset, RSLlc transitions from R-RSLlc(high) to R-RSLlc(low). RSLhc remains at R-RSLhc(low) throughout the set process. The on state resistance of the low current resistance-switching layer (RSLlc(low)) can be greater than an on state resistance of the high current resistance-switching layer (RSLhc(low)) by a factor of 1.5 or more, for instance.

Figure 21B:
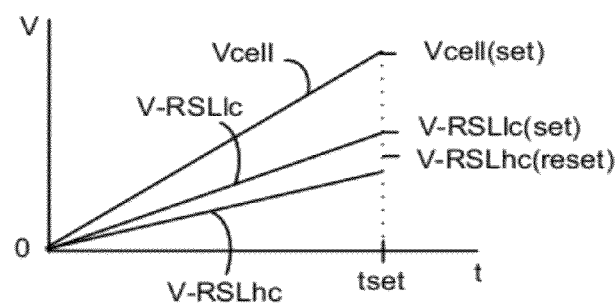
FIG. 21B depicts voltages for the memory cell, RSLlc and RSLhc during the reset process of FIG. 19C.

FIG. 21B depicts voltages for the memory cell, RSLlc and RSLhc during the set process of FIG. 19C. Vcell(set) represents a level of Vcell (e.g., +3 V) when the set transition occurs for RSLlc. Recall that Vcell=V-RSLlc+V-RSLhc. V-RSLlc(set) represents a level of V-RSLlc (e.g., +1.8 V) when the set transition occurs for RSLlc. V-RSLhc reaches a peak level such as +1.2 V when the set transition occurs for RSLlc. The peak value reached for V-RSLhc at tset is less than V-RSLhc(reset), so that reset does not occur for RSLhc. V-RSLhc(reset) can be less than or more than V-RSLlc(set). As Vcell is ramped up in magnitude over time, it is divided between the two resistance switching materials until the set transition occurs for RSLlc at tset, after which Vcell is lowered to 0 V and the set process is complete.

Figure 21C:
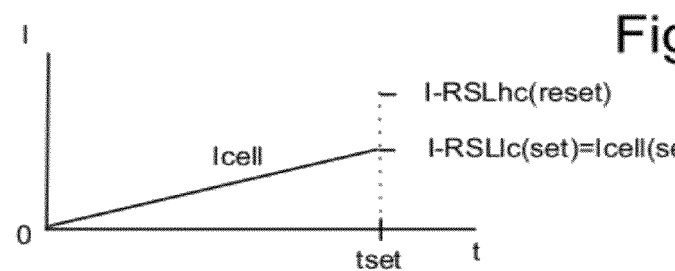
FIG. 21C depicts currents for the memory cell, RSLlc and RSLhc during the reset process of FIG. 19C.
Figure 22A:
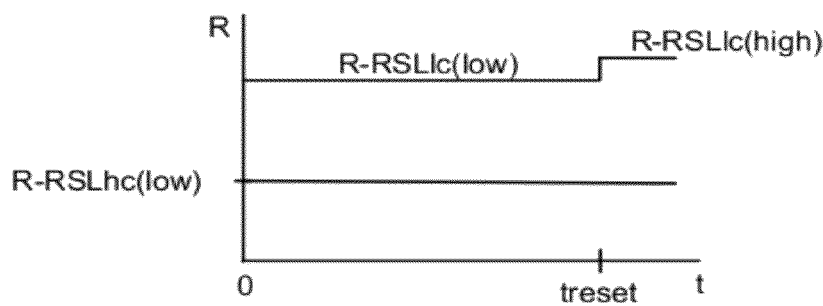
FIG. 22A depicts resistances for RSLlc and RSLhc during the reset process of FIG. 19B.

FIG. 21C depicts currents for the memory cell, RSLlc and RSLhc during the set process of FIG. 19C. Recall that Icell=I-RSLlc=I-RSLhc. Icell(set) represents a level of Icell when the set transition occurs for RSLlc. The peak value reached for I-cell at tset is less than I-RSLhc(reset), so that reset does not occur for RSLhc. I-RSLhc(reset) is more than I-RSLlc(set). RSLlc FIG. 22A depicts resistances for RSLlc and RSLhc during the reset process of FIG. 19B. When the reset transition occurs for RSLlc at treset, RSLlc transitions from R-RSLlc (low) to R-RSLlc(high). RSLhc remains at R-RSLhc(low) throughout the reset process.

Figure 22B:
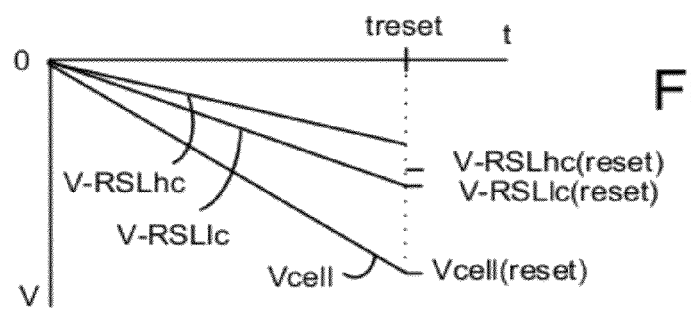
FIG. 22B voltages for the memory cell, RSLlc and RSLhc during the reset process of FIG. 19B.

FIG. 22B voltages for the memory cell, RSLlc and RSLhc during the reset process of FIG. 19B. The division of Vcell among RSLlc and RSLhc is depicted as being constant with time, for simplicity. Vcell(reset) represents a level of Vcell (e.g., −3 V) when the reset transition occurs for RSLlc. V-RSLlc(reset) represents a level of V-RSLlc (e.g., −1.8 V) at which reset transition occurs for layer RSLlc. V-RSLhc reaches a peak level such as −1.2 V when the reset transition occurs for RSLlc. At treset, |V-RSLhc|<|V-RSLhc(reset)| so that RSLhc is not reset. |V-RSLhc(reset)| can be less than or more than |V-RSLlc(reset)|. As Vcell is ramped up in magnitude over time, it is divided between the two resistance switching materials until the reset transition occurs for RSLlc at treset, after which Vcell is lowered to 0 V and the reset process is complete.

Figure 22C:
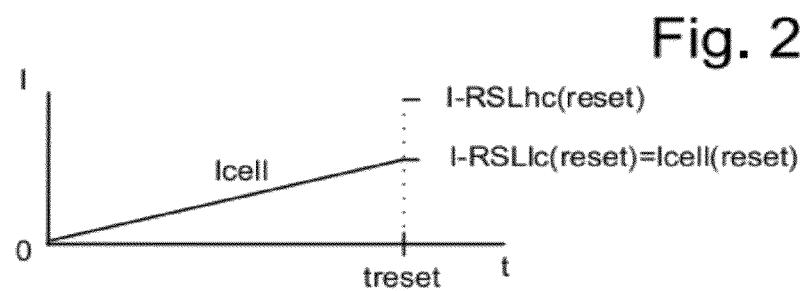
FIG. 22C depicts currents for the memory cell, RSLlc and RSLhc during the reset process of FIG. 19B.

FIG. 22C depicts currents for the memory cell, RSLlc and RSLhc during the reset process of FIG. 19B. At the time of the cell reset transition, treset, the cell current is: Icell(reset)=I-RSLlc(reset) so that only layer RSLlc would reset. I-RSLhc reaches a peak level which is less than I-RSLhc(reset) when the reset transition occurs so that RSLhc is not reset. As Icell increases over time, it is carried through the two resistance switching materials until the reset transition occurs for RSLlc at treset.

The resistance switching memory cell provided includes a protection resistor which is introduced in the cell. The memory cell is operated in a low current regime, so that switching is stable over many switching cycles, and only RSLlc switches while RSLhc acts as a built in resistor. Endurance can be significantly improved, with no endurance yield difference based on cell location in the memory device.

Accordingly, it can be seen that, in one embodiment, a resistance-switching memory cell comprises: (a) first and second electrodes; (b) an intermediate material electrically between, and in series with, the first and second electrodes; (c) a low current resistance-switching material electrically between, and in series with, the first electrode and the intermediate material; and (d) a high current resistance-switching material electrically between, and in series with, the second electrode and the intermediate material, the low current resistance-switching material and high current resistance-switching material have respective bipolar switching characteristics, a reset switching current of the high current resistance-switching material is higher than a set and/or reset switching current of the low current resistance-switching material by a factor of at least 1.5.

In another embodiment, a memory device, comprises: (a) a memory array comprising a plurality of resistance-switching memory cells, each resistance-switching memory cell comprising a resistance-switching memory element, each resistance-switching memory element comprising first and second electrodes, an intermediate material electrically between the first and second electrodes, a low current resistance-switching material electrically between, and in series with, the first electrode and the intermediate material, and a high current resistance-switching material electrically between, and in series with, the second electrode and the intermediate material, the low current resistance-switching materials and high current resistance-switching materials have respective bipolar switching characteristics; (b) a plurality of word lines and bit lines, he first electrode of each resistance-switching memory cell is in communication with a respective bit line of the plurality of bit lines, and the second electrode of each resistance-switching memory cell is in communication with a respective word line of the plurality of word lines; and (c) control circuitry in communication with the plurality of word lines and bit lines, the control circuitry applies voltages to the at least one word line of the plurality of word lines and to at least one bit line of the plurality of bit lines to repeatedly switch the low current resistance-switching material of at least one of the resistance-switching memory cells between respective on and off states without switching the high current resistance-switching material of the at least one of the resistance-switching memory cells between respective on and off states, the voltages generate a reset switching current of the high current resistance-switching materials and a set switching current of the low current resistance-switching materials, the reset switching current of the high current resistance-switching materials is greater than the set and/or reset switching current of the low current resistance-switching materials by a factor of at least 1.5.

In another embodiment, a method for operating a memory device comprises applying voltages to at least one resistance-switching memory cell via a respective bit line and a respective word line, to repeatedly switch a low current resistance-switching material of the at least one resistance-switching memory cell between respective on and off states without switching a high current resistance-switching material of the at least one resistance-switching memory cell between respective on and off states, the low current resistance-switching material and high current resistance-switching material have respective bipolar switching characteristics, the voltages generate a reset switching current of the high current resistance-switching material and a set switching current of the low current resistance-switching material, the reset switching current of the high current resistance-switching materials is greater than the set and/or reset switching current of the low current resistance-switching materials by a factor of at least 1.5. The applying voltages includes applying a voltage of a first polarity to the at least one resistance-switching memory cell via the respective bit line and the respective word line, to switch the low current resistance-switching material from the respective off state to the respective on state, without switching the high current resistance-switching material between the respective on and off states, and applying a voltage of a second polarity, opposite to the first polarity, to the at least one resistance-switching memory cell via the respective bit line and the respective word line, to switch the low current resistance-switching material from the on state to the off state, without switching the high current resistance-switching material between the respective on and off states.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A resistance-switching memory cell, comprising:
   first and second electrodes;
   an intermediate material electrically between, and in series with, the first and second electrodes;
   a low current resistance-switching material electrically between, and in series with, the first electrode and the intermediate material, the low current resistance-switching material comprising an oxide of a metal; and
   a high current resistance-switching material electrically between, and in series with, the second electrode and the intermediate material, the low current resistance-switching material and high current resistance-switching material have respective bipolar switching characteristics, a reset switching current of the high current resistance-switching material is higher than a set and/or reset switching current of the low current resistance-switching material by a factor of at least 1.5 to 2.

2. The resistance-switching memory cell of claim 1, wherein:
   the low current resistance-switching material and the high current resistance-switching material are of a same material; and
   a thickness of the low current resistance-switching material is greater than a thickness of the high current resistance-switching material by a factor of at least 1.5.

3. The resistance-switching memory cell of claim 1, wherein:
   the oxide of the metal of the low current resistance-switching material comprises a stoichiometric metal oxide; and
   the high current resistance-switching material comprises a metal oxide which is metal rich.

4. The resistance-switching memory cell of claim 1, wherein:
   the high current resistance-switching material comprise an oxide of the metal, the oxide of the metal of the high current resistance-switching material is more leaky than the oxide of the metal of the low current resistance-switching material by a factor of at least 1.5.

5. The resistance-switching memory cell of claim 1, wherein:
   the high current resistance-switching material comprise an oxide of the metal, the oxide of the metal of the high current resistance-switching material is doped with another metal at a concentration of at least 10%, and the oxide of the metal of the low current resistance-switching material is not doped with the another metal or is doped with the another metal at a concentration of no more than 1%.

6. The resistance-switching memory cell of claim 1, wherein:
   the high current resistance-switching material comprise an oxide of the metal, the oxide of the metal of the high current resistance-switching material is doped with another metal and the oxide of the metal of the low current resistance-switching material is not doped with the another metal, the oxide of the metal is a tetravalent metal oxide and the another metal is a trivalent metal.

7. The resistance-switching memory cell of claim 6, wherein:
   the trivalent metal is one of Ti, Al, La or Ga, and the tetravalent metal oxide is HfO2 or ZrOx.

8. The resistance-switching memory cell of claim 1, wherein:
   the intermediate material comprises at least one of: TiN, W or WN.

9. The resistance-switching memory cell of claim 1, wherein:
   the oxide of the metal of the low current resistance-switching material comprises a single material comprising HfOx, ZrOx or Al2O3.

10. The resistance-switching memory cell of claim 1, wherein:
    the oxide of the metal of the low current resistance-switching material comprises a material of Hf-rich HfOx and a material of HfO2.

11. The resistance-switching memory cell of claim 1, wherein:
    the oxide of the metal of the low current resistance-switching material comprises a layer of HfO2 and the low current resistance-switching material further comprises a layer of SiOx.

12. The resistance-switching memory cell of claim 1, wherein:
    the high current resistance-switching material comprises a single material comprising SiN, p+ polysilicon, p− polysilicon, n+ polysilicon, n− polysilicon or intrinsic polysilicon.

13. The resistance-switching memory cell of claim 1, wherein:
    the high current resistance-switching material comprises a layer of HfO2 and a layer of SiO2.

14. The resistance-switching memory cell of claim 1, wherein:
    the high current resistance-switching material comprises a layer of SiO2 and a layer of SiN.

15. A memory device, comprising:
    a memory array comprising a plurality of resistance-switching memory cells, each resistance-switching memory cell comprising a resistance-switching memory element, each resistance-switching memory element comprising first and second electrodes, an intermediate material electrically between the first and second electrodes, a low current resistance-switching material electrically between, and in series with, the first electrode and the intermediate material, and a high current resistance-switching material electrically between, and in series with, the second electrode and the intermediate material, the low current resistance-switching materials and high current resistance-switching materials have respective bipolar switching characteristics;

a plurality of word lines and bit lines, he first electrode of each resistance-switching memory cell is in communication with a respective bit line of the plurality of bit lines, and the second electrode of each resistance-switching memory cell is in communication with a respective word line of the plurality of word lines; and control circuitry in communication with the plurality of word lines and bit lines, the control circuitry applies voltages to at least one word line of the plurality of word lines and to at least one bit line of the plurality of bit lines to repeatedly switch the low current resistance-switching material of at least one of the resistance-switching memory cells between respective on and off states without switching the high current resistance-switching material of the at least one of the resistance-switching memory cells between respective on and off states, the voltages generate a reset switching current of the high current resistance-switching materials and a set switching current of the low current resistance-switching materials, the reset switching current of the high current resistance-switching materials is greater than the set and/or reset switching current of the low current resistance-switching materials by a factor of at least 1.5, wherein the voltages include a voltage of a first polarity which is applied to the resistance-switching memory cells via the respective bit lines and the respective word lines, to switch the low current resistance-switching material of the resistance-switching memory cells from the respective off state to the respective on state, without switching the high current resistance-switching material of the at least one of the resistance-switching memory cells between the respective on and off states; and the voltages include a voltage of a second polarity, opposite to the first polarity, which is applied to the resistance-switching memory cells via the respective bit lines and the respective word lines, to switch the low current resistance-switching material of the resistance-switching memory cells from the on state to the off state, without switching the high current resistance-switching material of the resistance-switching memory cells between the respective on and off states.

16. The memory device of claim 15, wherein:
the reset switching current of the high current resistance-switching materials is higher than the set switching current of the low current resistance-switching materials by a factor of at least 2.

17. A method for operating a memory device, comprising:
applying voltages to at least one resistance-switching memory cell via a respective bit line and a respective word line, to repeatedly switch a low current resistance-switching material of the at least one resistance-switching memory cell between respective on and off states without switching a high current resistance-switching material of the at least one resistance-switching memory cell between respective on and off states, the low current resistance-switching material and high current resistance-switching material have respective bipolar switching characteristics, the voltages generate a reset switching current of the high current resistance-switching material and a set switching current of the low current resistance-switching material, the reset switching current of the high current resistance-switching materials is greater than the set and/or reset switching current of the low current resistance-switching materials by a factor of at least 1.5;

the applying voltages includes applying a voltage of a first polarity to the at least one resistance-switching memory cell via the respective bit line and the respective word line, to switch the low current resistance-switching material from the respective off state to the respective on state, without switching the high current resistance-switching material between the respective on and off states, and applying a voltage of a second polarity, opposite to the first polarity, to the at least one resistance-switching memory cell via the respective bit line and the respective word line, to switch the low current resistance-switching material from the on state to the off state, without switching the high current resistance-switching material between the respective on and off states.

18. The method of claim 17, wherein:
the reset switching current of the high current resistance-switching materials is higher than the set and/or reset switching current of the low current resistance-switching materials by a factor of at least 2.

19. A resistance-switching memory cell, comprising:
first and second electrodes;
an intermediate material electrically between, and in series with, the first and second electrodes;
a low current resistance-switching material electrically between, and in series with, the first electrode and the intermediate material; and
a high current resistance-switching material electrically between, and in series with, the second electrode and the intermediate material, the high current resistance-switching material comprises a layer of $SiO_2$ and a layer of SiN, the low current resistance-switching material and high current resistance-switching material have respective bipolar switching characteristics, a reset switching current of the high current resistance-switching material is higher than a set and/or reset switching current of the low current resistance-switching material by a factor of at least 1.5.

* * * * *